(12) United States Patent
Yamamoto et al.

(10) Patent No.: US 7,144,766 B2
(45) Date of Patent: Dec. 5, 2006

(54) METHOD OF MANUFACTURING SEMICONDUCTOR INTEGRATED CIRCUIT DEVICE HAVING POLYMETAL GATE ELECTRODE

(75) Inventors: Naoki Yamamoto, Kawaguchi (JP); Hiroyuki Uchiyama, Tachikawa (JP); Norio Suzuki, Mito (JP); Eisuke Nishitani, Yatsuo (JP); Shin'ichiro Kimura, Kunitachi (JP); Kazuyuki Hozawa, Hachioji (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/198,858

(22) Filed: Aug. 8, 2005

(65) Prior Publication Data

US 2006/0009046 A1    Jan. 12, 2006

Related U.S. Application Data

(63) Continuation of application No. 10/468,441, filed as application No. PCT/JP01/09547 on Oct. 31, 2001, now Pat. No. 7,049,187.

(30) Foreign Application Priority Data

Mar. 12, 2001  (JP) .................. 2001-069514

(51) Int. Cl.
*H01L 22/336*  (2006.01)
*H01L 22/8234*  (2006.01)

(52) U.S. Cl. ...................... 438/197; 438/241; 438/287; 438/685; 438/773

(58) Field of Classification Search ............... 438/197, 438/241, 287, 685, 773
See application file for complete search history.

(56) References Cited

U.S. PATENT DOCUMENTS

| | | | |
|---|---|---|---|
| 4,282,270 A | 8/1981 | Nozaki et al. | 427/93 |
| 4,505,028 A | 3/1985 | Kobayashi et al. | 29/578 |
| 4,914,059 A | 4/1990 | Nissim et al. | 438/590 |
| 5,088,314 A | 2/1992 | Takashi | 73/23.21 |
| 5,202,096 A | 4/1993 | Jain | 422/190 |
| 5,387,540 A | 2/1995 | Poon et al. | 437/67 |
| 5,693,578 A | 12/1997 | Nakanishi et al. | 437/238 |
| 5,719,410 A | 2/1998 | Suehiro et al. | 257/77 |
| 6,066,508 A | 5/2000 | Tanabe et al. | 438/38 |
| 6,162,741 A | 12/2000 | Akasaka et al. | 438/773 |
| 6,664,196 B1 | 12/2003 | Wada et al. | 438/754 |
| 2001/0042344 A1 | 11/2001 | Ohmi et al. | 48/204 |

FOREIGN PATENT DOCUMENTS

| | | |
|---|---|---|
| EP | WO97/28085 | 8/1997 |
| EP | WO98/39802 | 9/1998 |
| EP | 964437 | 12/1999 |

(Continued)

OTHER PUBLICATIONS

Yasuo Tarui, "Handoutai Process Handbook," *Press Journal*, Receiving date at Japan Patent Office: Mar. 30, 1999, pp. 153-157.

(Continued)

*Primary Examiner*—Fernando L. Toledo
(74) *Attorney, Agent, or Firm*—Miles & Stockbridge P.C.

(57) ABSTRACT

When an oxidation treatment for regenerating a gate insulating film 6 is performed after forming gate electrodes 7A of a polymetal structure in which a $WN_x$ film and a W film are stacked on a polysilicon film, a wafer 1 is heated and cooled under conditions for reducing a W oxide 27 on the sidewall of each gate electrode 7A. As a result, the amount of the W oxide 27 to be deposited on the surface of the wafer 1 is reduced.

5 Claims, 71 Drawing Sheets

FOREIGN PATENT DOCUMENTS

| | | |
|---|---|---|
| JP | 56-107552 | 8/1981 |
| JP | 59-10271 | 1/1984 |
| JP | 60-72229 | 4/1985 |
| JP | 60-89943 | 5/1985 |
| JP | 60-107840 | 6/1985 |
| JP | 60-123060 | 7/1985 |
| JP | 61-127123 | 6/1986 |
| JP | 61-127124 | 6/1986 |
| JP | 61-150236 | 7/1986 |
| JP | 61-152076 | 7/1986 |
| JP | 61-267365 | 11/1986 |
| JP | 1-94657 | 4/1989 |
| JP | 3-119763 | 5/1991 |
| JP | 3-147328 | 6/1991 |
| JP | 5-141871 | 6/1993 |
| JP | 5-144804 | 6/1993 |
| JP | 5-152282 | 6/1993 |
| JP | 6-115903 | 4/1994 |
| JP | 6-120206 | 4/1994 |
| JP | 6-163871 | 6/1994 |
| JP | 6-333918 | 12/1994 |
| JP | 7-94716 | 4/1995 |
| JP | 7-94731 | 4/1995 |
| JP | 7-321102 | 12/1995 |
| JP | 8-83772 | 3/1996 |
| JP | 8-264531 | 10/1996 |
| JP | 9-756651 | 3/1997 |
| JP | 9-172011 | 6/1997 |
| JP | 10-223900 | 8/1998 |
| JP | 10-335652 | 12/1998 |
| JP | 10-340909 | 12/1998 |
| JP | 11-26395 | 1/1999 |
| JP | 11-31666 | 2/1999 |
| JP | 11-204456 | 7/1999 |
| JP | 11-330468 | 11/1999 |
| JP | 2000-118491 | 4/2000 |
| JP | 2000-331978 | 11/2000 |
| JP | 2000-349285 | 12/2000 |

OTHER PUBLICATIONS

Kazuo Maeda, Saishin LSI Process Gijutsu, Kogyo Chosakai, Apr. 20, 1988, pp. 111-113.

Maeda, K., *Latest LSI Processing Technology*, Kogyo Chosakai Publishing Co., 1983, pp. 111-113 (with English translation).

Yamada, M.., *Handbook of Semiconductor Processing*, Ch. 1, Section 17, pp. 153-157, Oct. 15, 1996 (with English translation).

Yasushi Akasaka et al., "Low-Resistivity Poly-Metal Gate Electrode Durable for High-Temperature Processing," *IEEE Transactions on Electron Devices*, vol. 43, No. 11, Nov. 1996, pp. 1864-1869.

K. Nakajima et al., "Formation Mechanism of Ultrathin WSiN Barrier Layer in a W/WN$_x$/Si System," *Applied Surface Science 117/118* (1997), pp. 312-316.

K. Nakajima et al., "Poly-metal Gate Process-Ultrathin WSiN Barrier Layer Impermeable to Oxidant In-diffusion During Si Selective Oxidation," Advanced Metallization Conference Japan Session, Tokyo University, 1995.

K. Nakamura et al., "Hydrogen-Radical-Balanced Steam Oxidation Technology for Ultra-Thin Oxide with High Reliability," *Proceedings of the 45th Symposium on Semiconductors and Integrated Circuits Technology*, Tokyo, Japan, Dec. 1993, pp. 128-133.

E. Kneer et al., "Electrochemistry of Chemical Vapor Deposited Tungsten Films with Relevance to Chemical Mechanical Polishing," *J. Electrochem. Soc.*, vol. 143, No. 12, pp. 4095-4100.

(a) W + 3H₂O ⇌ WO₃ + 3H₂  
(b) Mo + 2H₂O ⇌ MoO₂ + 2H₂  
(c) 2Ta + 5H₂O ⇌ Ta₂O₅ + 5H₂  
(d) Si + 2H₂O ⇌ SiO₂ + 2H₂  
(e) Ti + 2H₂O ⇌ TiO₂ + 2H₂

FIG. 18

| EVENT | LOADING OF WAFER | PURGING WITH N₂ | PURGING WITH H₂ | O₂ INTRO-DUCTION | ANNEALING | AFTER-PURGE | UNLOADING OF WAFER | REMARKS |
|---|---|---|---|---|---|---|---|---|
| TIME | 10' | 1' | t₂ | 15" | ANY TIME (SEVERAL MINUTES) | 2'20" | 10' | 23'40" + ANY TIME |
| FLOW RATE OF N₂ | | | | | | | | |
| FLOW RATE OF H₂ | | | | | | | | |
| FLOW RATE OF O₂ | | | | | | | | |

FIG. 20
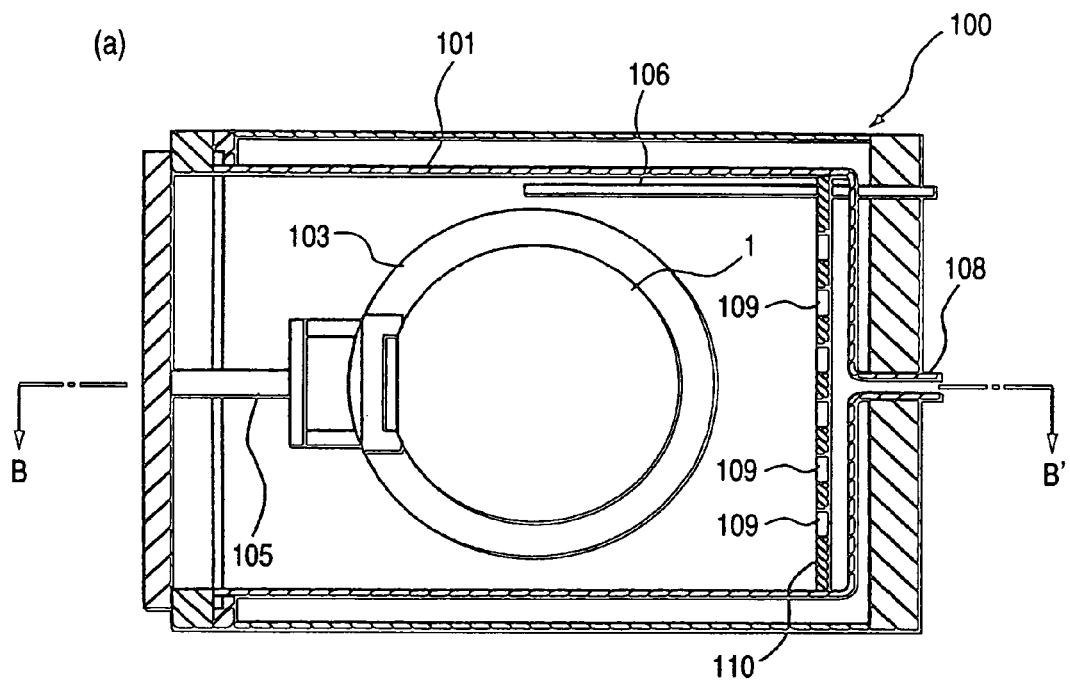
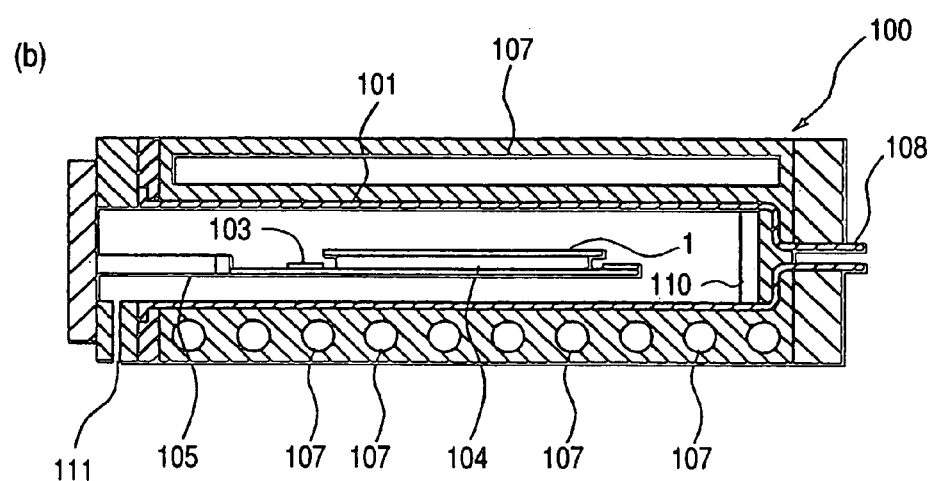

FIG. 47
(a)
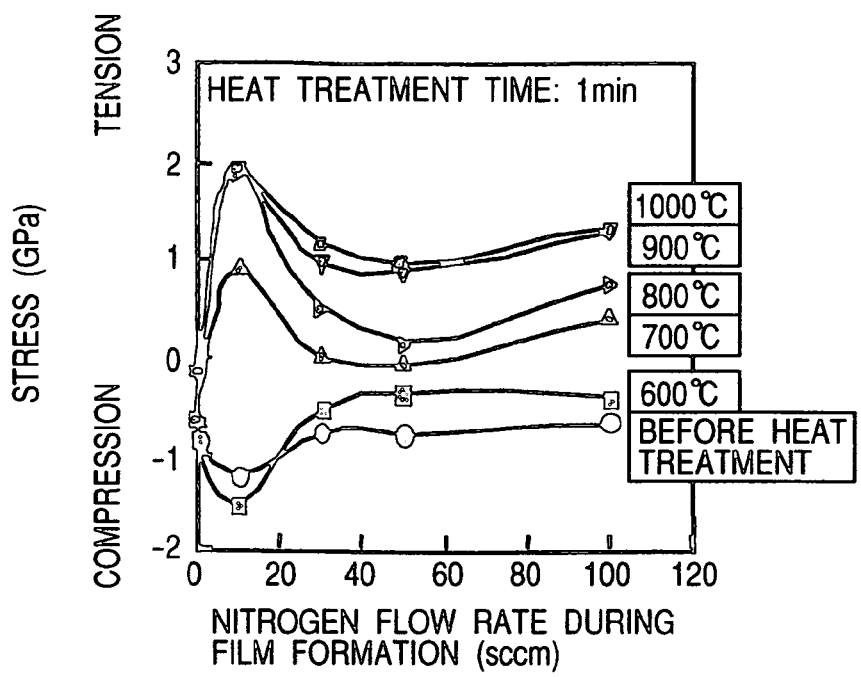
Ar GAS DURING FILM FORMATION 40 sccm,
SUBSTRATE TEMPERATURE 400°C
(b)
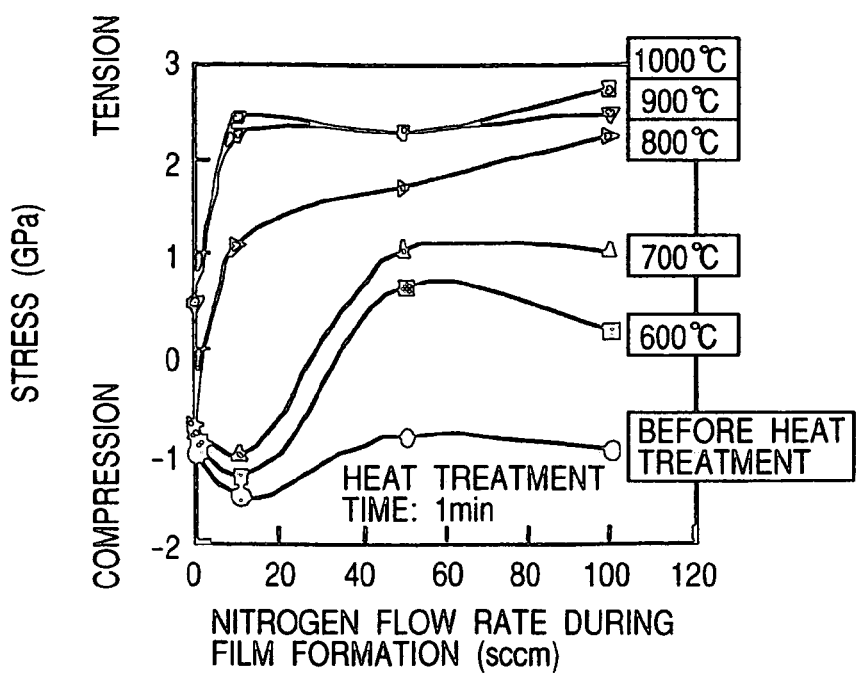
Ar GAS DURING FILM FORMATION 40 sccm,
SUBSTRATE TEMPERATURE 400°C

| ITEM | | | SAMPLE No. | | | | | | | | | |
|---|---|---|---|---|---|---|---|---|---|---|---|---|
| | | | 1 | 2 | 3 | 4 | 5 | 6 | 7 | 8 | 9 | 10 |
| W-1 (FOR SILICIDATION) | | d=7nm | | ○ | ○ | ○ | ○ | ○ | ○ | ○ | ○ | ○ |
| WNx | SPUTTER N GAS AMOUNT N=30% | d=10nm | | ○ | | | | | | | | |
| | | d=12nm | | | ○ | | | | | | | |
| | | d=15nm | ○ | | | | | | | | | |
| | N=50% | d=10nm | | | | | | | | | | |
| | | d=12nm | | | | ○ | | | | | | |
| | | d=15nm | | | | | ○ | | | | | |
| | N=80% | d=10nm | | | | | | ○ | | | | |
| | | d=12nm | | | | | | | ○ | | | |
| | | d=15nm | | | | | | | | ○ | ○ | |
| W-2 | | d=50nm | ○ | ○ | ○ | ○ | ○ | ○ | ○ | ○ | ○ | ○ |

| ITEM | | SAMPLE No. | | | | | | | | | |
|---|---|---|---|---|---|---|---|---|---|---|---|
| | | 1 | 2 | 3 | 4 | 5 | 6 | 7 | 8 | 9 | 10 |
| GATE WITHSTAND VOLTAGE (V) | NFG (FLAT PLATE) Tox=4nm | -5.0 | -0.7 | 1.7 | 2.7 | -5.0 | -5.0 | -5.0 | -5.0 | -5.0 | -5.0 |
| | PFG (FLAT PLATE) Tox=8nm | -6.5 | -0.8 | -3.8 | -3.3 | -6.5 | -6.5 | -6.5 | -6.5 | -6.5 | -6.5 |
| | NFG Tox=4nm | 5.0 | 2.5 | 0.5 | 0.5 | 3.8 | 5.0 | 5.0 | 5.0 | 5.0 | 5.0 |
| | PFG Tox=8nm | 6.5 | 0.5 | 0.5 | 0.7 | 5.7 | 6.5 | 6.5 | 6.5 | 6.5 | 6.5 |
| FG CONTACT RESITANCE (kΩ) | NFG 1μm=1μm | 6.14 | 0.96 | 13.3 | 23.5 | 5.6 | 8.44 | 11.8 | 10.5 | 9.37 | 8.79 |
| | PFG 1μm=1μm | 11.6 | 16.6 | 18.6 | 16.7 | 11.9 | 23.8 | 28.3 | 26.58 | 25.6 | 24.5 |

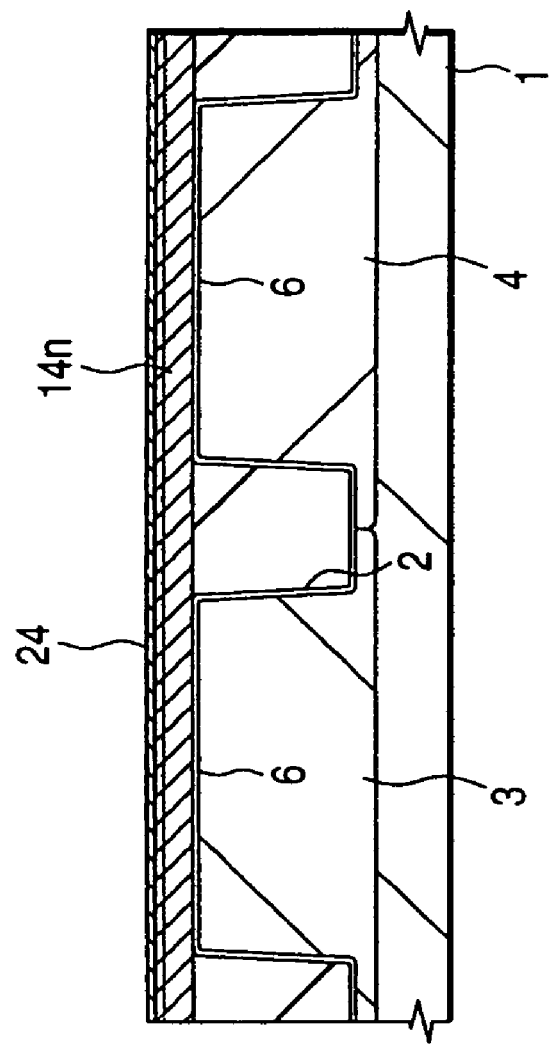
FIG. 54

METHOD OF MANUFACTURING SEMICONDUCTOR INTEGRATED CIRCUIT DEVICE HAVING POLYMETAL GATE ELECTRODE

CROSS-REFERENCE TO RELATED APPLICATION

This application is a continuation of application Ser. No. 10/468,441 filed Aug. 20, 2003 now U.S. Pat. No. 7,049,187, which is a 371 of PCT/JP01/09547 filed Oct. 31, 2001.

TECHNICAL FIELD

The present invention relates to a technology of manufacturing a semiconductor integrated circuit device. More particularly, it relates to a technology effectively applicable to manufacturing of a semiconductor integrated circuit device having MISFETs (Metal Insulator Semiconductor Field Effect Transistors) of a polymetal structure in which each gate electrode is composed of a stacked layer of a polysilicon and a refractory metal.

BACKGROUND ART

An improvement technique for forming a MISFET of a polymetal structure is disclosed in Japanese Unexamined Patent Publication No. Hei 11(1999)-31666. This publication discloses a technology in which the natural oxide formed on the tungsten surface is once reduced, and then, a desirable heat treatment is performed, so that wire tapering and the growth of a needle crystal occurring during the heat treatment due to the reduction treatment is inhibited.

Whereas, Japanese Unexamined Patent Publication No. Hei 11(1999)-26395 discloses the following technology as the measures for relieving the electric field concentration at the gate electrode edge: a gate electrode is formed in a W/WSixNy/WOx structure, and heat treated in a reducing atmosphere, thereby to reduce WOx, and as a result, the gate electrode bottom end is made in a round shape.

Further, Japanese Unexamined Patent Publication No. 2000-331978 discloses the following technology: a W-containing polymetal-structured gate electrode is processed, and then washed with an acidic or alkaline solution substantially not containing hydrogen peroxide, thereby to prevent the dissolution of W.

Other than these, the polymetal gates or metal gates in general are disclosed in, Japanese Unexamined Patent Publication Nos. Sho 60(1985)-89943, Sho 61(1986)-150236, Sho 60(1985)-72229, Sho 59(1984)-10271, Sho 56(1981)-107552, Sho 61(1986)-127123, Sho 61(1986)-127124, Sho 60(1985)-123060, Sho 61(1986)-152076, Sho 61(1986)-267365, Hei 1(1989)-94657, Hei 8(1996)-264531, Hei 3(1991)-119763, and Hei 7(1995)-94716, U.S. Pat. Nos. 4,505,028, 5,719,410, and 5,387,540, IEEE Transaction Electron devices, Vol. 43, No. 11, November 1996, Akasaka et al, p. 1864–1869, Elsevier, Applied Surface Scienece 117/118 (1997) 312–316, Nakajima et al, Nakajima et al, Advanced metalization conference, Japan Session, Tokyo Univ. (1995), and the like.

Further, oxynitriding is disclosed in U.S. Pat. No. 4,282,270, and the like. Still further, the hydrogen exhaust gas treatment is disclosed in U.S. Pat. Nos. 5,202,096 and 5,088,314, Japanese Unexamined Patent Publication Nos. Hei 8(1996)-83772 and 9(1997)-75651, and the like.

Whereas, the matter of the moisture content and oxidation is disclosed in Japanese Unexamined Patent Publication Nos. Hei 7(1995)-321102 and Sho 60(1985)-107840, U.S. Pat. No. 5,693,578, and the like.

Further, the moisture synthesis using a catalyst is disclosed in Japanese Unexamined Patent Publication Nos. Hei 6(1994)-333918, Hei 6(1994)-115903, Hei 5(1993)-152282, Hei 6(1994)-163871, Hei 5(1993)-141871, Hei 5(1993)-144804, and Hei 6(1994)-120206, Nakamura et al, Proceedings of the 45th Symposium on Semiconductors and Integrated circuit Technology, Tokyo Dec. 1–2, 1993, the Electronic materials committee, P. 128–133, and the like.

DISCLOSURE OF THE INVENTION

In a CMOS LSI in which minuscule MOSFETs with a gate length of 0.18 µm or less constitute a circuit, and a DRAM in which 0.18 µm or less-wide gate electrodes and gate electrode layer are used for wiring, a gate processing process using a low-resistance conductive material including a metal layer is conceivably adopted in order to reduce the gate delay even at the time of low-voltage operation, and to ensure the high-speed operation.

The material regarded as being likely to be this kind of low-resistance gate electrode material is a so-called polymetal in which a refractory metal film is stacked on a polysilicon film. The polymetal is available not only as a gate electrode material but also as a wiring material because of its sheet resistance as low as about 2 Ω/□. The refractory metals usable are W (tungsten), Mo (molybdenum), and the like, which show favorable low-resistance properties even in a low-temperature process at 800° C. or less, and high electromigration resistance. Incidentally, if the refractory metal film is stacked directly on a polysilicon film, the adhesion therebetween may be reduced, or a high-resistance silicide layer may be formed at the interface therebetween in a high-temperature heat treatment process. Therefore, an actual polymetal gate is formed in a three-layered structure in which a barrier layer composed of a metal nitride film such as WNX (tungsten nitride) is interposed between the polysilicon film and the refractory metal film.

However, when a gate electrode is formed by etching a conductive film including a refractory metal film, an undesirable oxide is formed on the surface of the refractory metal film exposed at the sidewall of the gate electrode. The oxide formed on the sidewall of the gate electrode is sublimed in the subsequent heat treatment step, and deposited on the silicon and the insulating film surface in the periphery of the gate electrodes. The sublimed metal oxide is deposited on the inner wall of a processing chamber, and the like, and then sublimed again. Alternatively, it is redeposited from the portion in contact with a holder onto the surface of the substrate, resulting in contamination. This entails characteristic deterioration of a device.

It is an object of the present invention to provide a technology for reducing the contamination of a substrate due to an oxide of a refractory metal constituting a part of a polymetal gate.

The foregoing and other objects and novel features of the present invention will be apparent from the following description in this specification and the accompanying drawings.

Out of the aspects of the present invention disclosed in this application, the general outlines of typical ones will be briefly described as follows.

A method for manufacturing a semiconductor integrated circuit device of the present invention comprises the steps of:

(a) forming a refractory metal film on a first principal surface of a wafer;
(b) heating the first principal surface of the wafer having the refractory metal film formed thereon up to a first temperature of 600 degrees centigrade or more under conditions for reducing an oxide of the refractory metal; and
(c) subjecting a portion on the first principal surface of the wafer containing silicon as a main component to an oxidation treatment at the first temperature in a mixed gas atmosphere containing hydrogen, and moisture catalytically synthesized from oxygen and hydrogen without oxidizing the refractory metal film.

Another method for manufacturing a semiconductor integrated circuit device of the present invention, comprises the steps of:
(a) forming a film pattern including a refractory metal film on a first principal surface of a wafer;
(b) heating the first principal surface of the wafer having the film pattern formed thereon up to a first temperature of 600 degrees centigrade or more under conditions for reducing an oxide of the refractory metal; and
(c) forming an insulating film on the first principal surface of the wafer having the film pattern formed thereon at the first temperature by chemical vapor deposition.

A still other method for manufacturing a semiconductor integrated circuit device of the present invention comprises the steps of:
(a) forming a refractory metal film on a first principal surface of a wafer;
(b) subjecting a portion on the first principal surface of the wafer containing silicon as a main component to an oxidation treatment at a first temperature of 600 degrees centigrade or more in a mixed gas atmosphere containing hydrogen and moisture without oxidizing the refractory metal film; and
(c) washing the first principal surface of the wafer with a neutral or weakly alkaline water or chemical solution substantially not containing hydrogen peroxide after the step (b).

BRIEF DESCRIPTION OF THE DRAWINGS

FIG. 18 is an illustrative diagram of a reoxidation process sequence using the batch type vertical oxidizing furnace shown in FIG. 14;

FIG. 20($a$) is a schematic diagram of a single wafer processing type oxidizing furnace for use in manufacturing of the semiconductor integrated circuit device which is the one embodiment of the present invention, and FIG. 20($b$) is a cross sectional view taken along line B–B' of FIG. 20($a$);

FIGS. 47(a) and 47(b) are graphs each showing the results of measurement of the film stress obtained upon heat treating a $WN_x$ film formed by changing the nitrogen gas flow rate while keeping the flow rate of an argon gas at various temperatures;

FIG. 54 is a cross sectional view of the essential part of the semiconductor substrate showing the manufacturing method of the semiconductor integrated circuit device which is the other embodiment of the present invention;

BEST MODE FOR CARRYING OUT THE INVENTION

Figure 1:
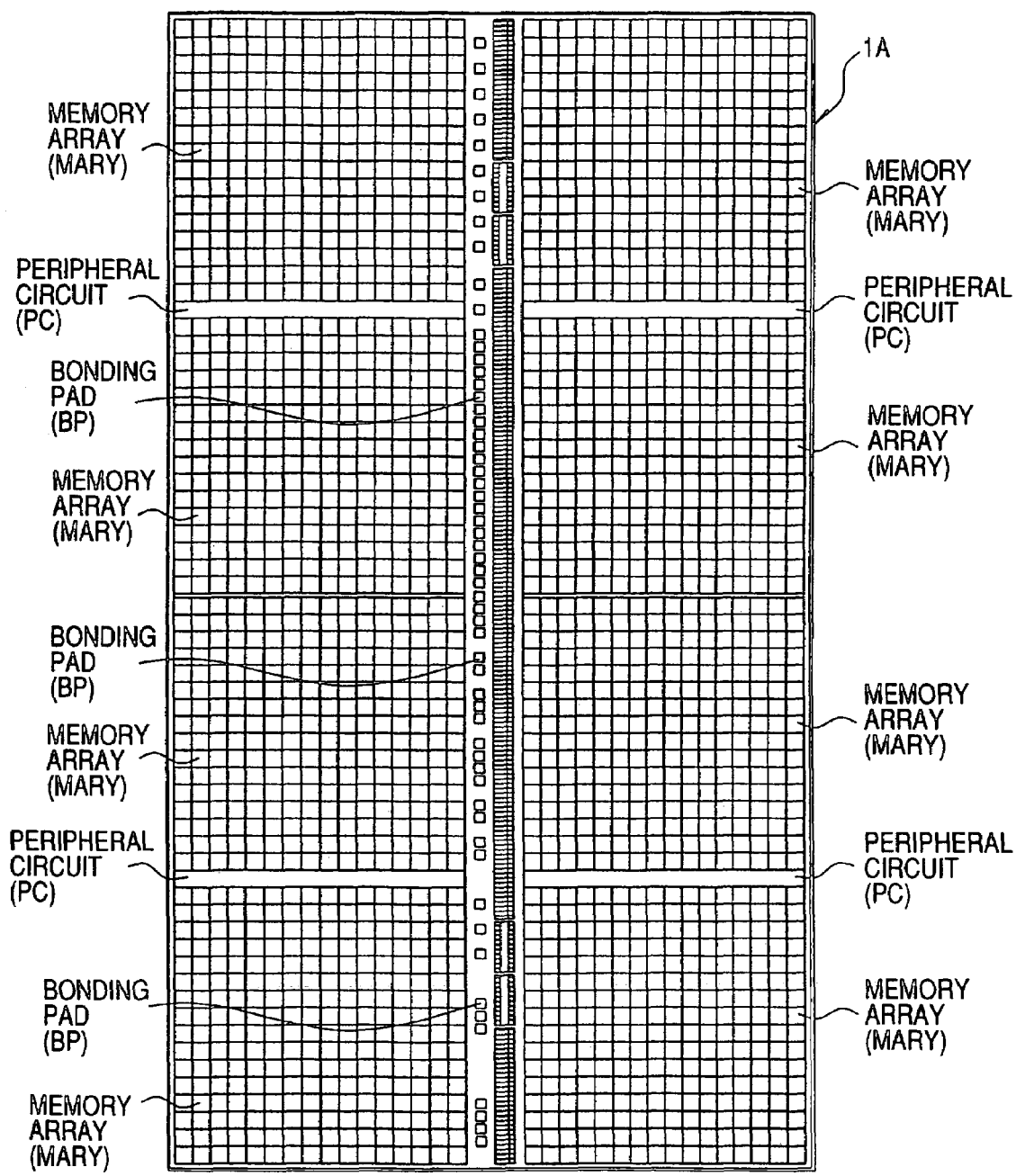
FIG. 1 is an overall plan view of a semiconductor chip in which a semiconductor integrated circuit device which is one embodiment of the present invention is formed.

Below, embodiments of the present invention will be described in details by reference to drawings. Incidentally, throughout the drawings for illustrating the embodiments, the elements having the same function are represented by the same reference numerals and characters, and the repeated description thereon is omitted. Further, in the following embodiments, the description on the same or similar part will not be repeated in principle except when particularly necessary.

Further, in the following embodiments, individual embodiments may be divided into a plurality of sections or embodiments for the sake of convenience, if necessary, to be described. Unless otherwise specified, they are not mutually irrelevant, but one may be in the relation of a varied example, a detail, or a supplemental statement of a part or the whole of the other. Further, in the following embodiments, when reference is made to the numbers of elements, and the like (including the number, numerical value, amount, range, and the like), except when otherwise specified, and except when such numbers are apparently limited to specific numbers in principle, they are not limited to the specific numbers, and may be either equal to, or larger than, or equal to, or smaller than the specific numbers. Still further, in the following embodiments, it is needless to say that, the constituent elements (including elemental steps and the like) are not necessarily essential, except when otherwise specified, and except when they are presumed to be apparently essential in principle.

Likewise, in the following embodiments, when reference is made to the shape and positional relationship of constituent elements, and the like, they are construed as including the ones substantially analogous or similar to the shape, and the like, except when otherwise specified and except when they are presumed to be apparently not so in principle. This is also true for the foregoing numerical values and ranges.

Whereas, semiconductor integrated circuit wafers or semiconductor wafers denote a single crystal silicon substrate (in general, roughly circular in shape), a sapphire substrate, a glass substrate, other insulating, semi-insulating or semiconducting substrates, and the like, and composite substrates thereof. Further, the term "semiconductor integrated circuit devices" (or "electronic devices" "electronic circuit devices", or the like) herein used include not only the one formed on a single crystal silicon substrate, but also those formed on the foregoing various substrates, or still other substrates such as a SOI (Silicon On Insulator) substrate, a substrate for fabrication of a TFT (Thin Film Transistor) liquid crystal, and a substrate for fabrication of a STN (Super Twisted Nematic) liquid crystal, unless otherwise specified.

Where reference is made to the materials, the gas composition, and the like, unless otherwise specified, a material including the material as a main ingredient, and the like are shown other than the pure ones, and addition of other elements is acceptable.

For example, for the gas composition, other than the main reaction gas and processing gas, addition of an indirectly acting addition gas, dilution gas, auxiliary gas, or the like is acceptable.

Further, where reference is made to silicon oxide films, they are construed as generally including, unless otherwise specified, various silicon oxide-based films containing various additives and auxiliary components, i.e., a PSG (Phospho Silicate Glass) film, a BPSG (Boro-Phospho Silicate Glass) film, a TEOS (Tetra-Ethoxy Silane) oxide film, a silicon oxynitride film, etc., and other single films or composite films.

Still further, where reference is made to silicon nitride, it includes not only $Si_3N_4$ but also an insulating film which is the nitride of silicon, and has a similar composition.

As for gate oxide films, these include a silicon thermal oxide film and a silicon oxynitride film, and in addition, other thermal oxide films, deposition films, and coat-type films. In terms of materials, these include non-silicon type metal oxides other than a silicon oxide film, insulating nitrides such as silicon nitride, or composite films thereof.

Whereas, where the materials for the conductive area of the substrate surface and the conductive area of the deposition film are each referred to as "silicon" or "siliconbase", unless otherwise specified, these include relatively pure silicon members, and in addition, those obtained by adding impurities and additives to silicon, conductive members each containing silicon as a main ingredient (for example, a SiGe alloy which is a silicon base alloy containing 50% or more Ge is included. For example, the gate polysilicon portion and the channel area are composed of SiGe.), and the like. Further, it is acceptable that these have a high resistance at the early stage upon formation, unless technically contradictory.

Further, some of deposition films, or the like are amorphous at the early stage upon deposition, but are immediately turned to the polycrystal state due to the subsequent heat treatment. Except when regarded as particularly necessary, they may be indicated by their later form from the early stage for avoiding the inconsistency in expression. For example, for a polycrystal silicon (polysilicon), the film is in an amorphous state at the early stage upon deposition, and turned to polysilicon by the subsequent heat treatment. However, it is needless to say that a polysilicon can also be used from the beginning. If the film is in the amorphous state at the early stage upon deposition, there are merits in preventing the channeling in ion implantation, avoiding the difficulty due to the processability depending upon the particle lump shape for dry etching or the like, achieving a low sheet resistance after a heat treatment, and the like.

Further, other technologies related to the execution of the present invention are disclosed in details in the following applications in which the inventors are involved. Namely, the applications are: Japanese Published Examined Application No. 2000-118491, Japanese Published Unexamined Application Nos. Hei 09(1997)-172011, Hei 10(1998)-335652, Hei 10(1998)-340909, Hei 11(1999)-330468, U.S. Pat. No. 6,066,508, WO98/39802, WO 97/28085, and the like.

(Embodiment 1)

FIG. 1 is an overall plan view of a semiconductor chip 1A on which a DRAM (Dynamic Random Access Memory) of this embodiment is formed. On the principal surface of a rectangular semiconductor chip 1A, a DRAM having, for example, a 256 Mbit (megabit) storage capacity is formed. The DRAM is mainly composed of a memory unit made up of a plurality of memory arrays (MARYs), and a peripheral circuit portion PC disposed therearound. At the central portion of the semiconductor chip 1A, a plurality of bonding pads BP to which connection terminals such as bonding wires are connected are arranged in one row.

Figure 2:
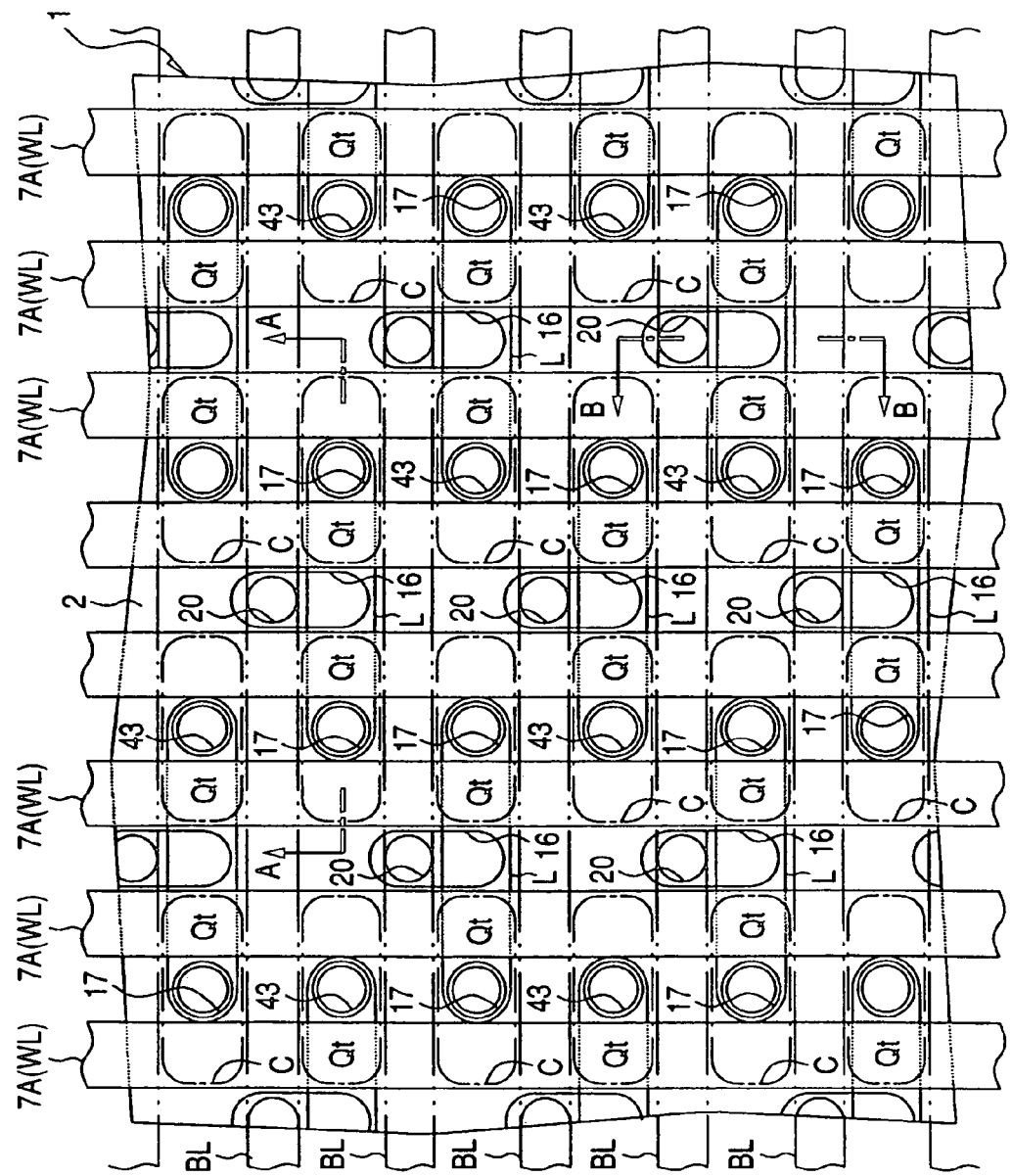
FIG. 2 is a plan view of the essential part of the semiconductor integrated circuit device which is the one embodiment of the present invention.
Figure 3:
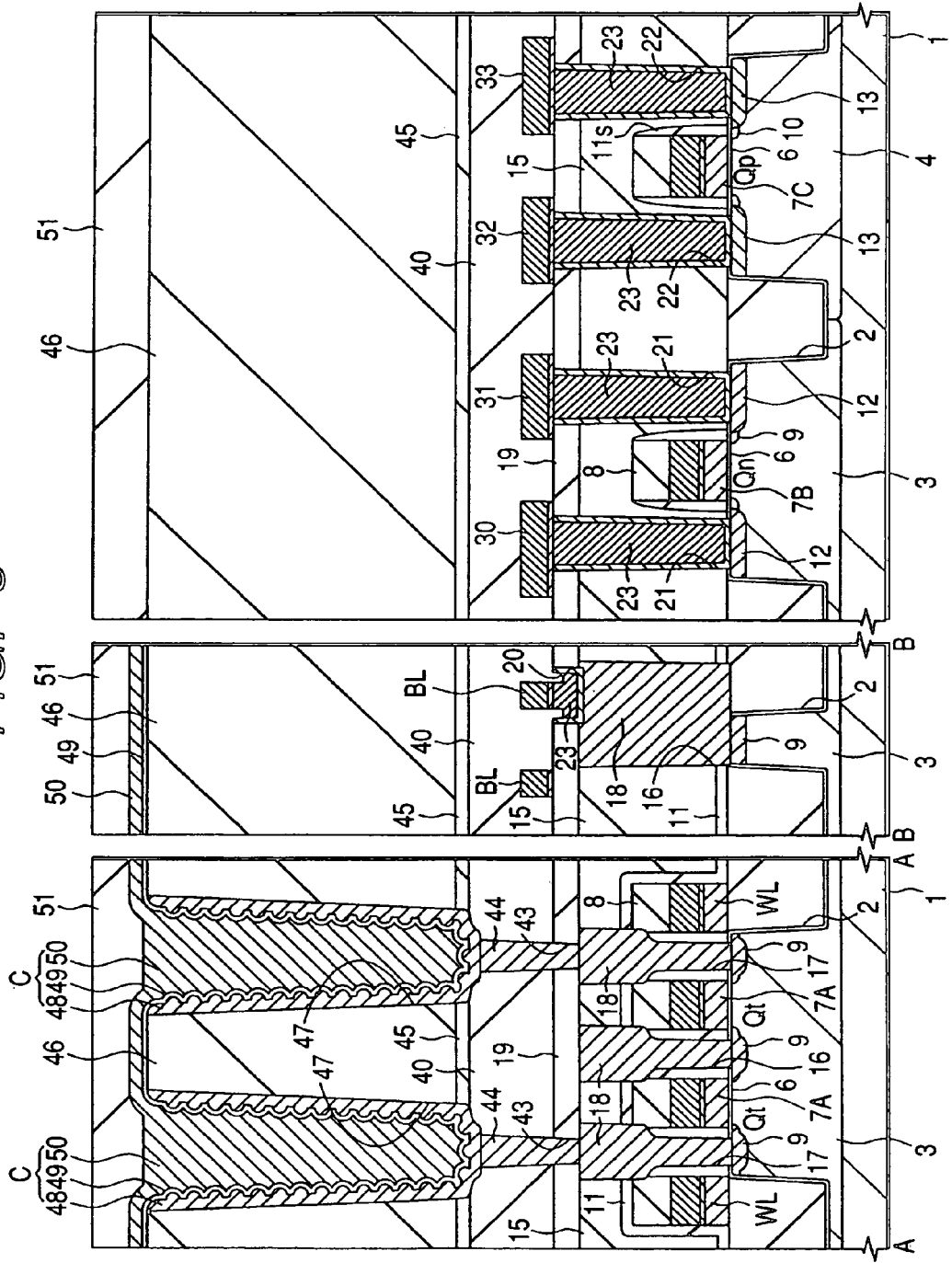
FIG. 3 is a cross sectional view of the essential parts of the semiconductor integrated circuit device which is the one embodiment of the present invention.

FIG. 2 is a plan view of a semiconductor substrate showing a part of the memory array (MARY) of the DRAM. FIG. 3 is a cross sectional view of the essential parts of the semiconductor substrate showing the DRAM. Incidentally, the left-hand side region of FIG. 3 is a cross sectional diagram taken along line A—A of FIG. 2; the central region, a cross sectional diagram taken along line B—B of FIG. 2; and the right-hand side region, a cross sectional diagram showing a part of the peripheral circuit portion (PC).

On the principal surface of a semiconductor substrate (below, referred to as a substrate; alternatively, may also be referred to as a semiconductor wafer or simply a wafer) 1 composed of, for example, a p-type single crystal silicon, each element isolation trench 2, each p-type well 3, and each n-type well 4 are formed. In the p-type well of the memory array, a plurality of memory cells each composed of an n-channel type memory cell selecting MISFET (Metal Insulator Semiconductor Field Effect Transistor) Qt, and an information storing capacitive element C formed on the top thereof are formed.

The memory cell selecting MISFET Qt is mainly composed of a gate insulating film 6, a gate electrode 7A constituting a word line WL in a region other than an active region L, and a pair of n-type semiconductor regions (source and drain) 9. The gate electrode 7A (word line WL) is composed of, for example, a conductive film of a so-called polymetal structure, in which a $WN_x$ (tungsten nitride) film and a W film are stacked on a P (phosphorus)-doped n-type polysilicon film.

The peripheral circuit portion PC of the DRAM is composed of a so-called complementary MIS circuit in which a plurality of n-channel type MISFETs Qn and a plurality of p-channel type MISFETs Qp are combined. The n-channel type MISFET Qn is formed in the p-type well 3, and mainly composed of the gate insulating film 6, a gate electrode 7B, and a pair of $n^+$-type semiconductor regions (source and drain) 12. Whereas, the p-channel type MISFET Qp is formed in the n-type well 4, and mainly composed of the gate insulating film 6, a gate electrode 7C, and a pair of $p^+$-semiconductor regions (source and drain) 13. The gate electrodes 7B and 7C are composed of the same polymetal-structured conductive film as that of the gate electrode 7A (word line WL) of the memory cell selecting MISFET Qt. On the sidewalls of the gate electrodes 7B and 7C, sidewall spacers 11s composed of a silicon nitride film are formed.

On the memory cell selecting MISFETs Qt, the n-channel type MISFETs Qn, and the p-channel type MISFETs Qp, a silicon nitride film 11 covering the top and the sidewall of each gate electrode 7A (word line WL), and an interlayer insulating film 15 are formed. The interlayer insulating film 15 is composed of, for example, a spin on glass film (a silicon oxide-based insulating film formed by a coating process), and a two-layered silicon oxide film formed thereon.

On a pair of the n-type semiconductor regions 9 constituting the source and the drain of each memory cell selecting MISFET Qt, there are formed contact holes 16 and 17 formed by opening windows in the interlayer insulating film 15 and the underlying silicon nitride film 11. Inside these contact holes 16 and 17, plugs 18 composed of, for example, an n-type polysilicon film doped with P (phosphorus) are embedded.

On the interlayer insulating film 15, a silicon oxide film 19 is formed. A through hole 20 is formed in the silicon oxide film 19 on one (contact hole 16) of a pair of the contact holes 16 and 17. The through hole 20 is disposed above the element isolation trench 2 lying outside the active region L, and a plug 23 composed of, for example, a two-layered conductive film in which a W film is stacked on a TiN (titanium nitride) film is embedded in the inside thereof. The plug 23 embedded in the through hole 20 is electrically connected to one of the source and the drain (the n-type semiconductor region 9 shared by two memory cell selecting MISFETs Qt) of the memory cell selecting MISFET Qt through the plug 18.

Contact holes 21 and 22 are formed in the silicon oxide film 19 and the underlying interlayer insulating film 15 of the peripheral circuit portion. The contact holes 21 are formed on a pair of the $n^+$-type semiconductor regions (source and drain) 12 respectively constituting the source and the drain of the n-channel type MISFET Qn. Whereas, the contact holes 22 are formed on a pair of the $p^+$-type semiconductor regions (source and drain) 13 respectively constituting the source and the drain of the p-channel type MISFET Qp. Plugs 23 composed of the same conductive material as that for the plug 23 embedded in the through hole 20 of the memory array are embedded inside the contact holes 21 and 22.

On the silicon oxide film 19 of the memory array, a plurality of bit lines BL for reading the data of the memory cell are formed. The bit lines BL are disposed above the element isolation trenches 2, and extend in a direction orthogonal to the gate electrodes 7A (word lines WL) with an equal width and an equal spacing. Each of the bit lines BL is electrically connected to one of the source and the drain (n-type semiconductor region 9) of each memory cell selecting MISFET Qt via the plug 23 in the through hole 20 formed in the underlying silicon oxide film 19 and the plug 18 in the underlying contact hole 16. The bit line BL is composed of, for example, a conductive film in which a W film is stacked on a $WN_x$ film.

On the silicon oxide film 19 of the peripheral circuit portion PC, first layer wirings 30 to 33 are formed. These wirings 30 to 33 are composed of the same conductive film as that of the bit line BL, and formed simultaneously with the bit line BL as described later. The wirings 30 and 31 are electrically connected to the source and the drain ($n^+$-type semiconductor regions 12) of the n-channel type MISFET Qn via the plugs 23 in the contact holes 21 formed in the silicon oxide films 19 and 15. The wirings 32 and 33 are electrically connected to the source and the drain ($p^+$-type semiconductor regions 13) of the p-channel type MISFET Qp via the plugs 23 in the contact holes 22 formed in the silicon oxide films 19 and 15.

On the bit lines BL, and the first layer wirings 30 to 33, an interlayer insulating film 40 is formed. The interlayer insulating film 40 is composed of a spin on glass film and a two-layered silicon oxide film formed thereon as with the underlying interlayer insulating film 15. The surface thereof is planarized so as to be at almost the same height throughout the substrate 1.

In the interlayer insulating film 40 and the underlying silicon oxide film 19 of the memory array, through holes 43 are formed. Each of the through holes 43 is disposed right above the underlying contact hole 17. In the inside thereof, for example, a plug 44 composed of a P (phosphorus)-doped n-type polysilicon film is embedded.

On the interlayer insulating film 40, a silicon nitride film 45 and a silicon oxide film 46 with a large thickness are formed. Inside each deep groove 47 formed in the silicon oxide film 46 of the memory array, an information storing capacitive element C composed of a lower electrode 48, a capacity insulating film 49, and an upper electrode 50 is formed. The lower electrode 48 of the information storing capacitive element C is composed of, for example, a P (phosphorus)-doped low-resistance n-type polysilicon film. It is electrically connected to the other one of the n-type semiconductor regions (source and drain) 9 of the memory cell selecting MISFET Qt via the through hole 43 and the contact hole 17 formed thereunder. Whereas, the capacity insulating film 49 of the information storing capacitive element C is composed of, for example, a $Ta_2O_5$ (tantalum oxide) film, and the upper electrode 50 is composed of, for example, a TiN film.

On the information storing capacitive element C, a silicon oxide film 51 is formed. Further, Al wiring having about two layers is formed thereon, but not shown.

Then, one example of a method for manufacturing the DRAM of this embodiment constituted as described above will be described step by step with reference to FIGS. 4 to 37.

Figure 4:
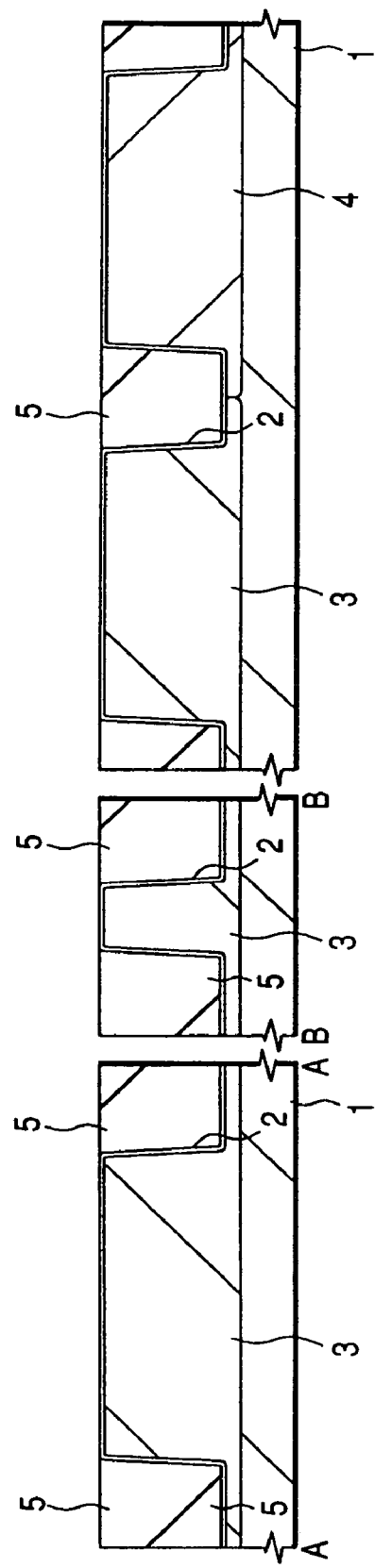
FIG. 4 is a cross sectional view of the essential parts of a semiconductor substrate showing a manufacturing method of the semiconductor integrated circuit device which is the one embodiment of the present invention.
Figure 5:
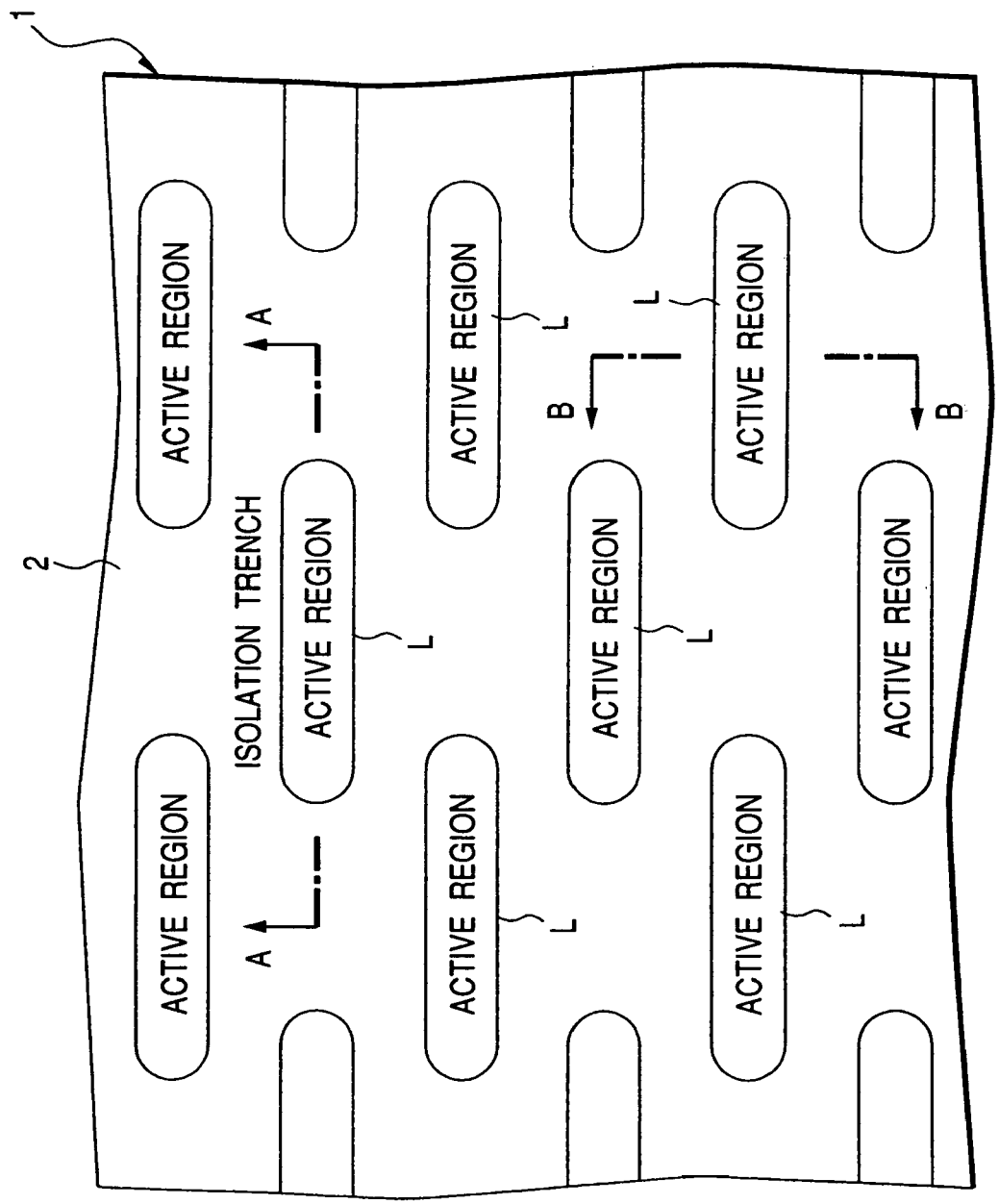
FIG. 5 is a plan view of the essential part of the semiconductor substrate showing the manufacturing method of the semiconductor integrated circuit device which is the one embodiment of the present invention.

First, as shown in FIG. 4, a substrate (wafer) 1 composed of, for example, a p-type single crystal silicon is prepared. The element isolation trenches 2 are formed in the principal surface thereof. Then, B (boron) and P (phosphorus) are ion implanted into one portion, and the other portion of the substrate 1, respectively. Subsequently, the substrate 1 is heat treated at about 950° C. for about 10 minutes, so that these impurities are diffused. As a result, each p-type well 3 and each n-type well 4 are formed. The element isolation trenches 2 are formed in the following manner. For example, the element isolation regions of the substrate 1 are etched to form trenches each with a depth of about 350 nm. Subsequently, a silicon oxide film 5 is deposited inside each of the trenches and on the substrate 1 by a CVD (chemical vapor deposition) process. Then, the unnecessary silicon oxide film 5 outside the trenches is removed by a chemical mechanical polishing (CMP) process. As shown in FIG. 5, by forming the element isolation trenches 4, a plurality of active regions L each having an elongated island pattern surrounded by the element isolation trenches 2 are formed on the substrate 1 of the memory array.

Figure 6:
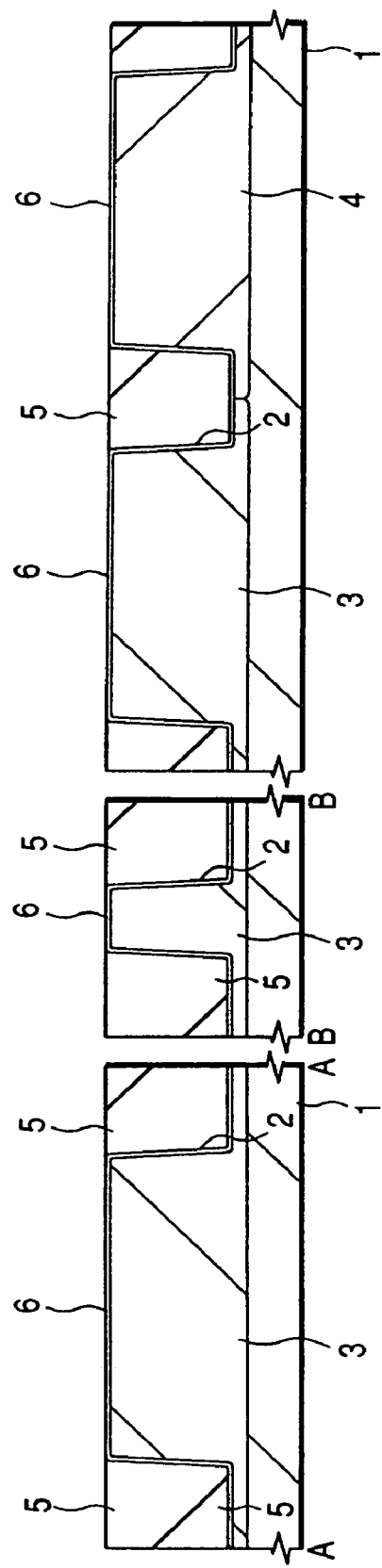
FIG. 6 is a cross sectional view of the essential parts of the semiconductor substrate showing the manufacturing method of the semiconductor integrated circuit device which is the one embodiment of the present invention.

Then, the surface of the substrate 1 is washed with hydrofluoric acid. Then, as shown in FIG. 6, the substrate 1 is steam oxidized, thereby to form a clean gate insulating film 6 composed of a silicon oxide film on the surface of the p-type well 3 and the n-type well 4. The thickness of the gate insulating film 6 is, for example, 6 nm. The gate insulating film 6 may be formed of a silicon oxynitride film, a silicon nitride film, a composite insulating film of a silicon oxide film and a silicon nitride film, and the like, in place of the silicon oxide film.

Figure 7:
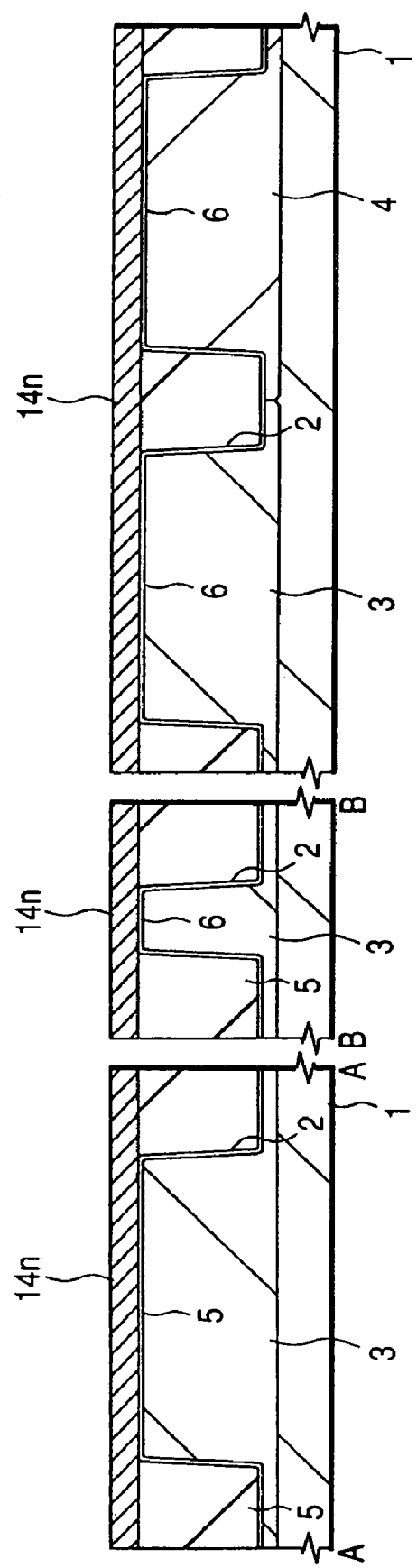
FIG. 7 is a cross sectional view of the essential parts of the semiconductor substrate showing the manufacturing method of the semiconductor integrated circuit device which is the one embodiment of the present invention.

Then, as shown in FIG. 7, a P (phosphorus)-doped n-type polysilicon film 14n is deposited on the gate insulating film 6. The polysilicon film 14n is deposited by a CVD process using, for example, monosilane ($SiH_4$) and phosphine ($PH_3$) as source gases (film formation temperature=about 630° C.), and the thickness is set at about 70 nm. The polysilicon film 14n is set to have a P concentration of $1.0 \times 10^{19}$ $cm^3$ or more in order to reduce the electric resistance.

Further, the polysilicon film 14n may also be replaced by a silicon film containing Ge (germanium) in an amount of from 5% to around 50% at the maximum. When silicon is allowed to contain Ge, the bandgap of silicon narrows, and the solid solubility of impurities is raised. This advantageously causes a reduction in contact resistance with the overlying WN$_x$ film. In order for silicon to contain Ge, other than a process in which Ge is introduced into the silicon film by ion implantation, a process in which a Ge-containing silicon film is deposited by a CVD process using monosilane (SiH$_4$) and GeH$_4$ is adopted.

Figure 8:
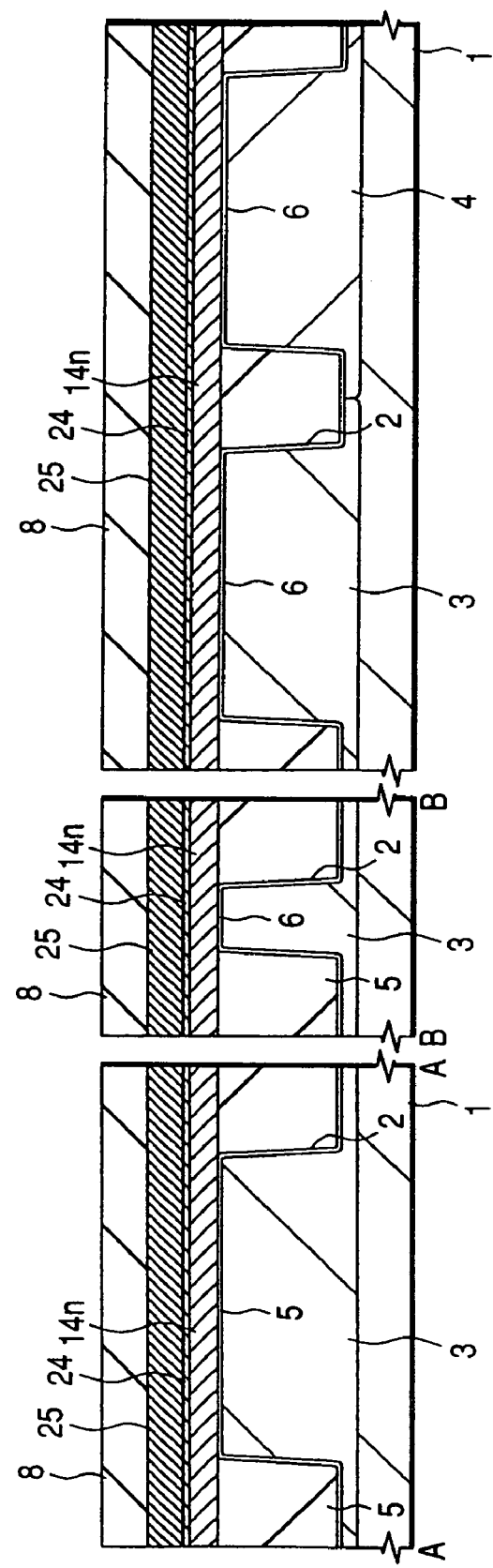
FIG. 8 is a cross sectional view of the essential parts of the semiconductor substrate showing the manufacturing method of the semiconductor integrated circuit device which is the one embodiment of the present invention.

Then, the surface of the polysilicon film 14$n$ is washed with hydrofluoric acid. Then, as shown in FIG. 8, on the polysilicon film 14$n$, a WN$_x$ film 24 with a thickness of about 7 nm and a W film 25 with a thickness of about 70 nm are continuously deposited by a sputtering process. Subsequently, on the W film 25, a silicon nitride film 8 with a thickness of about 160 nm is deposited by a CVD process. The WN$_x$ film 24 functions as a barrier layer for preventing the reaction between the polysilicon film 14$n$ and the W film 25. Incidentally, when the silicon nitride film 8 is deposited, the following procedures may be desirably adopted. In order to inhibit the oxidation of the surface of the W film 25, a thin silicon nitride film with a thickness of about 10 nm is deposited on the W film 25 using a plasma CVD process capable of film formation at a relatively low temperature (around 480° C.). Then, lamp annealing at about 950° C. for about 10 seconds is performed to remove the gas components in the silicon nitride film. Thereafter, in order to obtain a dense film, a silicon nitride film with a thickness of about 150 nm is deposited using a low-pressure CVD process (film formation temperature=around 780° C.). Alternatively, a silicon oxide film is deposited on the W film 25 using a plasma CVD process. Then, the silicon nitride film 8 is deposited thereon using a low-pressure CVD process.

Figure 9:
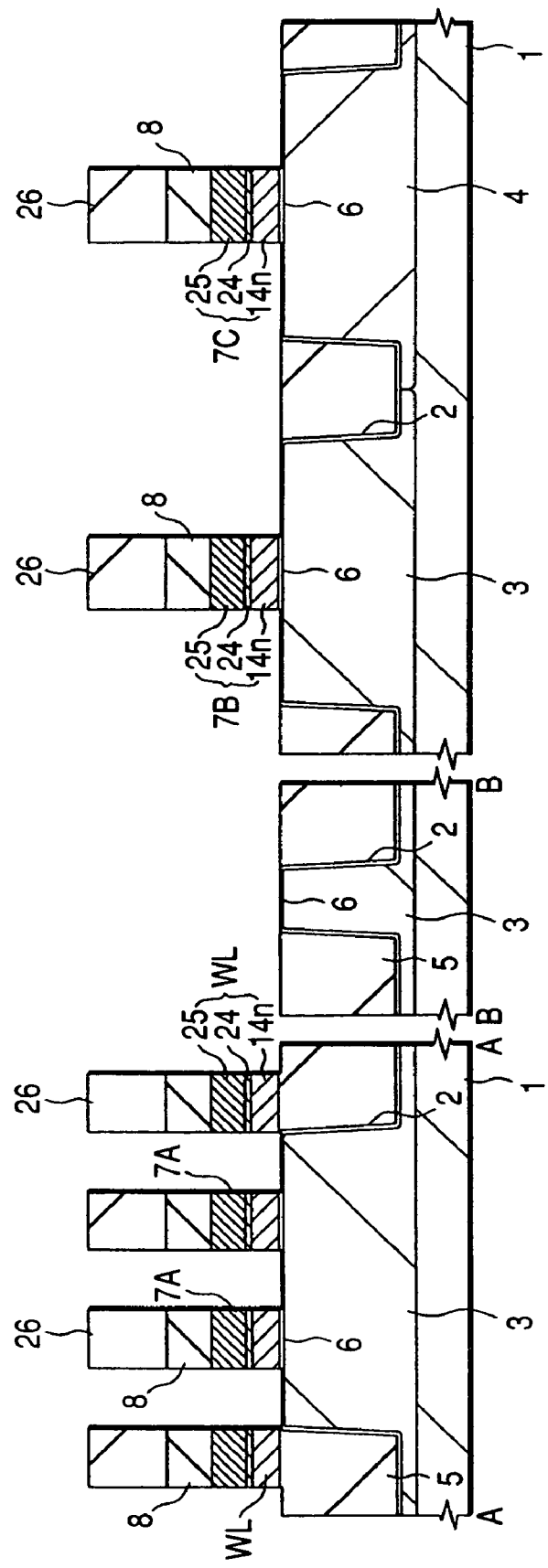
FIG. 9 is a cross sectional view of the essential parts of the semiconductor substrate showing the manufacturing method of the semiconductor integrated circuit device which is the one embodiment of the present invention.
Figure 10:
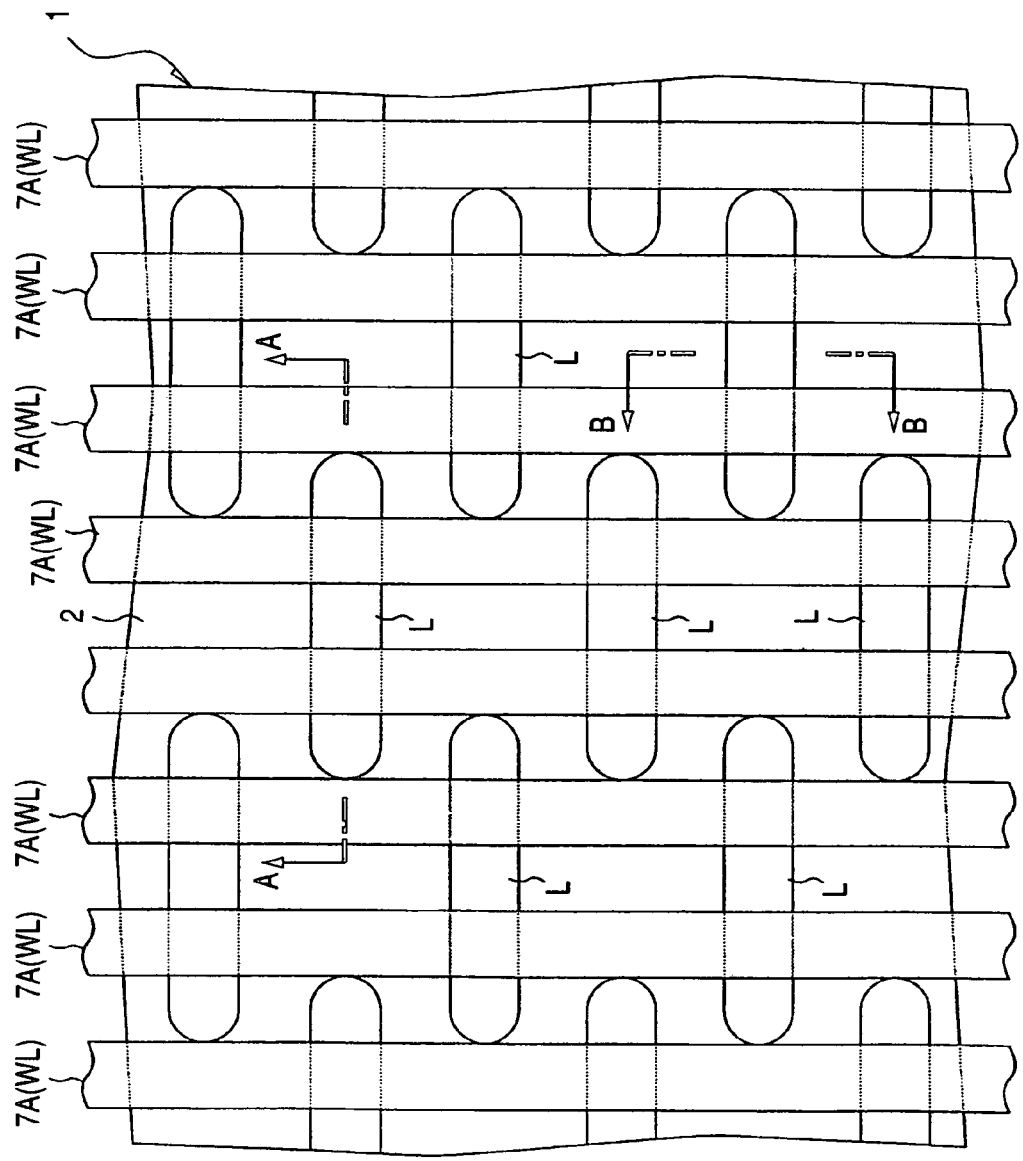
FIG. 10 is a plan view of the essential part of the semiconductor substrate showing the manufacturing method of the semiconductor integrated circuit device which is the one embodiment of the present invention.

Then, as shown in FIG. 9, by using a photoresist film 26 formed on the silicon nitride film 8 as a mask, the silicon nitride film 8, the W film 24, the WN$_x$ film 25, and the polysilicon film 14$n$ are successively dry etched. As a result, the gate electrodes 7A (word lines WL) are formed on the gate insulating film 6 of the memory array, and the gate electrodes 7B and 7C are formed on the gate insulating film 6 of the peripheral circuit portion. As shown in FIG. 10, each gate electrode 7A (word line WL) is formed so as to extend in a direction orthogonal to the longer side of each active region L. The line width (gate length) of the gate electrode 7A (word line WL) and the spacing between adjacent gate electrodes 7A (word lines WL) are for example, 0.13 to 0.14 μm.

Thus, by adopting the polymetal structure in which a part of the conductive materials constituting the gate electrodes 7A (word lines WL), and the gate electrodes 7B and 7C is composed of a low-resistance metal (W), the sheet resistance is reduced to about 2 Ω/□, or lower. This inhibits the gate delay, which enables the implementation of a DRAM operating at high speed.

Figure 11:
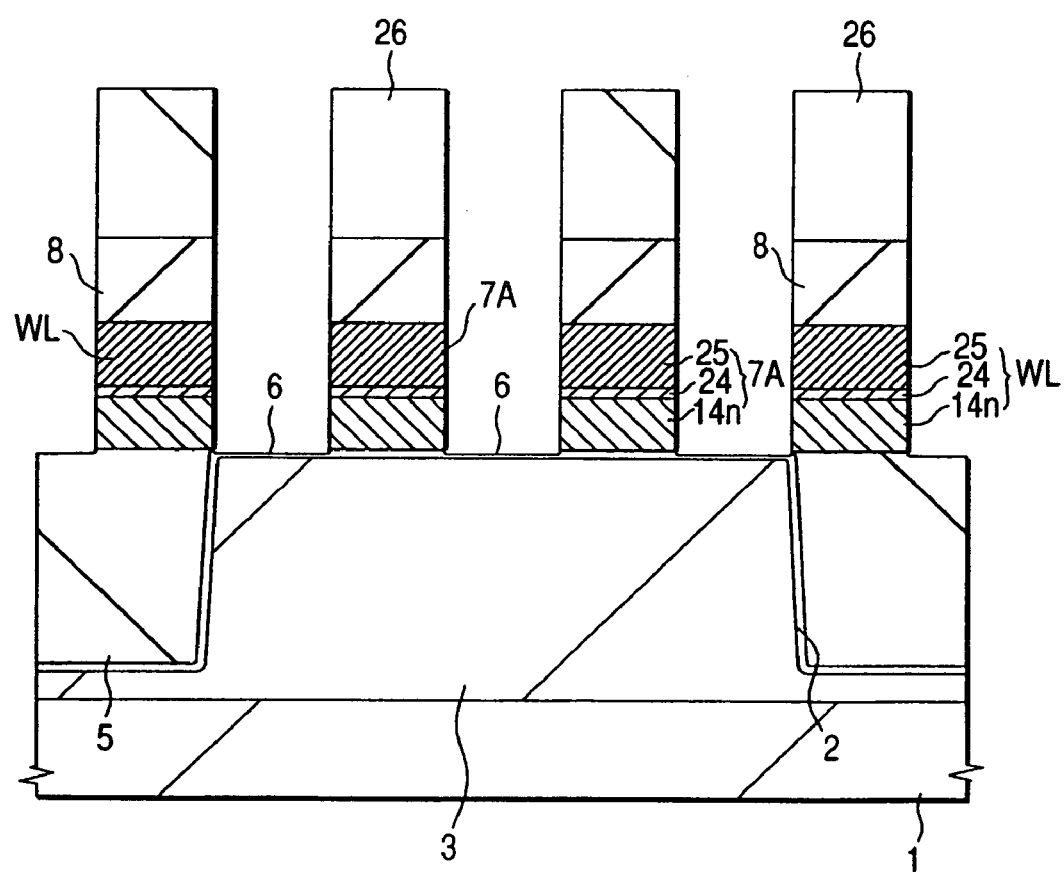
FIG. 11 is an enlarged cross sectional view of the essential parts of the semiconductor substrate showing the manufacturing method of the semiconductor integrated circuit device which is the one embodiment of the present invention.

Incidentally, in the dry etching step for forming the gate electrodes 7A (word lines WL), 7B, and 7C, as shown in FIG. 11, the gate insulating film 6 is desirably left thinly (for example, about 3 nm in thickness) on the substrate 1 around the gate electrodes 7A (word lines WL), 7B, and 7C. If the substrate 1 underlying the gate insulating film 6 is exposed by this dry etching, the contamination containing W which is a part of the gate electrode materials is directly deposited on the surface of the substrate 1 in the subsequent heat treatment step. As a result, a reaction product such as W silicide which is difficult to remove with a general washing treatment may be formed.

Figure 12:
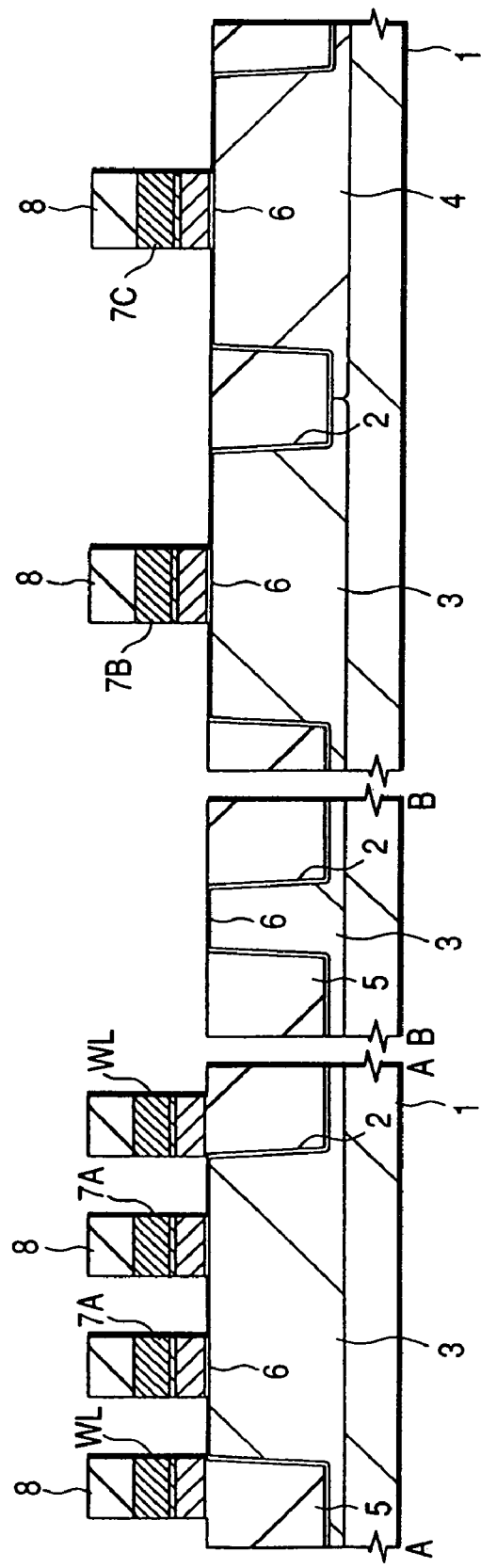
FIG. 12 is a cross sectional view of the essential parts of the semiconductor substrate showing the manufacturing method of the semiconductor integrated circuit device which is the one embodiment of the present invention.

Then, the substrate 1 is transferred from a dry etching apparatus to an ashing apparatus. As shown in FIG. 12, the photoresist film 26 is removed by ashing using an O$_2$ plasma.

Figure 13:
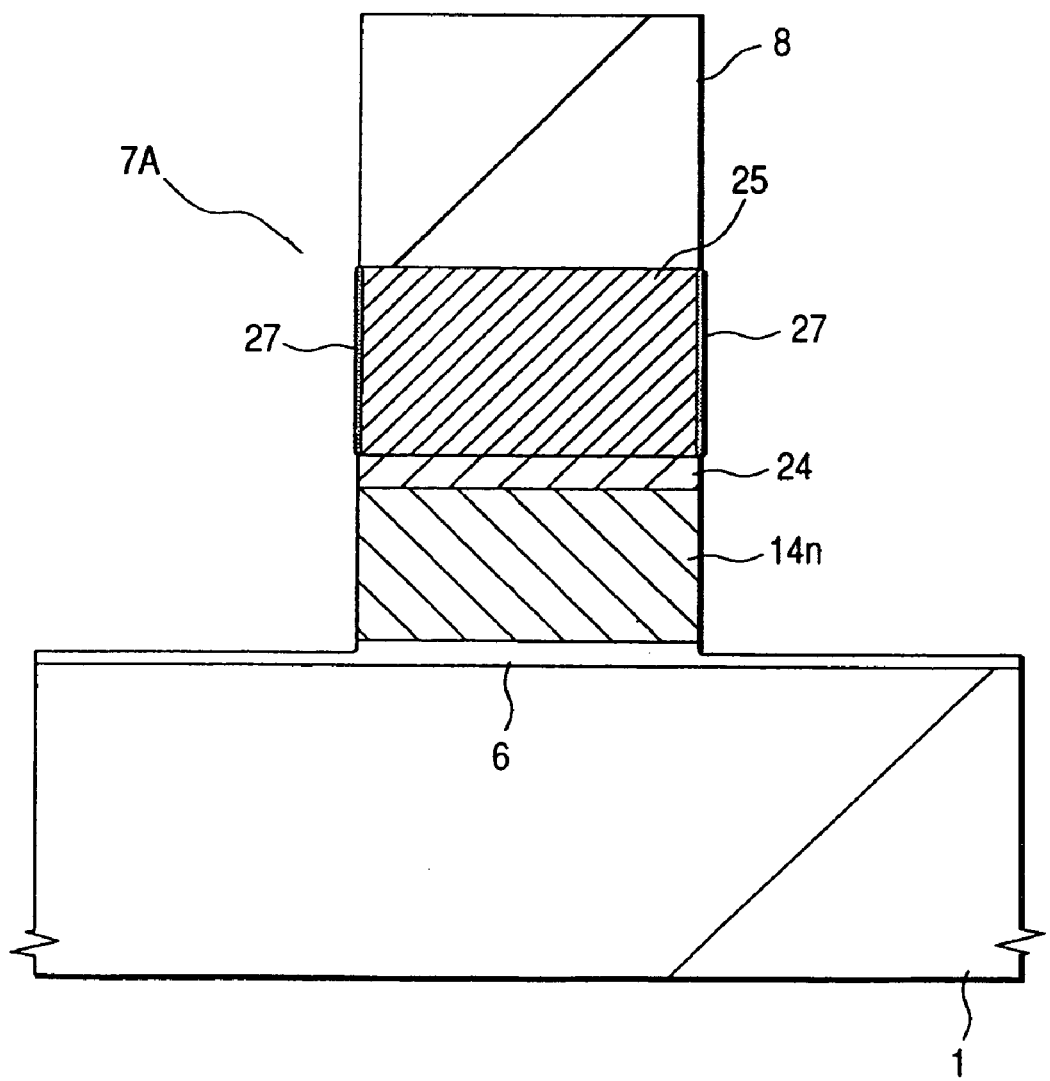
FIG. 13 is an enlarged cross sectional view of the essential part of the semiconductor substrate showing the manufacturing method of the semiconductor integrated circuit device which is the one embodiment of the present invention.

When the substrate 1 is transferred from the dry etching apparatus to the ashing apparatus, the surface of the substrate 1 is exposed to air during the process. Further, when the photoresist film 26 is removed by ashing using an O$_2$ plasma, the surface of the substrate 1 is exposed to the O$_2$ plasma atmosphere. Accordingly, upon completion of the ashing, as shown in FIG. 13, an undesirable oxide (WO$_x$) 27 is formed on the surface of the W film 25 exposed at each sidewall of the gate electrodes 7A, 7B, and 7C. The oxide 27 is sublimed in the subsequent heat treatment step, and deposited on the inner wall of the heat treatment chamber, and the like. Then, it is redeposited on the surface of the substrate 1, resulting in a contamination. This entails deterioration of characteristics of the device (refresh failure, or the like for the DRAM).

As previously described, in the dry etching step for forming the gate electrodes 7A, 7B, and 7C, the lower part of each sidewall of the gate electrodes 7A, 7B, and 7C, and the gate insulating film 6 on the peripheral region are also cut away to a certain degree, resulting in a smaller film thickness than the film thickness at the early stage upon formation (see FIG. 13). Therefore, if the film remains as it is, deficiencies as the reduction in gate withstand voltage occurs. Under such circumstances, in order to repair and regenerate the thinned gate insulating film 6, a reoxidation treatment is performed in the following manner.

Figure 14:
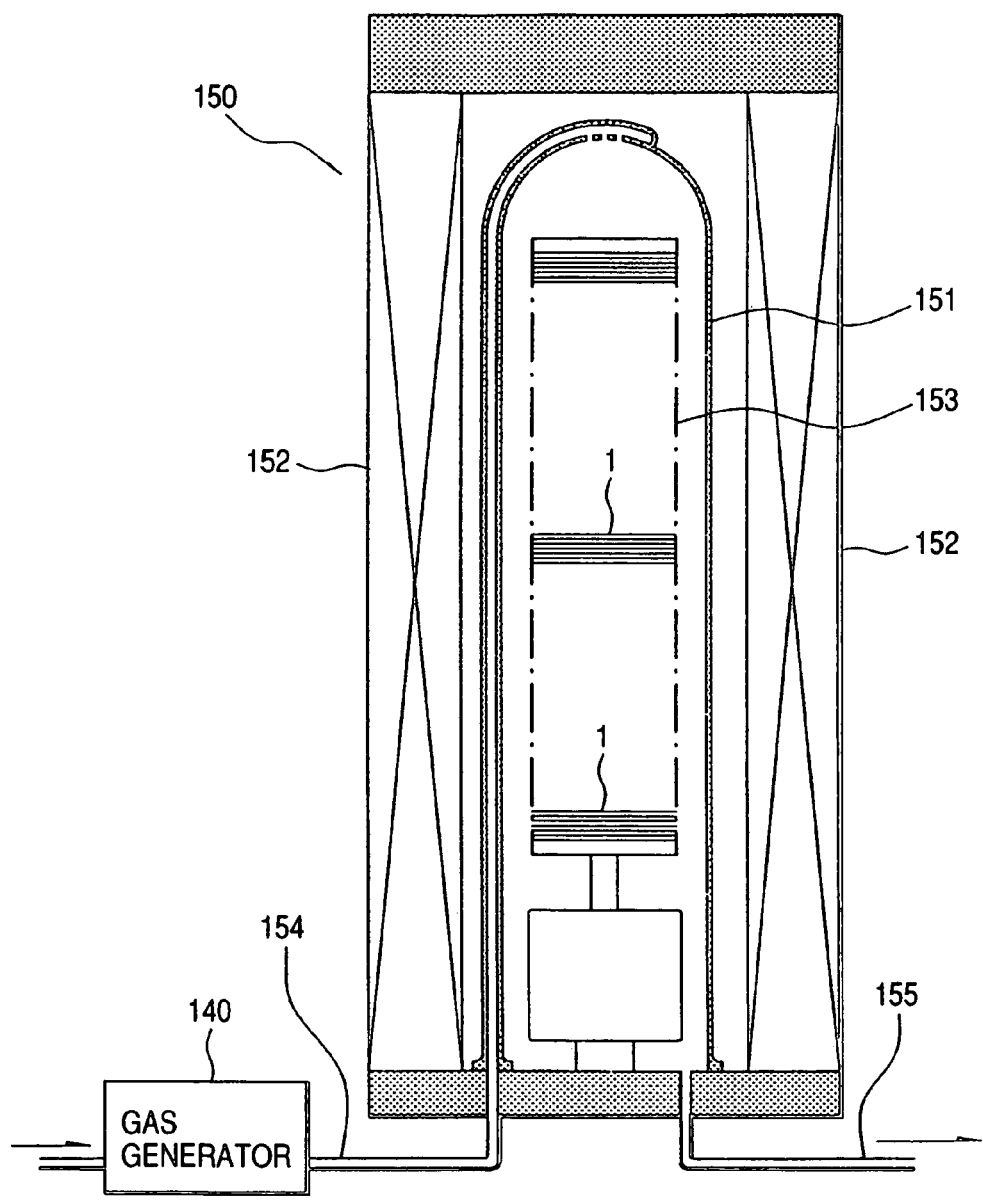
FIG. 14 is a schematic diagram of a batch type vertical oxidizing furnace for use in manufacturing of the semiconductor integrated circuit device which is the one embodiment of the present invention.

FIG. 14 is a schematic diagram showing one example of a batch type vertical oxidizing furnace for use in the reoxidation treatment of the gate insulating film 6. The vertical oxidizing furnace 150 includes a chamber 151 composed of a quarts tube, and a heater 152 for heating the wafer (substrate) 1 disposed therearound. Inside the chamber 151, a quarts boat 153 for horizontally holding a plurality of wafers 1 is disposed. Further, to the bottom of the chamber 151, a gas introduction tube 154 for introducing a water vapor/hydrogen mixed gas and a purge gas, and an exhaust tube 155 for exhausting these gases are connected. To the other end of the gas introduction tube 154, a gas generator 140 as shown in FIGS. 15 and 16 is connected.

Figure 15:
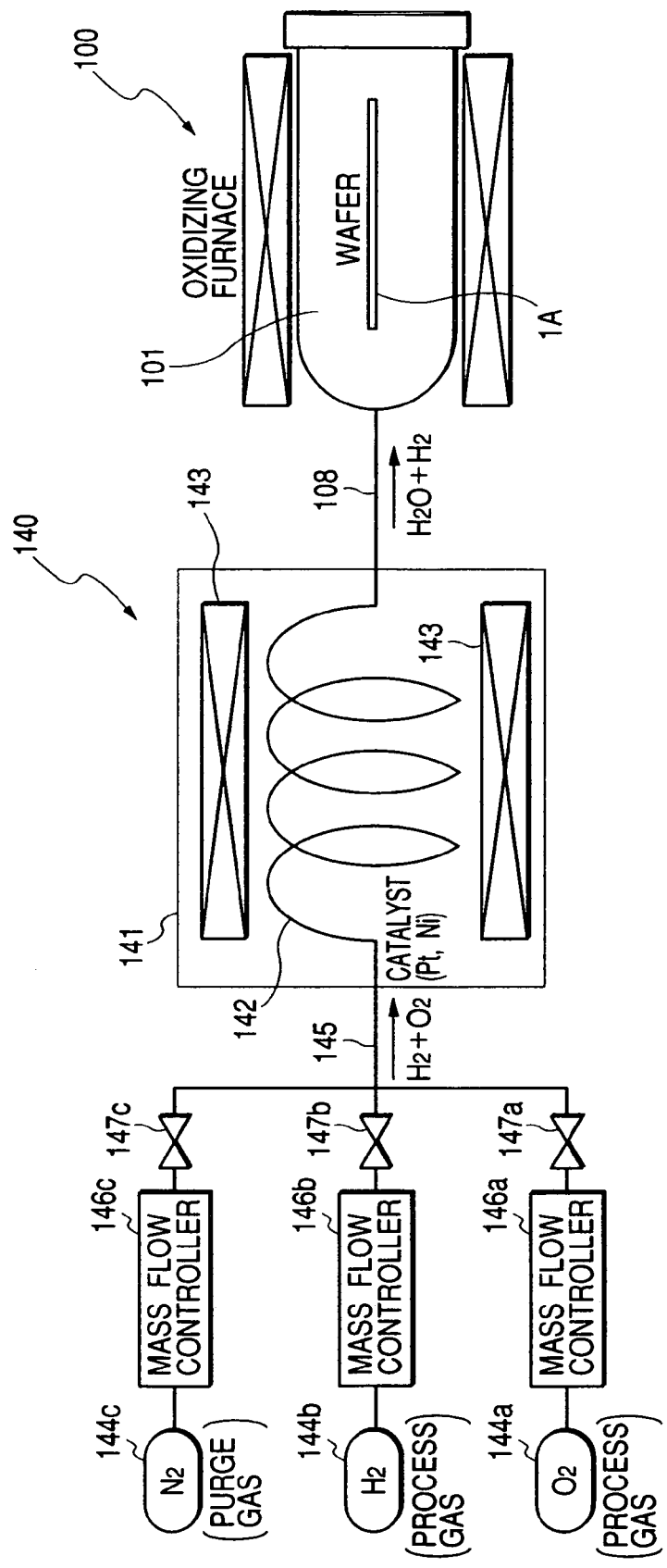
FIG. 15 is a schematic diagram showing a water vapor/hydrogen mixed gas generator of a catalytic system connected to the batch type vertical oxidizing furnace shown in FIG. 14.
Figure 16:
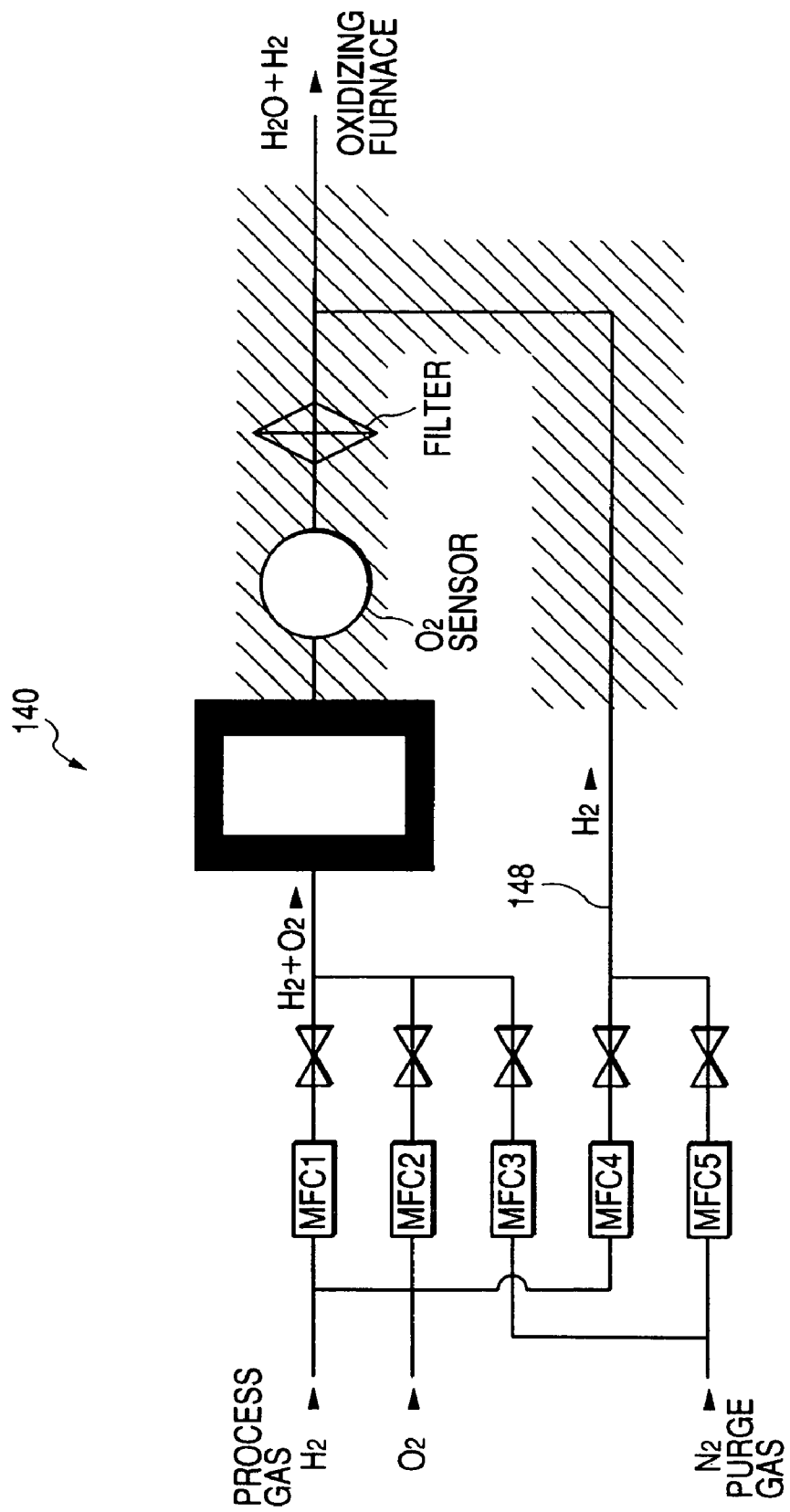
FIG. 16 is a piping system diagram of the water vapor/hydrogen mixed gas generator shown in FIG. 15.

FIG. 15 is a schematic diagram showing a water vapor/hydrogen mixed gas generator of a catalytic system connected to the batch type vertical oxidizing furnace 150. FIG. 16 is a piping system diagram of the gas generator. The gas generator 140 includes a reactor 141 composed of a heat-resisting corrosion-resisting alloy. In the inside thereof, a coil 142 made of a catalyst metal such as Pt (platinum), Ni (nickel), Pd (palladium), or the like, and a heater 143 for heating the coil 142 are mounted. To the reactor 141, a process gas made of hydrogen and oxygen, and a purge gas made of an inert gas such as nitrogen are introduced from gas storage tanks 144$a$, 144$b$, and 144$c$ through a piping 145. Further, between the gas storage tanks 144$a$, 144$b$, and 144$c$, and the piping 145, mass flow controllers 146$a$, 146$b$, and 146$c$ for individually controlling the amounts of their respective gases, and closing valves 147$a$, 147$b$, and 147$c$ for opening and closing their respective gas passages are mounted. As a result, the amount and the component ratio of the gases to be introduced into the reactor 141 are controlled by these with precision.

The process gas (hydrogen and oxygen) introduced into the reactor 141 comes in contact with the coil 142 heated to about 350 to 450° C., and excited. As a result, a hydrogen radical is formed from a hydrogen molecule (H$_2$→2H*), and an oxygen radical is formed from an oxygen molecule (O$_2$→2O*). These two radicals are chemically very active, and hence react rapidly to form water (2H*+O*→H$_2$O). Thus, by introducing a process gas containing hydrogen in an amount in excess of the molar ratio (hydrogen:oxygen=2:1) at which water (water vapor) is formed into the reactor 141, it is possible to generate a water vapor/hydrogen mixed gas. The mixed gas is mixed with hydrogen supplied from a dilution line 148 shown in FIG. 16, and adjusted to a water vapor/hydrogen mixed gas having a desirable moisture concentration. Then, the resulting gas is introduced into the chamber 151 of the vertical oxidizing furnace 150 through the gas introduction tube 154.

The catalytic-system gas generator 140 as described above is capable of controlling the amounts of hydrogen and oxygen which are involved in the formation of water, and the ratio thereof with high precision. This makes it possible to control the concentration of water vapor contained in the water vapor/hydrogen mixed gas to be introduced into the chamber 151 within a wide range from a very low concentration on the order of ppm to a concentration as high as about several hundreds percent, and with high precision. Further, water is formed instantaneously upon the introduction of a process gas into the reactor 141. Therefore, it is possible to obtain a water vapor/hydrogen mixed gas having a desired water vapor concentration in real time. This can also minimize the mixing of foreign matters, which allows a clean water vapor/hydrogen mixed gas to be introduced into the chamber 151. Incidentally, the catalyst metal in the reactor 141 is not limited to the above-described metals so long as it is capable of converting hydrogen and oxygen into their radicals. In addition to the use of the catalyst metal in the coil form, the catalyst metal may also be used in the following manner: it is processed into, for example, a hollow tube or a fine fiber filter, through which a process gas is allowed to pass.

Figure 17:
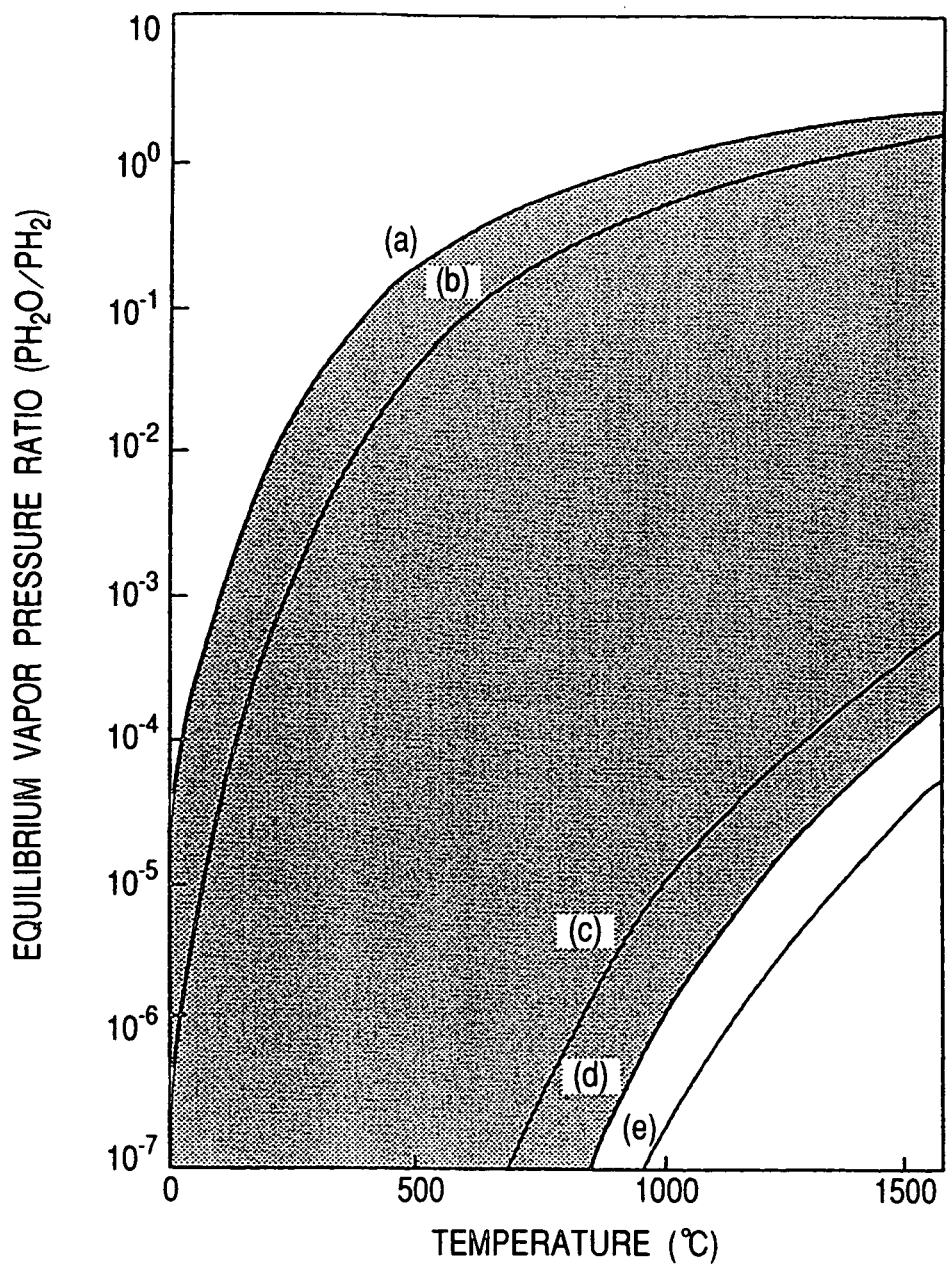
FIG. 17 is a graph showing the temperature dependence of the equilibrium vapor pressure ratio ($P_{H2O}/P_{H2}$) of an oxidation reduction reaction using a water vapor/hydrogen mixed gas.

FIG. 17 is a graph showing the temperature dependence of an equilibrium vapor pressure ratio ($P_{H2O}/P_{H2}$) of the oxidation-reduction reaction using a water vapor/hydrogen mixed gas, in which curves (a) to (e) represent equilibrium vapor pressure ratios of W, Mo, Ta (tantalum), Si, and Ti (titanium), respectively. As is illustrated, by setting the water vapor/hydrogen partial pressure ratio of the water vapor/hydrogen mixed gas to be introduced into the chamber 151 of the vertical oxidizing furnace 150 within a range of the region interposed by the curves (a) and (d), it is possible to selectively oxidize the substrate 1 made of silicon without oxidizing the W film 25 and the $WN_x$ film 24, which constitute the gate electrodes 7A, 7B, and 7C. Furthermore, as illustrated, both the metals (W, Mo, Ta, and Ti) and silicon increase in oxidation rate with an increase in water vapor concentration in the water vapor/hydrogen mixed gas. Therefore, by raising the water vapor concentration in the water vapor/hydrogen mixed gas to be introduced in the chamber 151, it is possible to selectively oxidize silicon by a shorter-time heat treatment. Incidentally, when each metal portion of the gate electrodes 7A, 7B, and 7C is composed of Mo (molybdenum), by setting the water vapor/hydrogen partial pressure ratio within a range of the region interposed by the curves (b) and (d), it is possible to selectively oxidize only silicon without oxidizing the Mo film.

Then, one example of a reoxidation process sequence using the batch type vertical oxidizing furnace 150 will be described by reference to FIG. 18.

First, the quartz boat 153 holding a plurality of wafers 1 is loaded in the chamber 151 filled with a purge gas (nitrogen). The length of time required for the quartz boat 153 to be loaded therein is about 10 minutes. At this step, the purge gas (nitrogen) in the chamber 151 is preheated in advance in order to shorten the heating time of the wafer 1. However, the upper limit of the preheating temperature should be set at less than 500° C. because the oxide 27 formed on each sidewall of the gate electrodes 7A, 7B, and 7C tends to be sublimed at high temperatures.

Then, a hydrogen gas is introduced into the chamber 151 through the gas introduction tube 154 for about, 10 minutes, so that gas replacement in the chamber 151 is performed. As a result, the inside of the chamber 151 is charged with an atmosphere in which the oxide 27 of W is reduced. Then, while continuing the supply of a hydrogen gas into the chamber 151, the wafer 1 is heated up to a temperature of 600° C. or more, for example, 800° C., over about 30 minutes to 40 minutes. In order to introduce only a hydrogen gas into the chamber 151, it is desirable that the supply of oxygen is cut off before the reactor 141, and that only a hydrogen is supplied.

By heating the wafer 1 under the conditions under which the oxide 27 on each sidewall of the gate electrodes 7A, 7B, and 7C is reduced in this manner, most of the oxide 27 is reduced, resulting in W. Therefore, it is possible to keep the amount of the oxide 27 to be sublimed in the chamber 151 at a very low level. This allows the contamination of the substrate 1 in the reoxidation treatment step of the gate insulating film 6 to be kept at a very low level. Therefore, the reliability and the manufacturing yield of the DRAM are improved.

Then, oxygen and excess hydrogen are introduced to the reactor 141 of the gas generator 140, and a water vapor/hydrogen mixed gas wherein water generated from oxygen and hydrogen by the catalytic action is contained in an amount of about 10% in partial pressure ratio is introduced into the chamber 151. Then, the water vapor/hydrogen mixed gas in the chamber 151 is kept at a temperature of 800° C., and at a pressure of ordinary pressure, or in the subatmospheric region which is the reduced pressure region of about 10% to about 50% of atmospheric pressure. Thus, the surface of the wafer 1 is subjected to an oxidation treatment over 25 minutes to 30 minutes. Incidentally, the oxidation treatment may also be carried out in a still more reduced pressure region according to the kind of the oxidizing furnace. However, when the pressure during the oxidation treatment is low, the oxide 27 left on each sidewall of the gate electrodes 7A, 7B, and 7C becomes likely to be sublimed. Therefore, the pressure during the oxidation treatment is desirably set at about 1300 Pa or more at the minimum.

Figure 19:
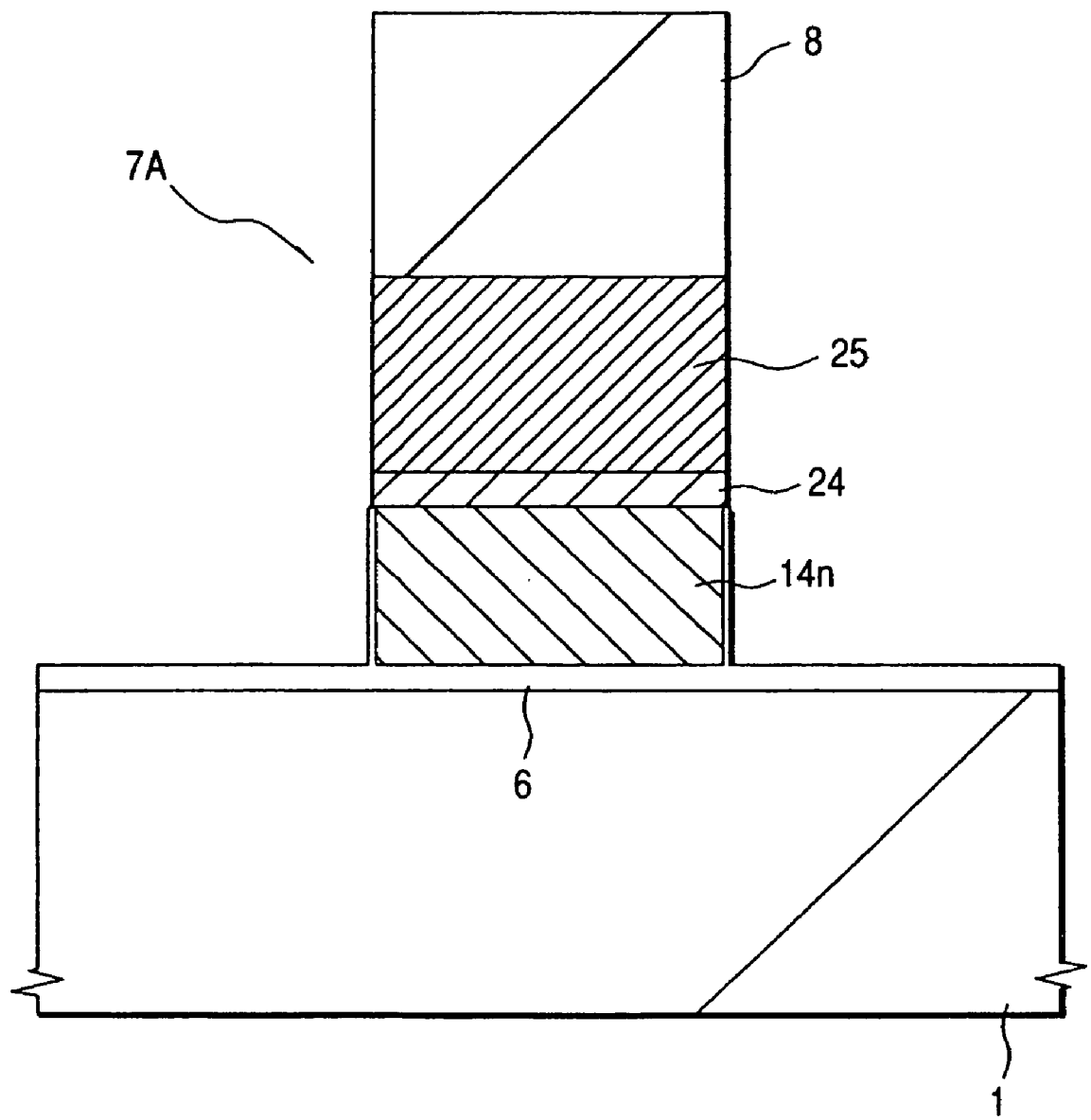
FIG. 19 is an enlarged cross sectional view of the essential part of the semiconductor substrate showing the manufacturing method of the semiconductor integrated circuit device which is the one embodiment of the present invention.
Figure 21:
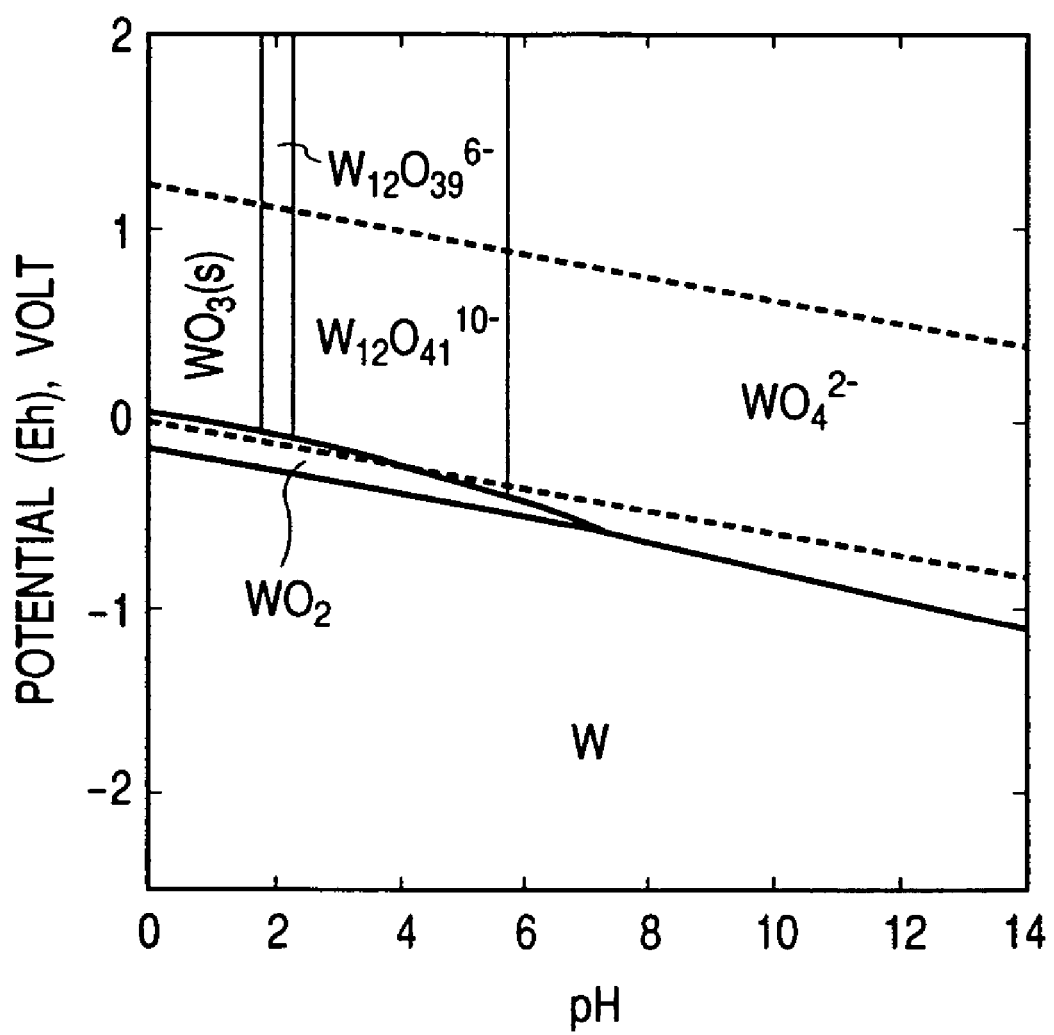
FIG. 21 is a state diagram showing the relationship between the oxidation-reduction potential and the pH of a tungsten-water system.

By performing the foregoing oxidation treatment, as shown in FIG. 19, the substrate 1 in the peripheral portion of the gate electrodes 7A, 7B, and 7C is reoxidized. Accordingly, the thickness of the gate insulating film 6 which has been thinned in the foregoing dry etching step becomes approximately the same as the initial film thickness (6 nm). Further, this oxidation treatment is performed by setting the water vapor/hydrogen partial pressure ratio of the water vapor/hydrogen mixed gas to be introduced into the chamber 151 within a range of the region interposed between the curves (a) and (d) shown in FIG. 17. Therefore, the W film 25 and the $WN_x$ film 24, which constitute the gate electrodes 7A, 7B, and 7C, will not be oxidized.

Then, while supplying only hydrogen into the chamber 151 by cutting off the supply of oxygen before the reactor 141, the wafer 1 is cooled to a temperature of less than 500° C., for example, to 400° C. over about 30 minutes to 40 minutes. Subsequently, the supply of a hydrogen gas is stopped, and a nitrogen gas is introduced into the chamber 151 for about 10 minutes. Thus, gas replacement is performed, and then, the quartz boat 153 is unloaded from the chamber 151. Incidentally, when the temperature for switching the atmosphere in the chamber 151 from the hydrogen gas atmosphere to the nitrogen gas atmosphere is high, the W film 25 on each sidewall of the gate electrodes 7A, 7B, and 7C and the oxide 27 left unreduced may be sublimated. Therefore, it is more desirable that replacement of a hydrogen gas with a nitrogen gas is performed after the temperature of the wafer 1 is decreased to about 300° C. to 200° C. Whereas, needless to say, when the requirement on the time necessary for the oxidation treatment is relatively not strict, the process, in which the temperature of the wafer 1 is decreased to about 100° C., and more preferably 70° C. to room temperature, and then switching to a nitrogen gas atmosphere is performed, is more capable of suppressing the oxidation of the W film 25.

The foregoing reoxidation treatment of the gate insulating film 6 can also be performed using a single wafer processing type oxidizing furnace adopting RTA (rapid thermal annealing). FIG. 20(a) is a schematic diagram showing one example of the single wafer processing type oxidizing furnace for use in the reoxidation treatment. FIG. 20(b) is a cross sectional view taken along line B–B' of FIG. 20(a).

The single wafer processing type oxidizing furnace 100 includes a chamber 101 composed of a multiple-wall quartz tube, and has halogen lamps 107 for heating the wafer 1 thereunder. The chamber 101 accommodates therein a disk-shaped soaking ring 103 for uniformly dispersing the heat supplied from the halogen lamps 107 over the whole surface of the wafer 1, and has a susceptor 104 for horizontally holding the wafer 1 thereon. The soaking ring 103 is made of a heat-resistant material such as quartz or SiC (silicon carbide), and is supported by means of a support arm 105 extending from the wall surface of the chamber 101. A thermocouple 106 for measuring the temperature of the wafer 1 held by the susceptor 104 is disposed in the vicinity of the soaking ring 103.

To a part of the wall surface of the chamber 101, one end of a gas introduction tube 108 for introducing a water vapor/hydrogen mixed gas and a purge gas into the chamber 101 is connected. To the other end of the gas introduction tube 108, the catalytic-system gas generator 140 shown in FIGS. 15 and 16 is connected. In the vicinity of the gas introduction tube 108, a partition 110 having a large number of penetration holes 109 is disposed. The gases introduced into the chamber 101 pass through the penetration holes 109 of this partition 110, and spread uniformly inside the chamber 101. Another part of the wall surface of the chamber 101 is connected with one end of an exhaust tube 111 for exhausting the gases introduced into the chamber 101.

The reoxidation process using the single wafer processing type oxidizing furnace 100 is almost the same as the reoxidation process using the batch type vertical oxidizing furnace 150, except that the wafers 1 are subjected to an oxidation treatment one by one. However, the heating and cooling of the wafer 1 by lamp heating are carried out in a very short time (generally, about several seconds), and hence loading/unloading of the wafer 1 is carried out at room temperature.

A description will be given to one example of the reoxidation process using the single wafer processing type oxidizing furnace 100 as described above. First, the chamber 101 previously charged with a room-temperature purge gas (nitrogen) is opened, and the wafer 1 which has gone through the processings of the gate electrodes 7A, 7B, and 7C is loaded on the susceptor 104. Then, the chamber 101 is closed, and a hydrogen gas is introduced therein. As a result, the inside of the chamber 101 is filled with a hydrogen gas atmosphere. Then, the wafer 1 is heat to a temperature of 600° C. or more, for example, 950° C. over about 5 seconds while keeping the atmosphere.

Then, oxygen and excess hydrogen are introduced into the reactor 141 of the gas generator 140, and a water vapor/hydrogen mixed gas, in which water formed by the catalytic action is contained in an amount of about 10% in partial pressure, is introduced into the chamber 101. Then, the halogen lamps 107 are lit, and the surface of the wafer 1 is subjected to an oxidation treatment over about 3 minutes while keeping the temperature of the water vapor/hydrogen mixed gas in the chamber 101 at 950° C.

Then, the halogen lamps 107 are put off, and the supply of the water vapor/hydrogen mixed gas is stopped, so that the inside of the chamber 101 is filled with a hydrogen atmosphere again. Thereafter, while keeping the atmosphere, the wafer 1 is cooled down to a temperature of less than 500° C., for example, 400° C. over about 10 seconds. Then, the supply of a hydrogen gas is stopped, and a nitrogen gas is introduced into the chamber 101, so that gas replacement is carried out. Thereafter, when the temperature of the inside of the chamber 101 decreases down to about room temperature, the wafer 1 is unloaded. Also in this case, it is more desirable that replacement of a hydrogen gas with a nitrogen gas is carried out after the temperature of the wafer 1 decreases down to about 300° C. to 200° C. Whereas, needless to say, when the requirement on the time necessary for the oxidation treatment is relatively not strict, the process, in which the temperature of the wafer 1 is decreased to about 100° C., and more preferably 70° C. to room temperature, and then, switching to a nitrogen gas atmosphere is performed, is more capable of suppressing the oxidation of the W film 25.

By performing the foregoing reoxidation treatment, it is possible to increase the thickness of the gate insulating film 6 without oxidizing the W film 25 and the $WN_x$ film 24 which constitute the gate electrodes 7A, 7B, and 7C as with the reoxidation treatment using the batch type vertical oxidizing furnace 150. Further, by heating or cooling the wafer 1 under the conditions under which the oxide 27 on each sidewall of the gate electrodes 7A, 7B, and 7C is reduced, it is possible to keep the amount of the oxide 27 to be sublimed in the chamber 151 at a very low level. This allows the contamination of the substrate 1 in the reoxidation treatment step of the gate insulating film 6 to be kept at a very low level. Experiments by the present inventors have shown as follows. Either in the case using the batch type vertical oxidizing furnace 150, or in the case using the single wafer processing type oxidizing furnace 100, by performing the heating up to a desirable temperature, and the subsequent cooling in a reducing hydrogen atmosphere, the amount of the oxide 27 deposited on the surface of the substrate 1 is reduced by about two or three orders of magnitude as compared with the case where cooling or heating is performed in a nitrogen atmosphere.

Incidentally, in the foregoing reoxidation process, heating and cooling of the wafer 1 were carried out in a hydrogen atmosphere. However, it may also be carried out in another gas capable of reducing the oxide of W, such as a gas atmosphere of ammonia ($NH_3$), CO, $N_2O$, or the like. However, when such a gas is used, additional piping system of the oxidizing furnace, and the like are required to be installed. Whereas, as purge gases, other than nitrogen, rare gases such as argon (Ar), helium (He), and xenon (Xe) may also be used.

In the foregoing reoxidation process, the wafer 1 was oxidized by using a water vapor/hydrogen mixed gas. However, other gases capable of oxidizing silicon without oxidizing the W film and the Mo film, for example, oxidizing gases such as oxygen ($O_2$), NO, CO, and $CO_2$, and a mixed gas of such an oxidizing gas and a water vapor/hydrogen mixed gas may also be used. However, CO or $CO_2$ may react with W or Mo during the heat treatment to form a foreign matter such as carbide, and hence it is required to be used with attention paid to this point.

With the foregoing reoxidation process, the oxide contamination on the surface of the substrate 1 is kept at a very low level. Therefore, as compared with the case where heating up to a desirable temperature, and the subsequent cooling are performed in a nitrogen atmosphere, it has been possible to reduce the amount of the oxide 27 deposited on the surface of the substrate 1 by about two or three orders of magnitude.

However, even if heating and cooling of the wafer 1 are carried out in a reducing atmosphere in the reoxidation process, a slight oxide contamination may be deposited during the reoxidation process. In this case, the oxide contamination may be knocked on into the gate insulating film 6 during ion implantation of impurities which is the subsequent step, to deteriorate the electric characteristics of the element.

Under such circumstances, it is effective that, before the process shifts to the subsequent ion implantation step, the surface of the substrate (wafer) 1 is wet washed, thereby to more reduce the level of the oxide contamination. However, the washing in this step is required to be performed under the conditions under which the W film 25 exposed at each sidewall of the gate electrodes 7A, 7B, and 7C will not be oxidized. In particular, the W film 25 exposed to a reducing atmosphere in the reoxidation process becomes more active at the surface than the normal W film, and has been increased in surface area due to the reduction of the oxide 27. Therefore, it is more susceptible to oxidation than the W film 25 prior to the reoxidation process.

Therefore, also in this washing step, use of an acidic solution must be avoided. Namely, it is desirable that washing is performed with a reducing solution, and that the W oxide present on the surface of the W film 25 exposed at each sidewall of the gate electrodes 7A, 7B, and 7C can also be removed simultaneously. In order to implement the conditions, the present inventors have found that it is desirable to use water having the properties in the vicinity of the boundary between the W existence region and the $WO_4$ negative ion existence region in the oxidation-reduction potential and pH phase diagram for a tungsten-water system shown in FIG. 21 (this phase diagram is described in, Emil A. Knee, Chilkunda Raghunath, Srini Raghavan and Joong S. Jeon: Electrochemistry of Chemical Vapor Deposited Tungsten Films with Relevance to Chemical Mechanical Polishing, J. Electrochem. Soc., Vol. 143, No. 12, pp. 4095–4100, December, 1996).

As a result of experiments, by using such water, the W oxide ($WO_x$) present on the surface of the W film dissolves in water as a negative ion of $WO_4$. Thereafter, the surface of the W film has been hardly oxidized. Further, such a desirable effect has been produced in the case where a neutral or weakly alkaline purified water or chemical solution with a pH in the range of 6.5 or more and less than 12, and more preferably with a PH in the range of 7 or more and less than 10.5 was used. In addition, it has also been possible to remove the oxide contamination by about three orders of magnitude only by washing with purified water. Whereas, when washing was performed with a hydrogen-containing water prepared by adding a hydrogen gas in an amount of about 0.2 mg/l to about 2 mg/l to the purified water, it has been possible to enhance the removal ratio of the oxide contamination by about 1.5 times that for the case where purified water was used.

In order to enhance the dissolution efficiency of the oxide contamination, an aqueous solution made weakly alkaline by adding ammonia to the purified water or hydrogen-containing water may also be used. As a result of experiments, by adding 0.2 mM to 120 mM ammonia to water, it is possible to make the pH to 11.5 and the oxidation reduction potential from a 580 mV to 870 mV reduction potential. As a result, it has been possible to dissolve the W oxide formed on the surface in water, and to remove it without oxidizing the W film. This result indicates that it is possible to dissolve and remove the $WO_x$ deposited on the silicon oxide film around the gate electrodes. This enables the reduction of the amount of the W oxide to be sublimed in the subsequent heat treatment step, which allows inhibition of the contamination of a LSI.

The foregoing water or chemical solution to be preferably used substantially does not contain hydrogen peroxide oxidizing the W film with ease. Alternatively, even if it contains a trace amount of hydrogen peroxide, when hydrogen peroxide with a concentration of 30 wt % is taken as 100%, the one not containing the hydrogen peroxide in an amount of 0.3% or more by volume ratio should be used.

Whereas, for washing of the wafer 1 using the water or chemical solution, it is possible to still more enhance the removal efficiency of the contamination by applying mechanical vibration of ultrasonic waves or the like. Further, in order to prevent the removed contamination from being redeposited, it is more desirable that washing is performed not in a still water state but in a flowing water state. When flowing water washing is performed, it is conceivable that the contamination reduction effect is enhanced by the removal effect of deposited $WO_x$ due to the electric double layer occurring at the water-$SiO_2$ interface, and the electrokinetic potential (zeta ($\zeta$) potential) of flowing water.

As described above, the W film exposed to a reducing atmosphere in the reoxidation process is susceptible to oxidation than a normal W film. Therefore, the foregoing washing should be carried out immediately after the reoxidation treatment. In this case, the countermeasure against oxidation due to the contact with air during transfer, such as the direct connection between the oxidizing furnace and the washing apparatus is also effective.

Figure 22:
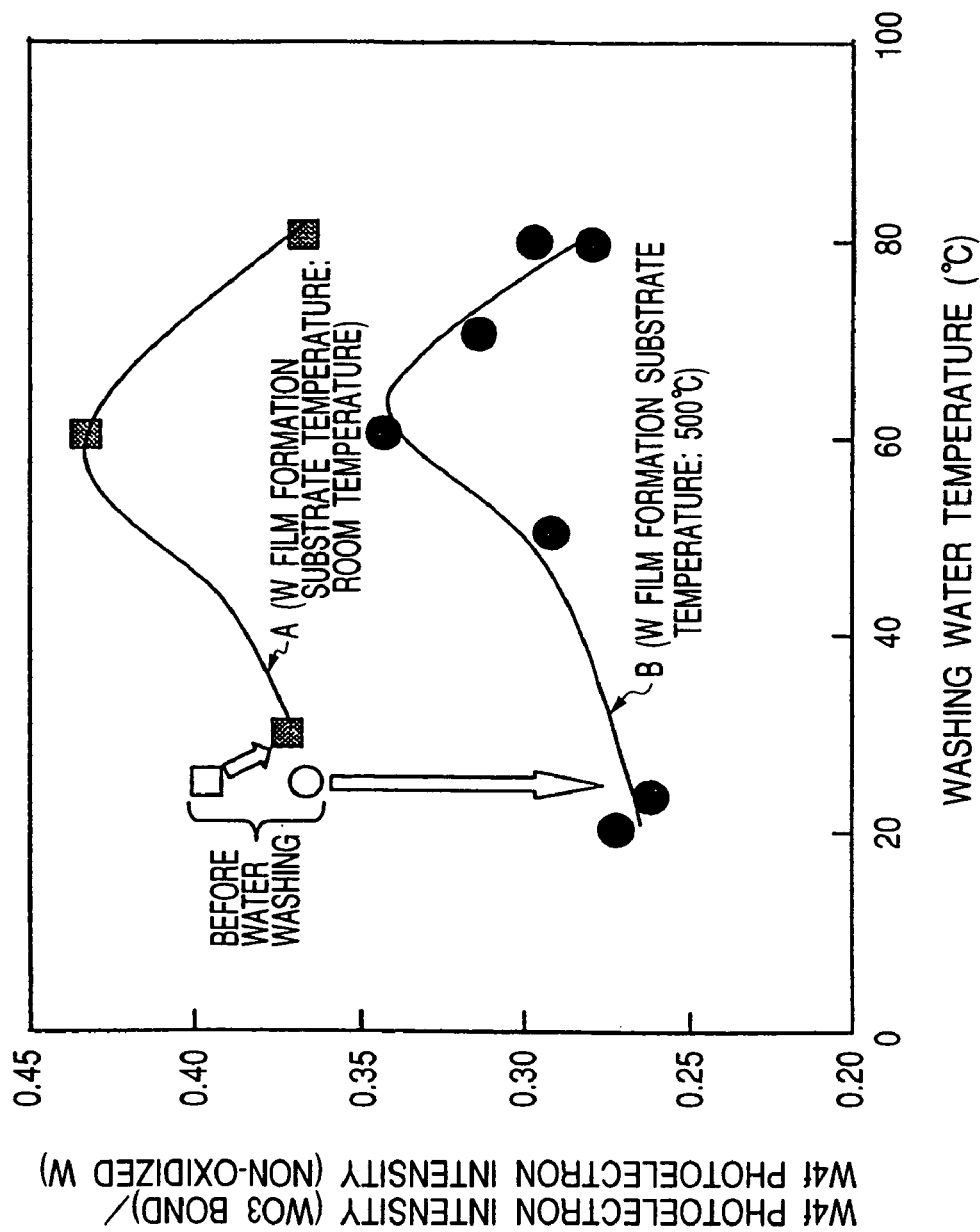
FIG. 22 is a graph showing the results of measurement by means of a total reflection fluorescence X-ray of the removal effect by water washing of a natural oxide film formed on the W film surface.

FIG. 22 is a graph showing the results of the measurement of the removal effect of the natural oxide film formed on the W film surface with water washing by means of a total reflection fluorescence X-ray. As the W films, the one formed at room temperature, and the one formed at 500° C. were used. The W film formed at 500° C. has the following feature; the film has a higher crystallinity than that of the W film formed at room temperature, and hence the natural oxide film is less likely to be formed. Further, in either case, the following results have been obtained. The natural oxide film increases in amount as the water temperature increases from room temperature. When the temperature exceeds about 60° C., the washing power outpaces the increase in amount of the natural oxide film, resulting in an increase in removal effect. This indicates as follows. By setting the temperature of water or the chemical solution during washing at room temperature to less than 50 degrees centigrade, or at 70 degrees centigrade or more, and more preferably at room temperature to less than 45 degrees centigrade, or at 75 degrees centigrade or more, it is possible to remove the natural oxide film with efficiency.

Figure 23:
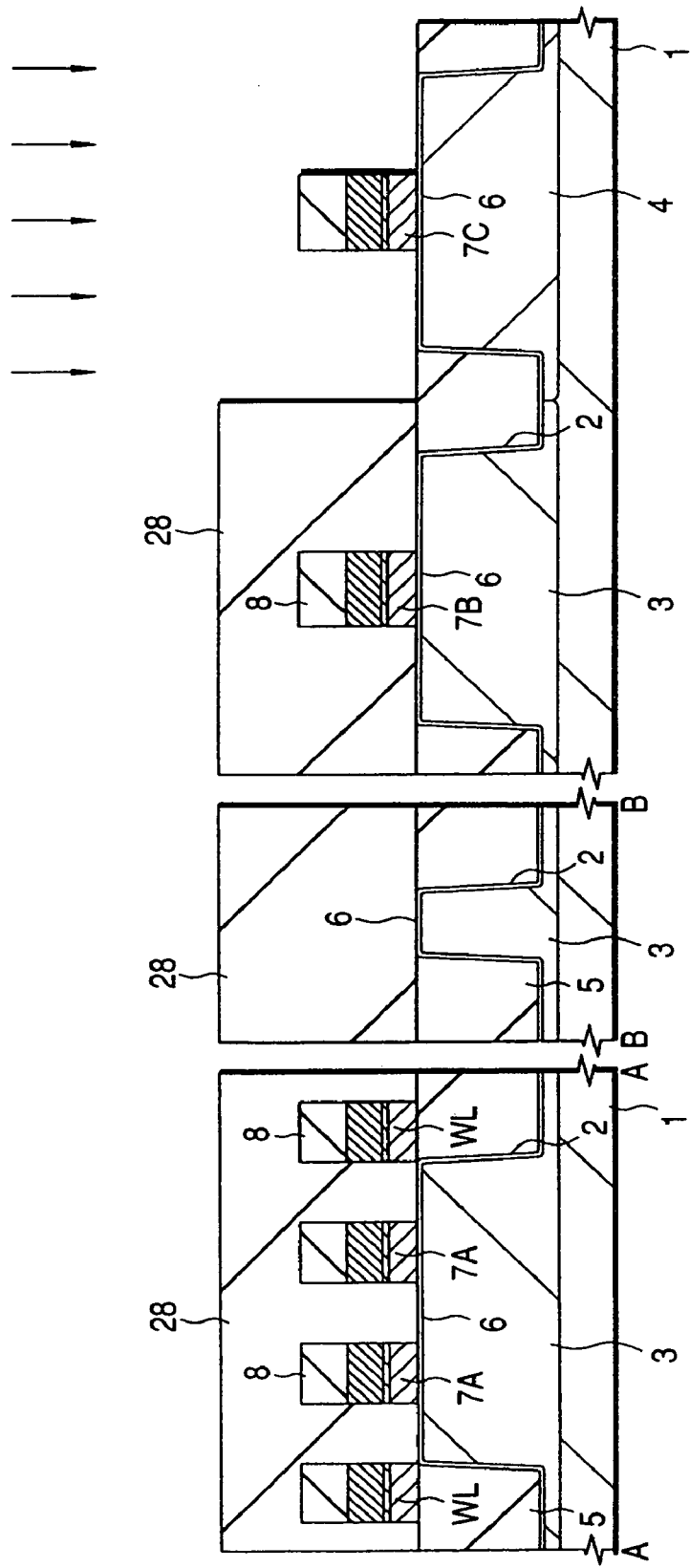
FIG. 23 is an enlarged cross sectional view of the essential parts of the semiconductor substrate showing the manufacturing method of the semiconductor integrated circuit device which is the one embodiment of the present invention.
Figure 24:
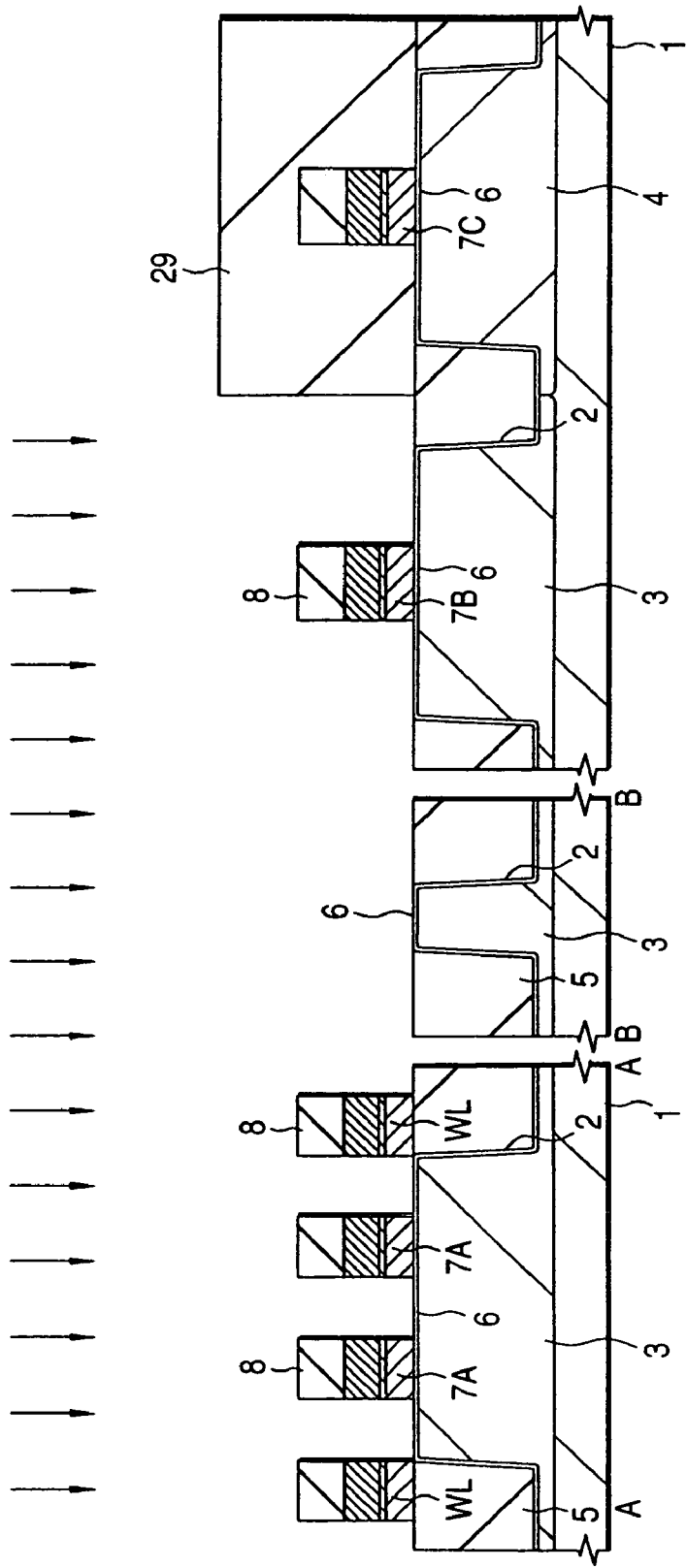
FIG. 24 is a cross sectional view of the essential parts of the semiconductor substrate showing the manufacturing method of the semiconductor integrated circuit device which is the one embodiment of the present invention.

Then, as shown in FIG. 23, the top of each p-type well 3 is covered with a photoresist film 28, and B (boron) is ion implanted into each n-type well 4. Subsequently, the photoresist film 28 is removed by ashing. Then, as shown in FIG. 24, the top of the n-type well 4 is covered with a photoresist film 29, and As (arsenic) is ion implanted into the p-type well 3. Each dose amount of B and As is, for example, $3 \times 10^{13}$ atoms/cm$^2$.

Then, the surface of the substrate 1 is wet washed in order to remove the ashing residue deposited on the surface of the substrate 1 after removing the photoresist film 29 by ashing. Since the wet washing is required to be carried out under the conditions under which the W film (25) exposed at each sidewall of the gate electrodes 7A, 7B, and 7C will not be oxidized, the purified water or chemical solution used in the washing step immediately after the reoxidation process is used.

Figure 25:
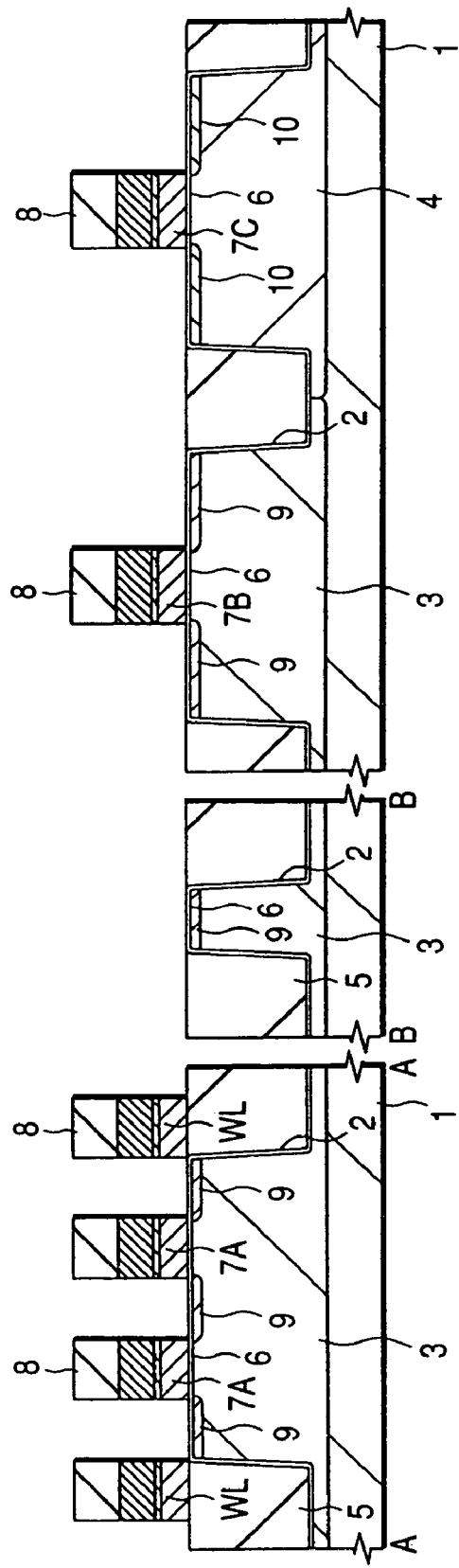
FIG. 25 is a cross sectional view of the essential parts of the semiconductor substrate showing the manufacturing method of the semiconductor integrated circuit device which is the one embodiment of the present invention.

Then, the substrate 1 is heat treated for about 10 seconds by lamp annealing in an about 950° C. nitrogen gas atmosphere to electrically activate the impurities. As a result, as shown in FIG. 25, n$^-$-type semiconductor regions 9 are formed in the p-type wells 3 on opposite sides of each of the gate electrodes 7A and 7B, and p$^-$-type semiconductor regions 10 are formed in the n-type wells 4 on opposite sides of the gate electrode 7C. Thereafter, the surface of the substrate 1 may also be washed for the purpose of removing a very trace amount of the oxide contamination which has been sublimed from each sidewall of the gate electrodes 7A, 7B, and 7C by the heat treatment for activating the impurities, and has been redeposited on the surface of the substrate 1. For the washing, the purified water or chemical solution used in the washing step immediately after the reoxidation process is desirably used.

Figure 26:
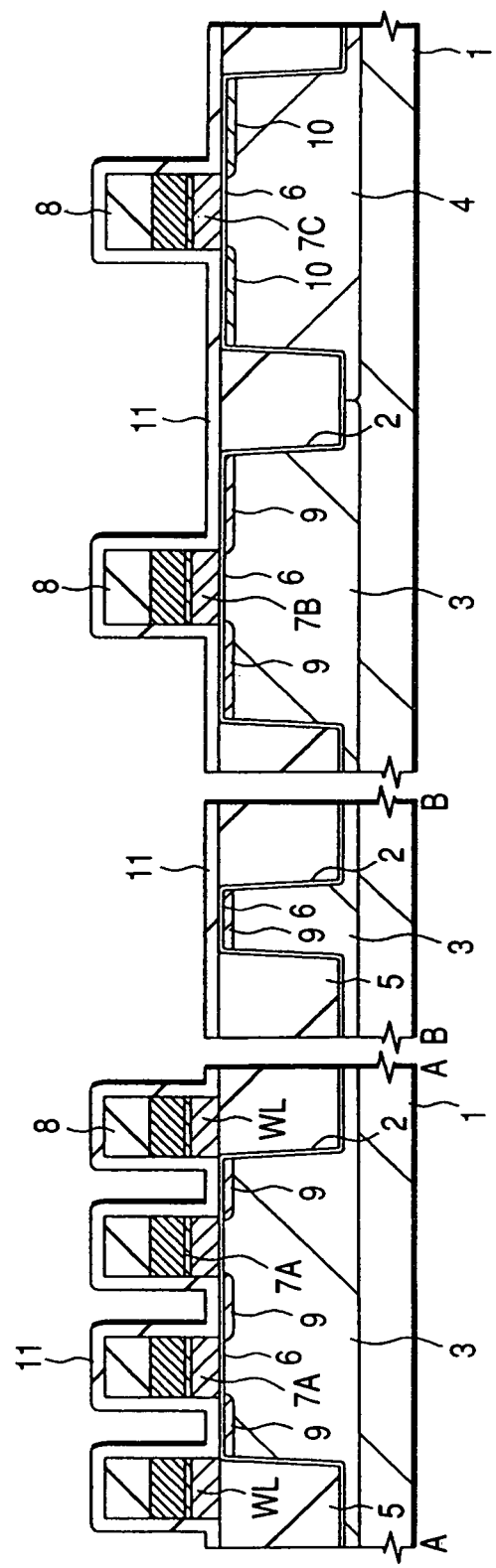
FIG. 26 is a cross sectional view of the essential parts of the semiconductor substrate showing the manufacturing method of the semiconductor integrated circuit device which is the one embodiment of the present invention.

Then, as shown in FIG. 26, a silicon nitride film 11 with a thickness of about 50 nm is deposited on the substrate 1. The silicon nitride film 11 is deposited by a low-pressure CVD process using, for example, monosilane (SiH$_4$) and ammonia (NH$_3$) as a source gas. The film formation flow of the silicon nitride film 11 is, for example, as follows.

First, the wafer 1 is loaded in a chamber of a low-pressure CVD apparatus previously charged with nitrogen. The preheating temperature of the inside of the chamber is set at less than 500° C. Then, only ammonia which is a part of the source gas is supplied into the chamber, so that the inside of the chamber is filled with an atmosphere whereby the oxide of W is reduced. Then, while continuing the supply of ammonia into the chamber, the wafer 1 is heated up to a temperature of 600° C. or more, for example, 730° C. to 780° C. Then, ammonia and monosilane are supplied into the chamber, and these gases are allowed to react with each other, thereby to deposit the silicon nitride film 11. The film formation time of the silicon nitride film 11 is about 10 minutes. Then, the supply of monosilane is stopped, and while continuing the supply of only ammonia, the wafer 1 is cooled down to less than 500° C., for example, 400° C. Then, the atmosphere in the chamber is replaced with nitrogen, and the wafer is unloaded. Incidentally, when the temperature for switching the atmosphere in the chamber from the ammonia gas atmosphere to the nitrogen gas atmosphere is high, the W film 25 on each sidewall of the gate electrodes 7A, 7B, and 7C and the oxide 27 left unreduced may be sublimed. Therefore, it is more desirable that replacement of the ammonia gas with a nitrogen gas is performed after the temperature of the wafer 1 is decreased to about 300° C. to 200° C. Whereas, needless to say, when the requirement on the time necessary for the deposition of the silicon nitride film 11 is relatively not strict, the process, in which the temperature of the wafer 1 is decreased to about 100° C., and more preferably 70° C. to room temperature, and then switching to a nitrogen gas atmosphere is performed, is more capable of suppressing the oxidation of the W film 25.

By depositing the silicon nitride film 11 in the foregoing manner, it is possible to deposit the silicon nitride film 11 in a high-temperature atmosphere without oxidizing the W film 25 and the WN$_x$ film 24 which constitute the gate electrodes 7A, 7B, and 7C. Further, the wafer 1 is, heated under the conditions under which the oxide 27 on each sidewall of the gate electrodes 7A, 7B, and 7C is reduced, and hence it is possible to keep the amount of the oxide 27 to be sublimed in the chamber at a very low level. This allows the contamination of the substrate 1 in the film formation step of the silicon nitride film 11 at a very low level.

Incidentally, in the foregoing deposition process of the silicon nitride film 11, the wafer 1 was heated and cooled in an ammonia atmosphere. However, the wafer 1 may also be heated and cooled in another gas capable of reducing the oxide of W, for example, in a gas atmosphere of CO, N$_2$O, or the like. However, when such a gas is used, additional piping system of the CVD apparatus, and the like are required to be installed. Whereas, as purge gases, rare gases such as argon (Ar), helium (He), and xenon (Xe) may also be used. Further, a mixed gas of dichlorosilane (SiH$_2$Cl$_2$) and ammonia, or the like may also be used as a source gas.

In accordance with the foregoing process, it was possible to reduce the W oxide contamination concentration of the surface of the substrate 1 down to $1 \times 10^{10}$ atoms/cm$^2$ or less which is the detection limit level. As a result, the refresh time of the DRAM was improved from 50 ms prior to countermeasure implementation, to 200 ms or more.

This silicon nitride film 11 can also be deposited by a plasma CVD process in place of the low-pressure CVD process. The plasma CVD process has an advantage in that it can form a film at a lower temperature (400° C. to 500° C.) than with the low-pressure CVD process. Therefore, it has an advantage in that the oxide of W is difficult to form. However, it is inferior in terms of denseness of the film to the low-pressure CVD process. Also in this case, by performing heating and cooling in the atmosphere whereby the oxide of W is reduced, it is possible to keep the contamination of the substrate 1 in the film formation step of the silicon nitride film 11 at a very low level. Whereas, when the silicon nitride film is deposited by a plasma CVD process, the oxide formed on the surface of the W film 25 is removed in a step prior thereto. Therefore, it is effective that film formation is performed after performing plasma processing in the reducing atmosphere containing ammonia and hydrogen.

Figure 27:
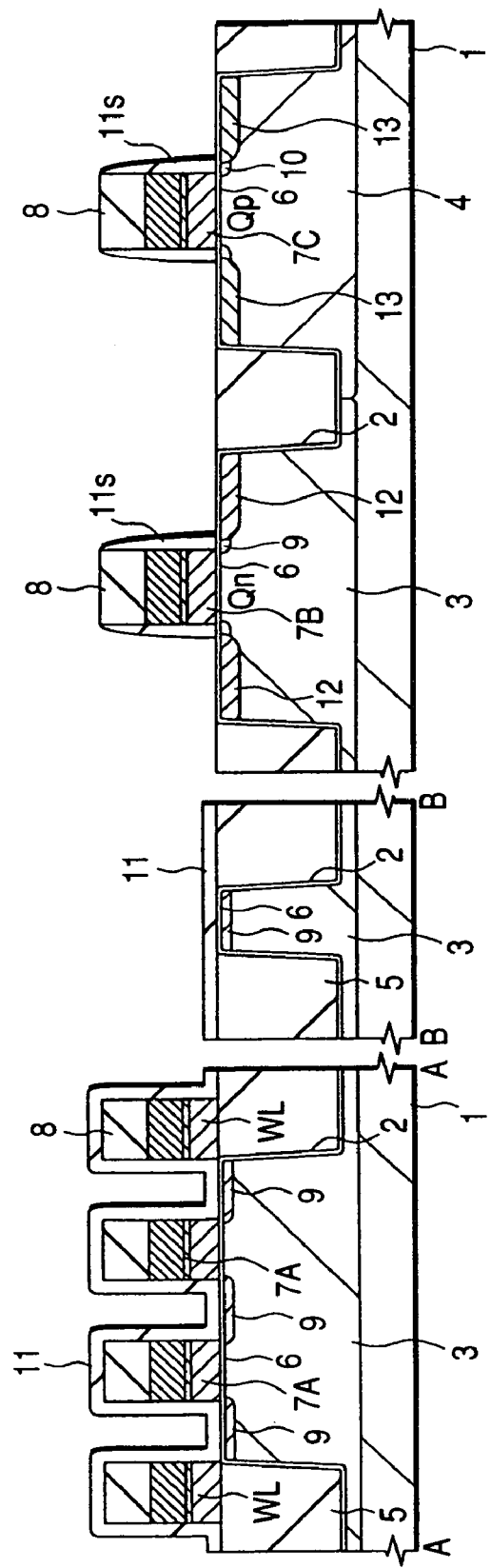
FIG. 27 is a cross sectional view of the essential parts of the semiconductor substrate showing the manufacturing method of the semiconductor integrated circuit device which is the one embodiment of the present invention.

Below, the process after the deposition of the silicon nitride film 11 will be briefly described. First, as shown in FIG. 27, the top of the substrate 1 of the memory array is covered with a photoresist film (not shown), and the silicon nitride film 11 of the peripheral circuit portion is anisotropically etched, thereby to form sidewall spacers 11c on the sidewalls of the gate electrodes 7B and 7C of the peripheral circuit portion.

Then, by ion implanting As or P into each p-type well 3 of the peripheral circuit portion, n$^+$-type semiconductor regions (source and drain) 12 with a high impurity concentration are formed. Whereas, by ion implanting B into each n-type well 4, p$^+$-type semiconductor regions (source and drain) with a high impurity concentration are formed. In accordance with the steps up to this point, the n-channel type MISFET Qn and the p-channel type MISFET Qp of the peripheral circuit portion are completed.

Figure 28:
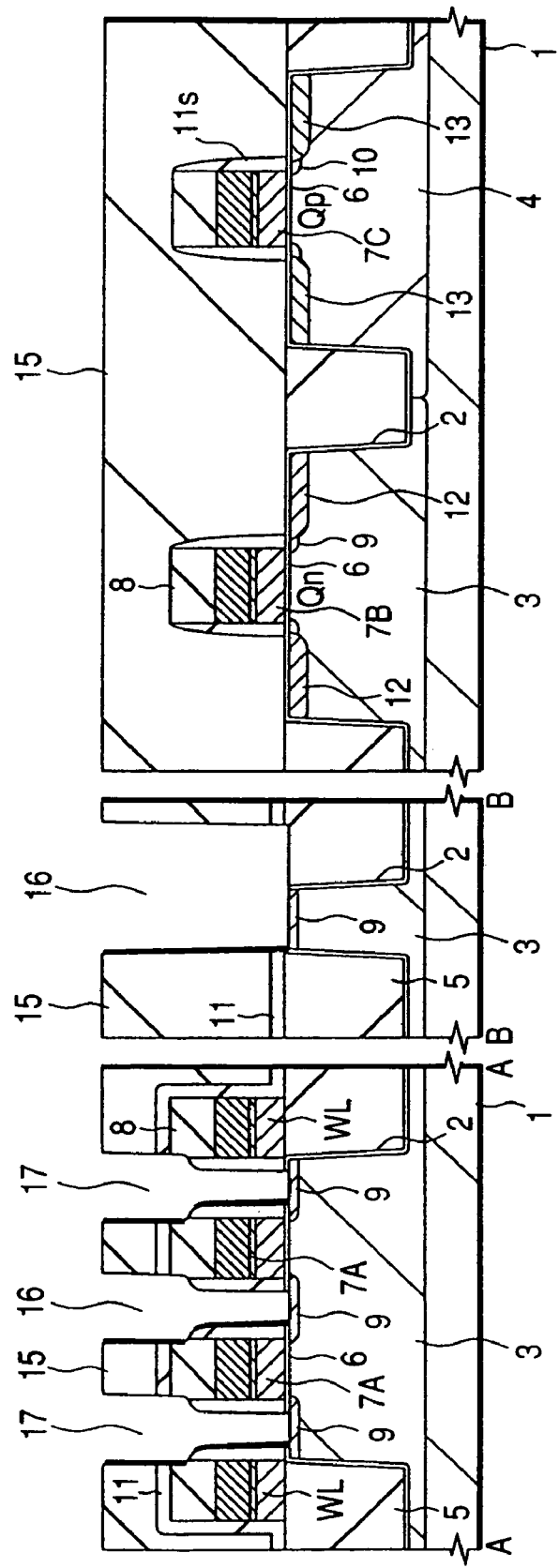
FIG. 28 is a cross sectional view of the essential parts of the semiconductor substrate showing the manufacturing method of the semiconductor integrated circuit device which is the one embodiment of the present invention.

Then, as shown in FIG. 28, the interlayer insulating film 15 composed of a spin on glass film and a two-layered silicon oxide film is formed on the gate electrodes 7A to 7C. Then, the silicon nitride film 11 on the n-type semiconductor regions 9 is removed by dry etching using a photoresist film (not shown) as a mask. As a result, the surfaces of the n⁻-type semiconductor regions 9 are exposed, thereby to form the contact holes 16 and 17. The etching of the silicon nitride film 11 is performed under such conditions that the etching rate of the silicon nitride film 11 relative to that for the silicon oxide film 5 embedded in the element isolation trench 2 becomes large. This prevent the element isolation trench 5 from being cut off deep. Further, the etching is performed under such conditions that the silicon nitride film 11 is anisotropically etched, so that the silicon nitride film 11 is left on the sidewall of each gate electrode 7A (word line WL). As a result, the contact holes 16 and 17 each having a minute diameter are formed in a self-aligned manner with respect to the gate electrodes 7A (word lines WL).

Figure 29:
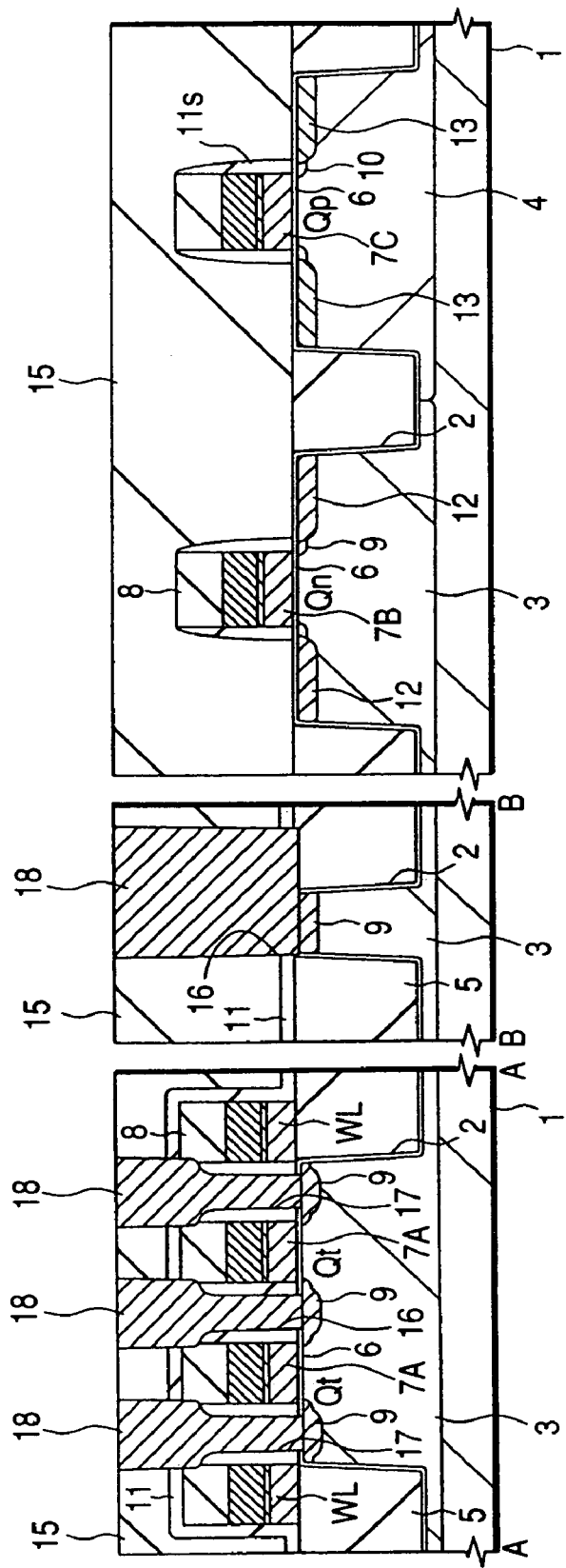
FIG. 29 is a cross sectional view of the essential parts of the semiconductor substrate showing the manufacturing method of the semiconductor integrated circuit device which is the one embodiment of the present invention.

Then, as shown in FIG. 29, the plugs 18 are formed inside the contact holes 16 and 17. The plugs 18 are formed in the following manner. A P-doped polysilicon film is deposited inside the contact holes 16 and 17, and on the interlayer insulating film 15 by a CVD process. Subsequently, unnecessary polysilicon film on the interlayer insulating film 15 is removed by dry etching.

Then, the substrate 1 is heat treated in a nitrogen gas atmosphere, so that the P in the polysilicon film constituting the plugs 18 is diffused in the n⁻-type semiconductor regions 9, thereby to form low-resistance n-type semiconductor regions (source and drain). In accordance with the steps up to this point, memory cell selecting MISFETs Qt are formed in the memory array.

Figure 30:
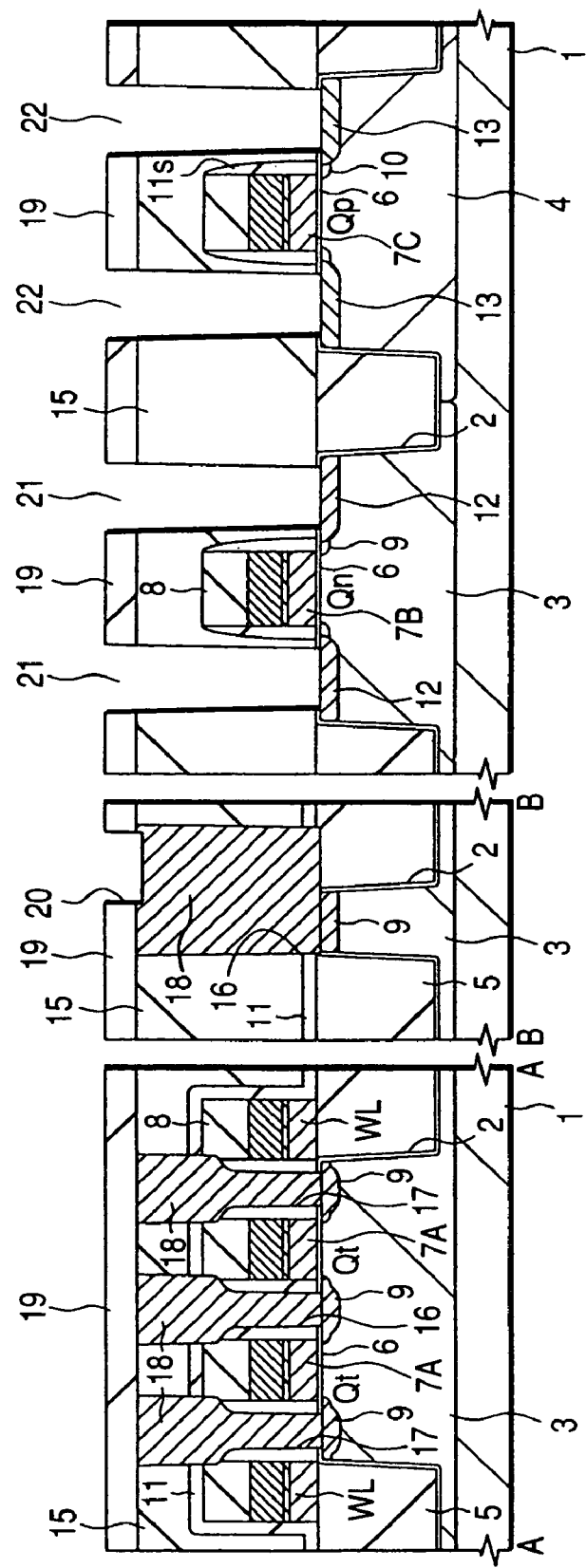
FIG. 30 is a cross sectional view of the essential parts of the semiconductor substrate showing the manufacturing method of the semiconductor integrated circuit device which is the one embodiment of the present invention.
Figure 31:
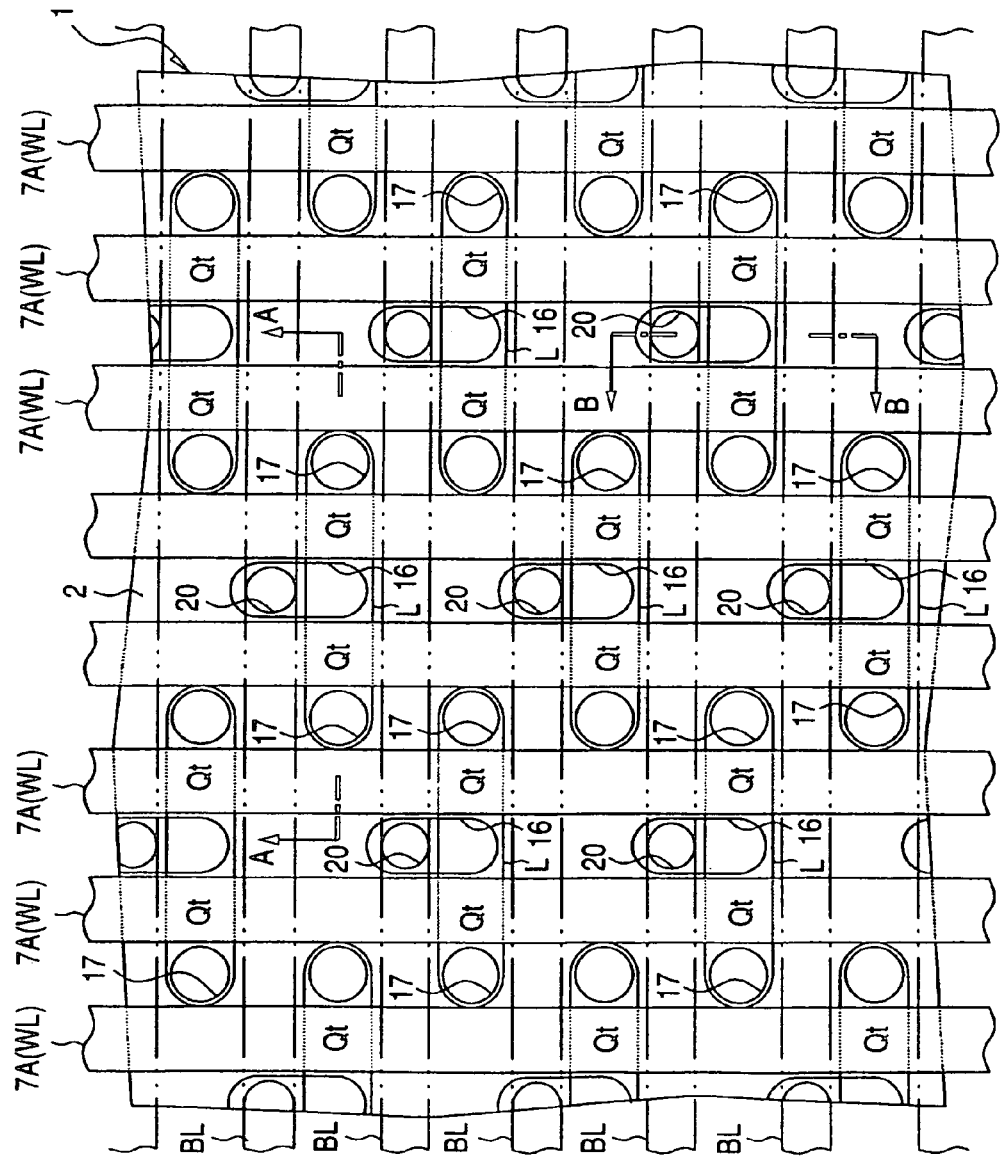
FIG. 31 is a plan view of the essential part of the semiconductor substrate showing the manufacturing method of the semiconductor integrated circuit device which is the one embodiment of the present invention.

Then, as shown in FIGS. 30 and 31, the silicon oxide film 19 is deposited on the interlayer insulating film 15 by a CVD process. Then, by dry etching using a photoresist film (not shown) as a mask, the silicon oxide film 19 and the underlying interlayer insulating film 15 of the peripheral circuit portion are dry etched, thereby to form the contact holes 21 on the source and drain (n⁺-type semiconductor regions 12) of the n-channel type MISFET Qn, and to form the contact holes 22 on the source and drain (p⁺-type semiconductor regions 13) of the p-channel type MISFET Qp. Whereas, simultaneously with this step, the silicon oxide film 19 of the memory array is etched, thereby to form the through hole 20 on the contact hole 16.

Figure 32:
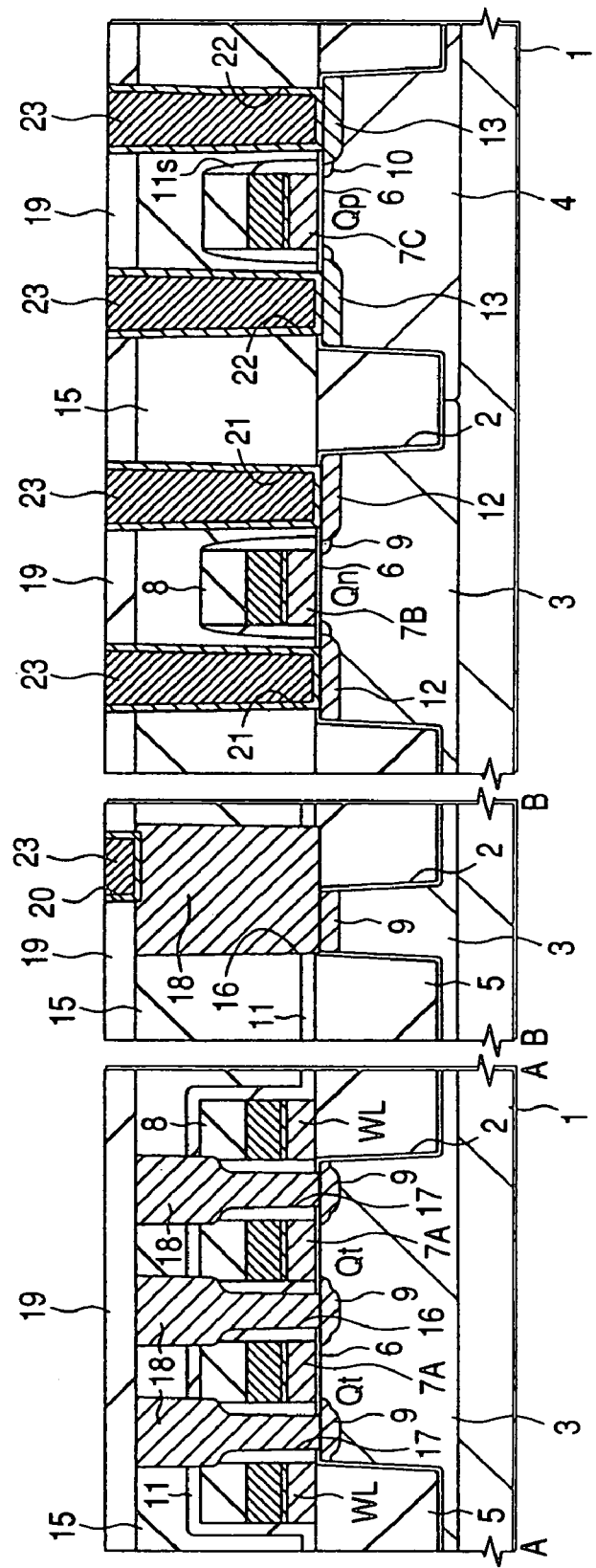
FIG. 32 is a cross sectional view of the essential parts of the semiconductor substrate showing the manufacturing method of the semiconductor integrated circuit device which is the one embodiment of the present invention.

Then, as shown in FIG. 32, the plugs 23 are formed inside the contact holes 21 and 22 formed in the peripheral circuit portion and the through hole 20 formed in the memory array. The plugs 23 are formed in the following manner. For example, a TiN film and a W film are deposited on the silicon oxide film 19 including the inside of the contact holes 21 and 22, and the through holes 20 by a sputtering process and a CVD process. Then, the unnecessary W film and TiN film on the silicon oxide film 19 are removed by a chemical mechanical polishing process.

Figure 33:
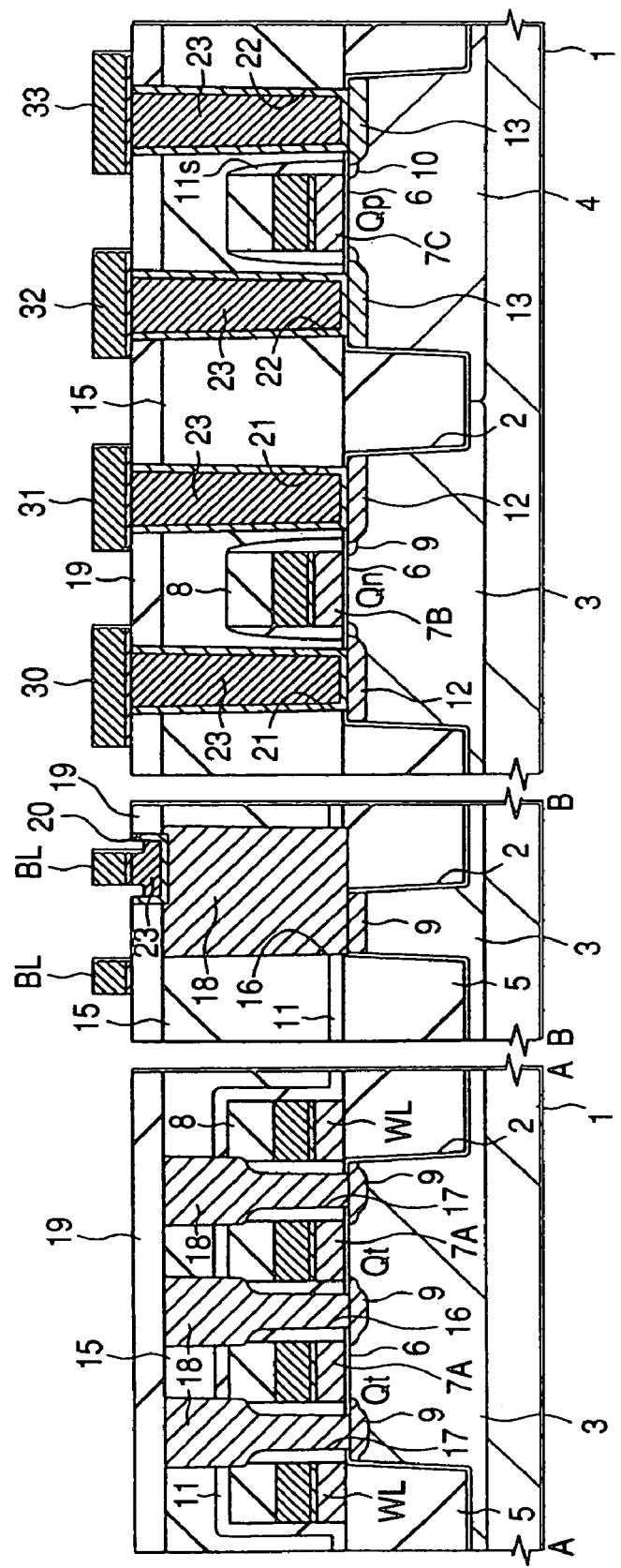
FIG. 33 is a cross sectional view of the essential parts of the semiconductor substrate showing the manufacturing method of the semiconductor integrated circuit device which is the one embodiment of the present invention.

Then, as shown in FIG. 33, the bit lines BL are formed on the silicon oxide film 19 of the memory array, and the wirings 30 to 33 are formed on the silicon oxide film 19 of the peripheral circuit portion. The bit lines BL and the wirings 30 to 33 are formed in the following manner. For example, a W film and a WN$_x$ film are deposited on the silicon oxide film 19 by a sputtering process. Then, these films are patterned by dry etching using a photoresist film as a mask.

Figure 34:
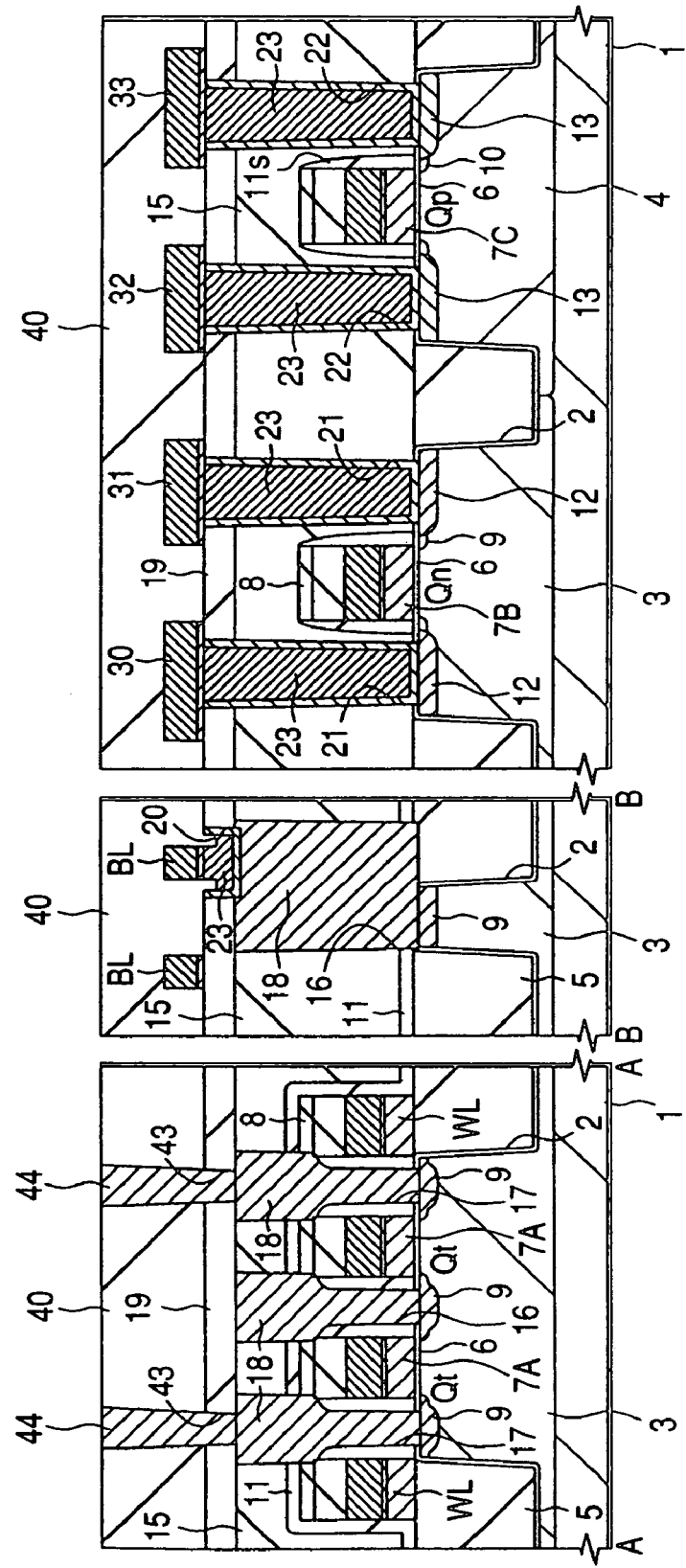
FIG. 34 is a cross sectional view of the essential parts of the semiconductor substrate showing the manufacturing method of the semiconductor integrated circuit device which is the one embodiment of the present invention.

Then, as shown in FIG. 34, the interlayer insulating film 40 composed of a spin on glass film and a two-layered silicon oxide film is formed on the bit lines BL and the wirings 30 to 33. Subsequently, the interlayer insulating film 40 and the underlying silicon oxide film 19 are dry etched to form the through holes 43 on the contact holes 17. Then, the plugs 44 composed of a polysilicon film are formed inside their respective through holes 43. The plugs 44 are formed in the following manner. A P-doped polysilicon film is deposited inside the through holes 43 and on the interlayer insulating film 40 by a CVD process. Subsequently, the unnecessary polysilicon film on the interlayer insulating film 40 is removed by dry etching.

Figure 35:
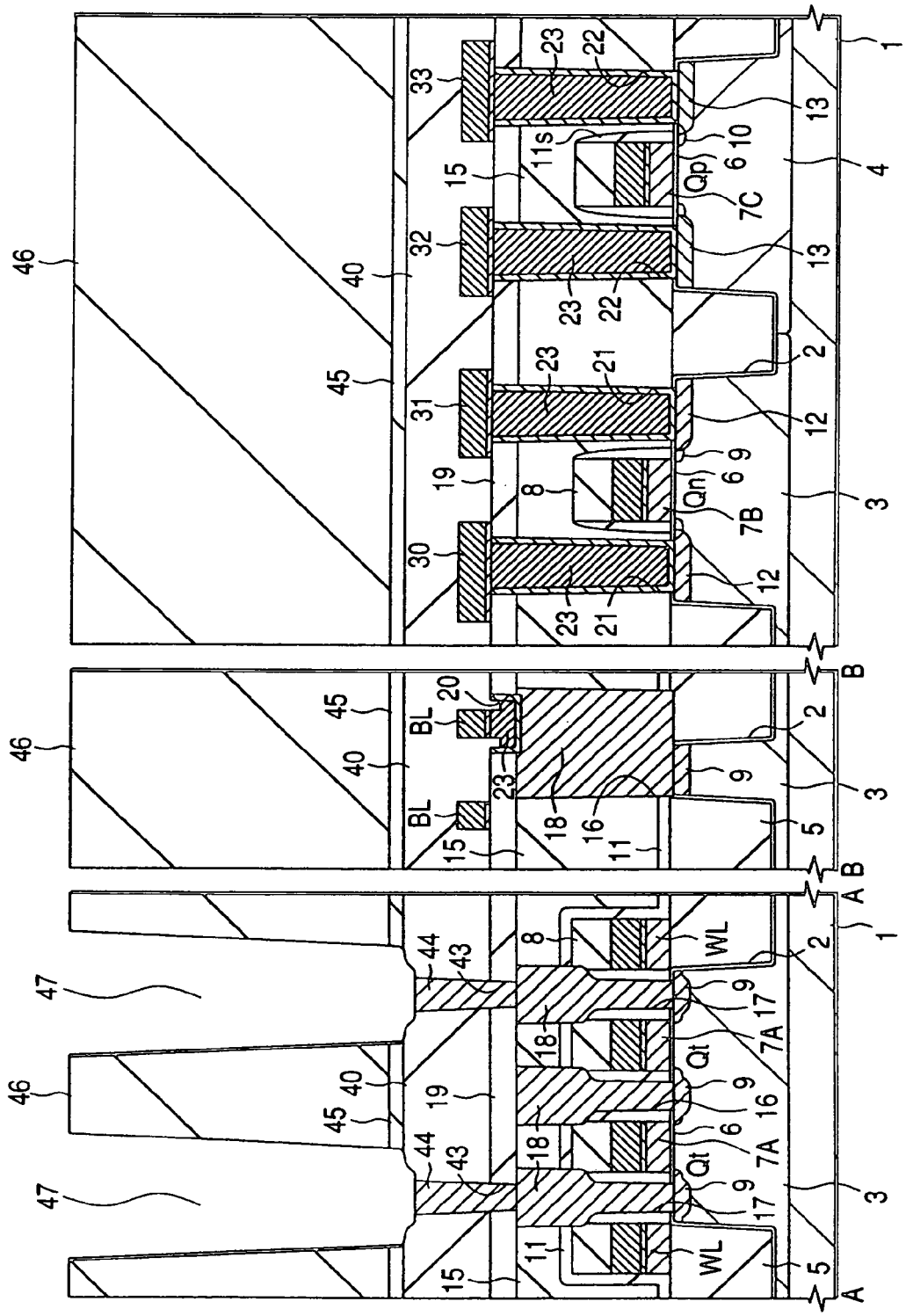
FIG. 35 is a cross sectional view of the essential parts of the semiconductor substrate showing the manufacturing method of the semiconductor integrated circuit device which is the one embodiment of the present invention.

Then, as shown in FIG. 35, the silicon nitride film 45 is deposited on the interlayer insulating film 40 by a CVD process. Subsequently, the silicon oxide film 46 is deposited on the silicon nitride film 45 by a CVD process. Then, the silicon oxide film 46 in the memory array is dry etched using a photoresist film as a mask. Subsequently, the underlying silicon nitride film 45 is dry etched to form the grooves 47 on their respective through holes 44.

Figure 36:
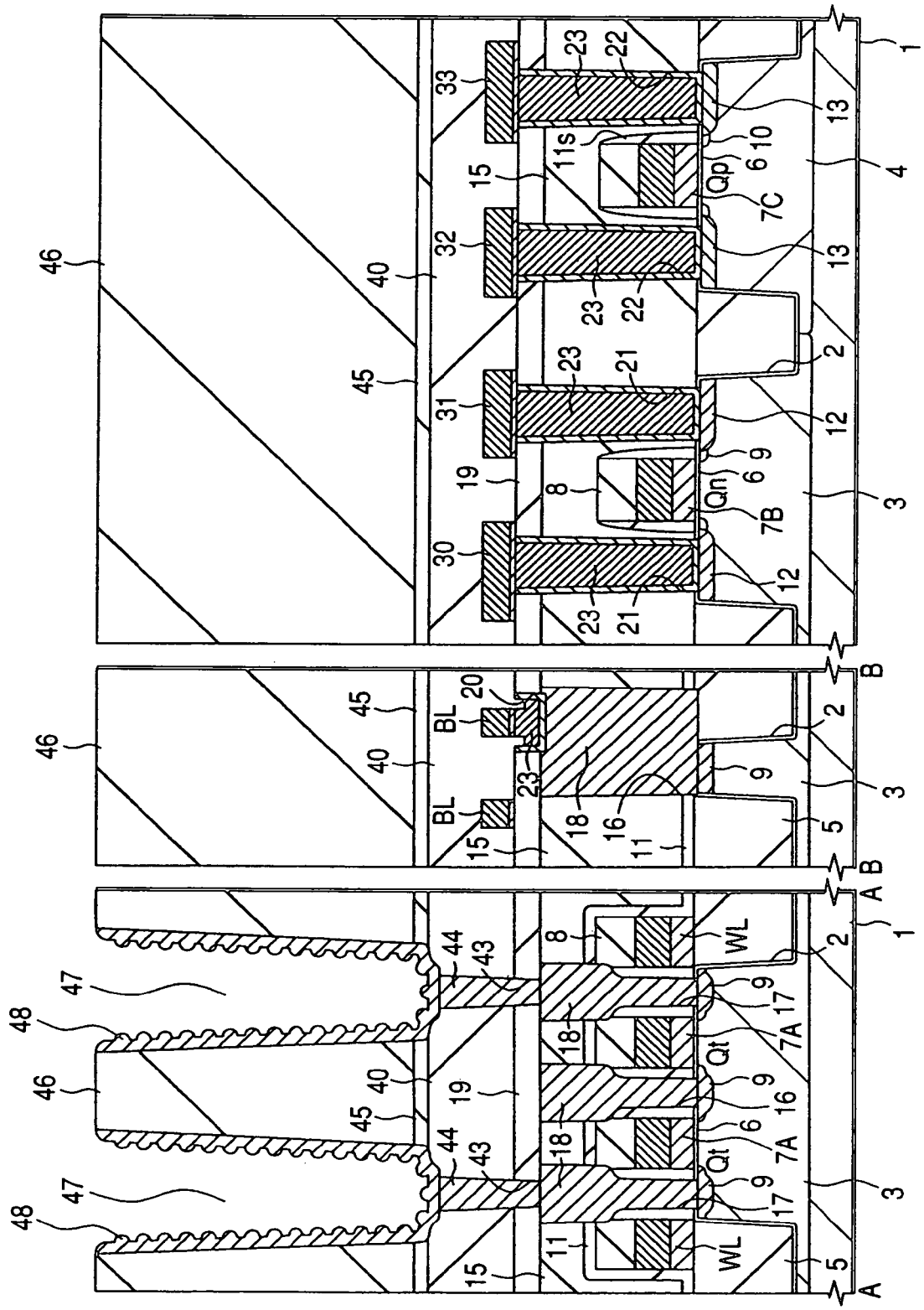
FIG. 36 is a cross sectional view of the essential parts of the semiconductor substrate showing the manufacturing method of the semiconductor integrated circuit device which is the one embodiment of the present invention.

Then, as shown in FIG. 36, the lower electrode 48 of each information storing capacitive element C, to be composed of a polysilicon film, is formed on the inner wall of each groove 47. The lower electrodes 48 are formed in the following manner. First, a P (phosphorus)-doped amorphous silicon film (not shown) is deposited inside the grooves 47 and on the silicon oxide film 46 by a CVD process. Thereafter, the unnecessary amorphous silicon film on the silicon oxide film 46 is removed by dry etching. Then, the surface of the amorphous silicon film left inside each groove 47 is wet washed with a hydrofluoric acid-based washing solution. Thereafter, monosilane (SiH$_4$) is supplied to the surface of the amorphous silicon film in a reduced pressure atmosphere. Subsequently, the substrate 1 is heat treated, so that the amorphous silicon film is polycrystallized, and silicon particles are grown on the surface. As a result, the lower electrodes 48 each composed of a surface-roughened polysilicon film are formed. The surface-roughened polysilicon film has a large surface area, which allows an increase in storable charge amount of each downsized information storing capacitive element C.

Figure 37:
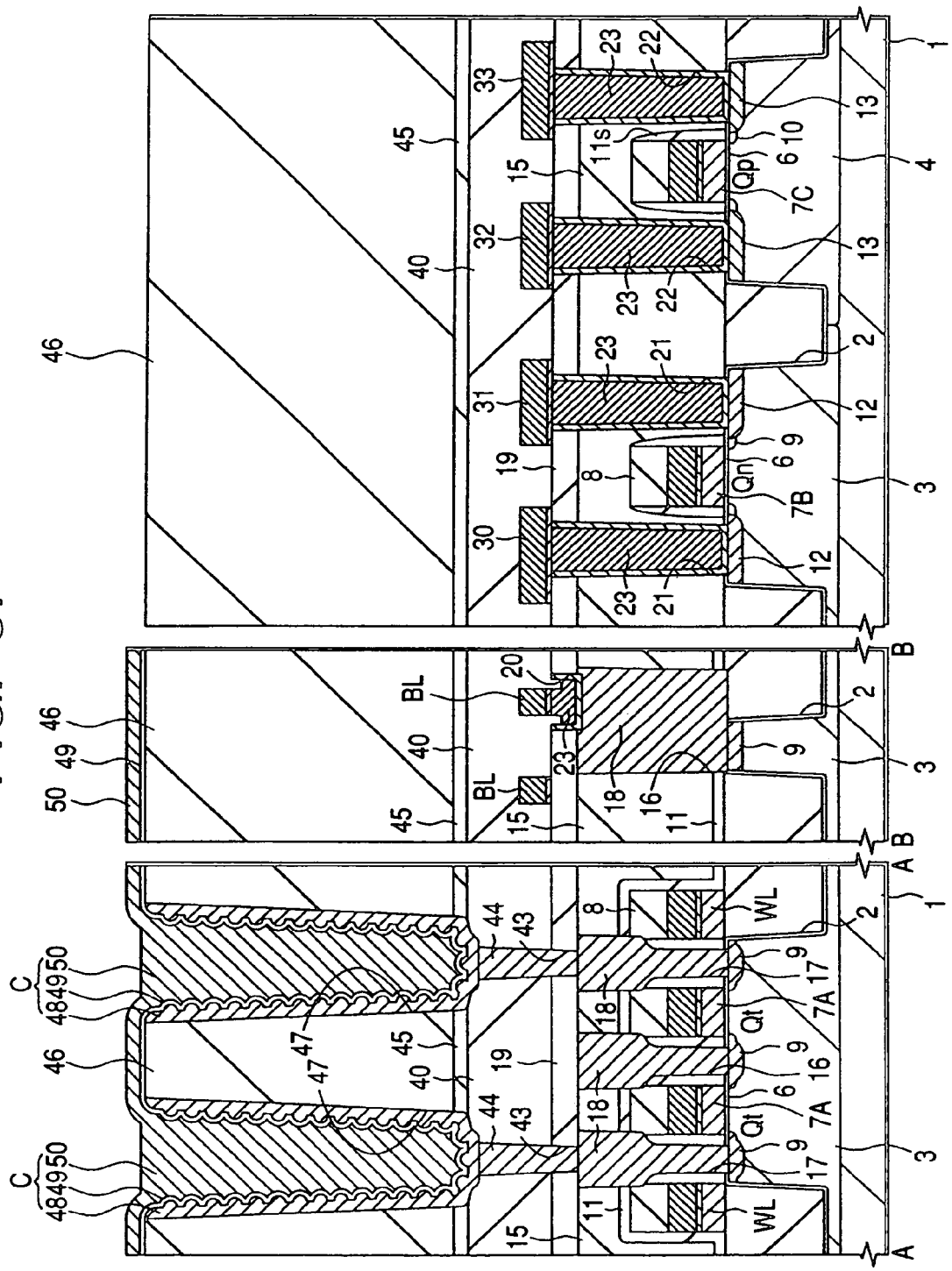
FIG. 37 is a cross sectional view of the essential parts of the semiconductor substrate showing the manufacturing method of the semiconductor integrated circuit device which is the one embodiment of the present invention.

Then, as shown in FIG. 37, on the surfaces of the lower electrodes 48 formed inside their respective grooves 47 and on the surface of the silicon oxide film 46 outside the grooves 47, a Ta$_2$O$_5$ (tantalum oxide) film serving as the capacity insulating film 49 of the information storing capacitive element C is deposited by a CVD process. Subsequently, the substrate 1 is heat treated in an oxygen atmosphere, thereby to modify and crystallize the Ta$_2$O$_5$ film. Subsequently, a TiN film serving as the upper electrode 50 of each information storing capacitive element C is deposited on the Ta$_2$O$_5$ film, and the Ta$_2$O$_5$ film and the TiN film in the peripheral circuit portion are removed by etching. This results in the formation of the information storing capacitive elements C each composed of the upper electrode 50 composed of a TiN film, the capacity insulating film 49 composed of a Ta$_2$O$_5$ film, and the lower electrode 48 composed of a polysilicon film. Further, the steps up to this point result in the completion of the memory cells of a DRAM, each composed of the memory cell selecting MISFET Qt, and the information storing capacitive element C connected in series thereto.

Thereafter, the silicon oxide film 50 is deposited on the information storing capacitive elements C by a CVD process. Further, an about two-layered Al wiring not shown is formed thereon, thereby to complete the DRAM of this embodiment shown in FIGS. 2 and 3 described above.

(Embodiment 2)

This embodiment relates to a logic merged DRAM, to which the present invention has been applied. One example of the manufacturing method thereof will be described step by step by reference to FIGS. 38 to 45. Incidentally, the left-hand side portion of each cross sectional diagram showing the manufacturing method shows a part of the memory array of the DRAM, and the right-hand side portion thereof shows a part of a logic portion.

Figure 38:
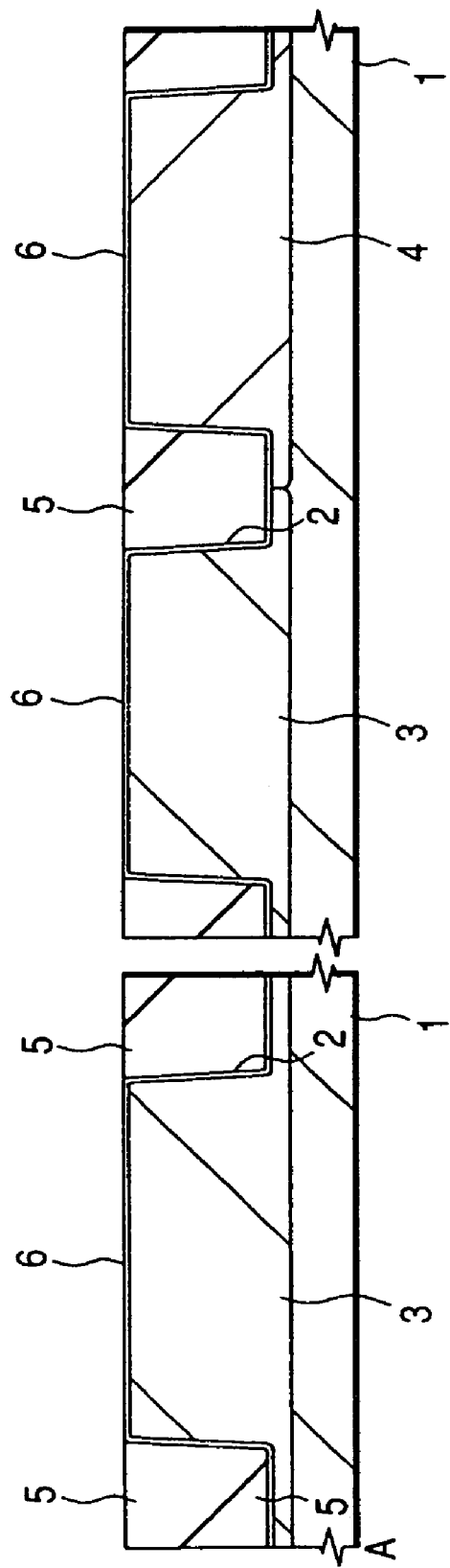
FIG. 38 is a cross sectional view of the essential parts of a semiconductor substrate showing the manufacturing method of a semiconductor integrated circuit device which is the other embodiment of the present invention.

First, as shown in FIG. 38, a substrate 1 made of, for example, p-type single crystal silicon is prepared. Element isolation trenches 2 are formed in the principal surface of the substrate 1 in the same manner as in Embodiment 1. Then, each p-type well 3 is formed in a part of the substrate 1, and each n-type well 4, in another part thereof. Subsequently, the substrate 1 is steam oxidized, thereby to form a clean gate insulating film 6 composed of a silicon oxide film with a thickness of about 6 nm on the surface of the p-type well 3 and on the surface of the n-type well 4. The gate insulating film 6 may also be formed of a silicon oxynitride film, a silicon nitride film, a composite insulating film of a silicon oxide film and a silicon nitride film, or the like in place of the silicon oxide film.

Figure 39:
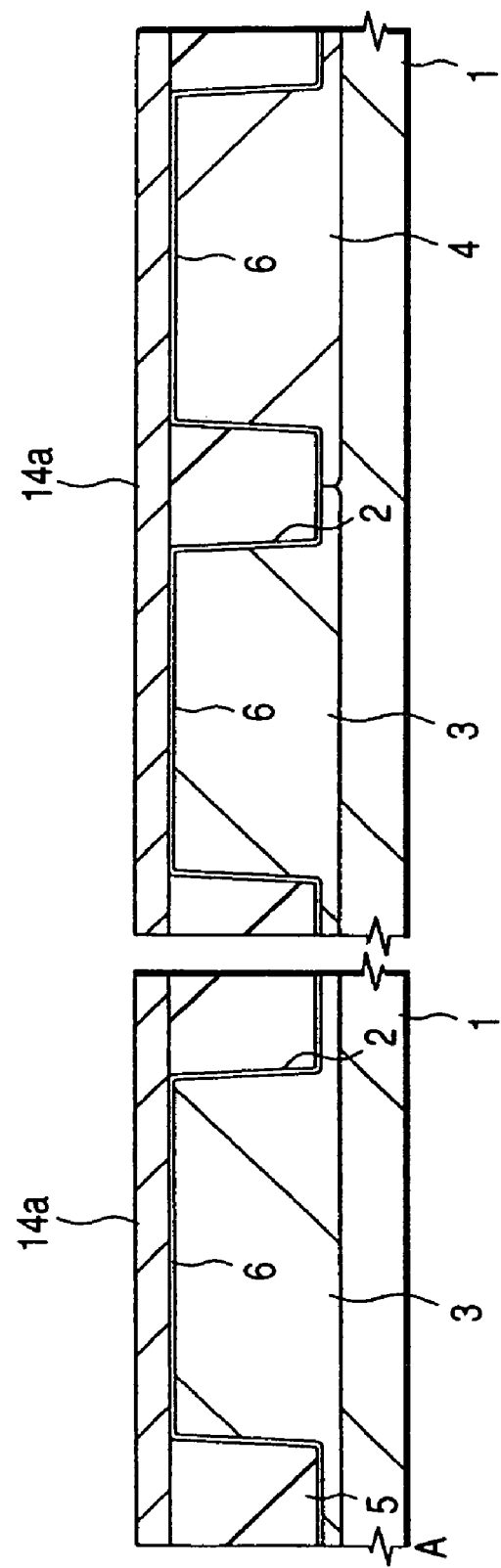
FIG. 39 is a cross sectional view of the essential parts of the semiconductor substrate showing the manufacturing method of the semiconductor integrated circuit device which is the other embodiment of the present invention.

Then, as shown in FIG. 39, a non-doped amorphous silicon film 14a is deposited on the gate insulating film 6. The amorphous silicon film 14a is deposited by, for example, a CVD process using monosilane ($SiH_4$) as a source gas, and the film thickness is set at about 70 nm. When the amorphous silicon film 14a is formed by a CVD process using monosilane ($SiH_4$) as a source gas, the film formation temperature is set within a range of 500° C. to 550° C., for example, at 530° C. Incidentally, when the film formation temperature is set at 600° C. or more, a polysilicon film 14n can be obtained as with Embodiment 1. Whereas, also when the deposition is performed by a CVD process using dinosilane ($Si_2H_6$) as a source gas, it is possible to obtain the amorphous silicon film 14a by performing the deposition at a temperature lower than the temperature at which a polysilicon film can be obtained, for example, at about 520° C. Incidentally, a silicon film containing Ge (germanium) in an amount of around 50% at the maximum may also be used in place of the non-doped amorphous silicon film 14a. For example, a polysilicon film is deposited by a CVD process, and then, Ge is introduced into the polysilicon film by an ion implantation process, thereby to obtain a Ge-containing amorphous silicon film.

As described later, the logic merged DRAM of this embodiment is so configured that the n-channel type MISFET and the p-channel type MISFET of the logic portion are both of surface-channel type. Therefore, the polysilicon film which is a part of the gate electrode of the n-channel MISFET is formed to be n type, while the polysilicon film which is a part of the gate electrode of the p-channel type MISFET is formed to be p type. In this case, when a non-doped polysilicon film is deposited on the gate insulating film 6, and then, boron (B) is ion implanted for rendering the polysilicon film of the p-channel type MISFET formation region p type, a part of the boron ions may penetrate through the polysilicon film and the gate insulating film 6 to be introduced into the channel region of the substrate 1 by the channeling phenomenon.

Therefore, as with this embodiment, when a part of the gate electrode of the p-channel type MISFET is composed of a p-type polysilicon film, it is desirable to use the amorphous silicon film 14a which is less likely to cause the channeling phenomenon. On the other hand, as with the DRAM of Embodiment 1, when the silicon film of all the gate electrodes (7A, 7B, and 7C) is composed of an n-type conductive silicon film, the problem of penetration of boron ions described above will not occur. Therefore, a polysilicon film may also be used in place of the amorphous silicon film 14a.

Figure 40:
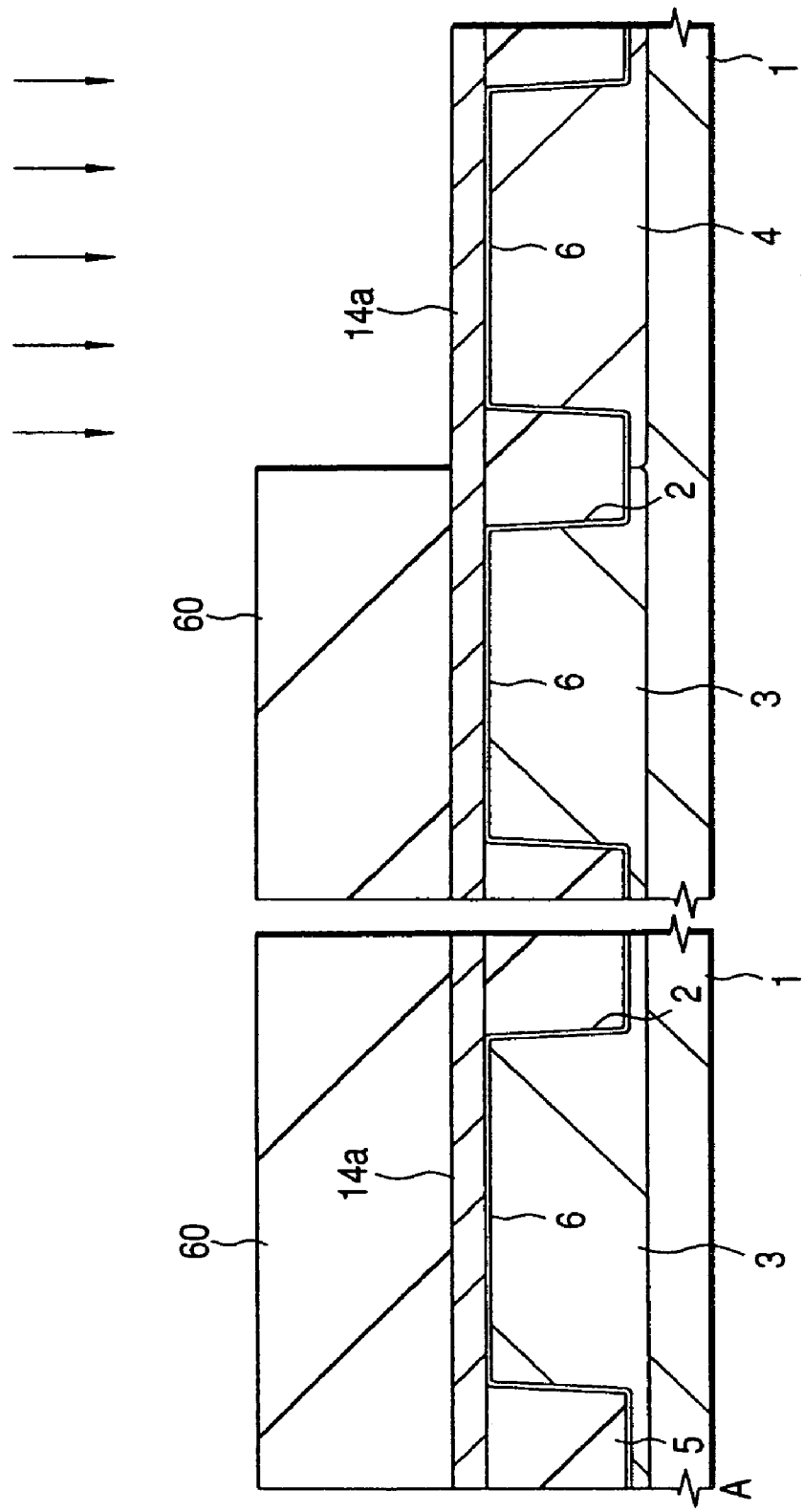
FIG. 40 is a cross sectional view of the essential parts of the semiconductor substrate showing the manufacturing method of the semiconductor integrated circuit device which is the other embodiment of the present invention.
Figure 41:
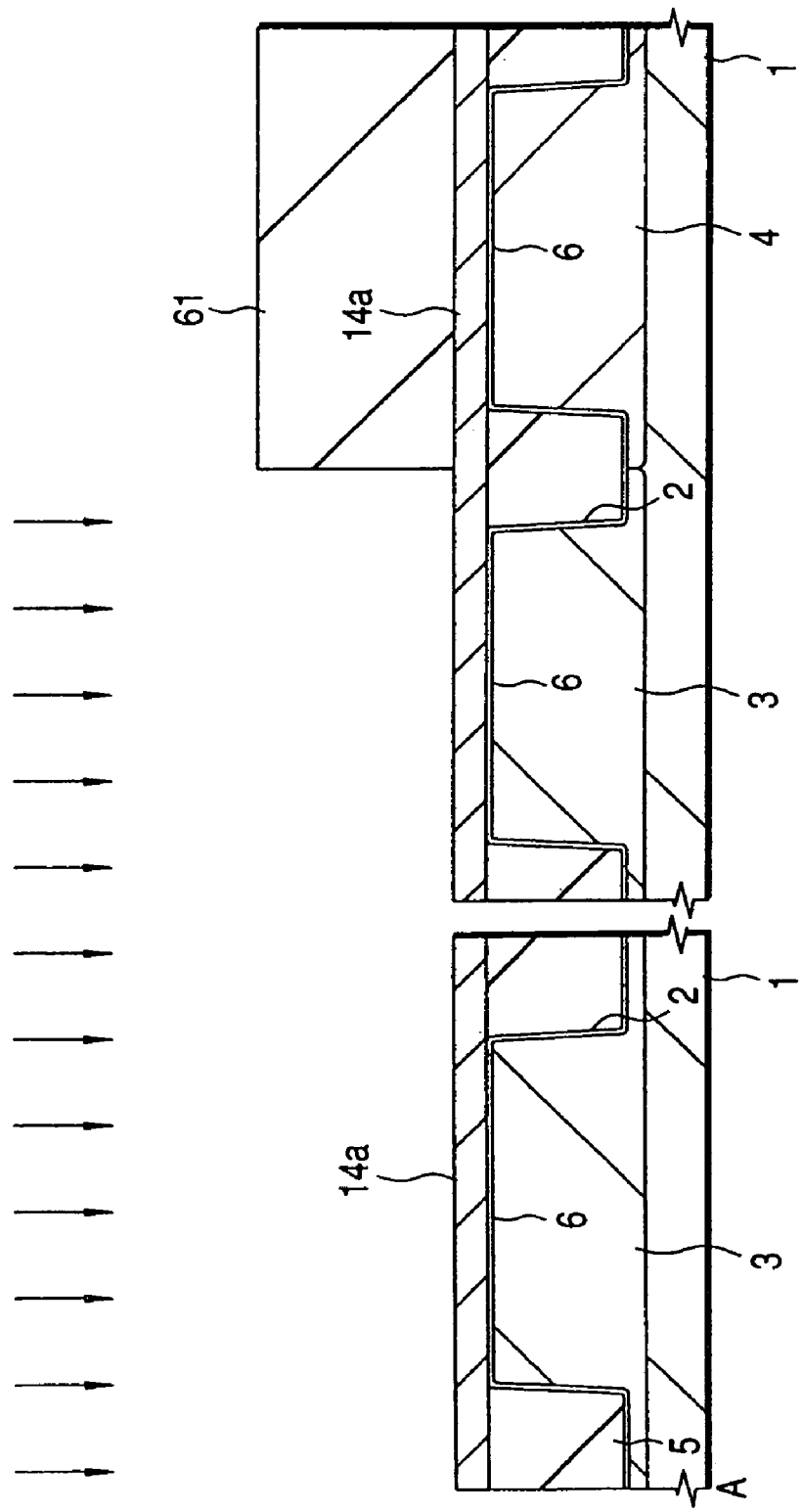
FIG. 41 is a cross sectional view of the essential parts of the semiconductor substrate showing the manufacturing method of the semiconductor integrated circuit device which is the other embodiment of the present invention.

Then, as shown in FIG. 40, the top of each p-type well 3 is covered with a photoresist film 60, so that B (boron) is ion implanted into the amorphous silicon film 14a on each n-type well 4. The dose amount of B is set at, for example, $2 \times 10^{15}$ atoms/cm$^2$, and the injection energy is set at, for example, 5 keV. Subsequently, the photoresist film 60 is removed by ashing. Then, as shown in FIG. 41, the top of each n-type well 4 is covered with a photoresist film 61, so that P (phosphorus) is ion implanted into the amorphous silicon film 14a on each p-type well 3. The dose amount of P is, for example, $2 \times 10^{15}$ atoms/cm$^2$, and the injection energy is, for example, 10 keV.

Figure 42:
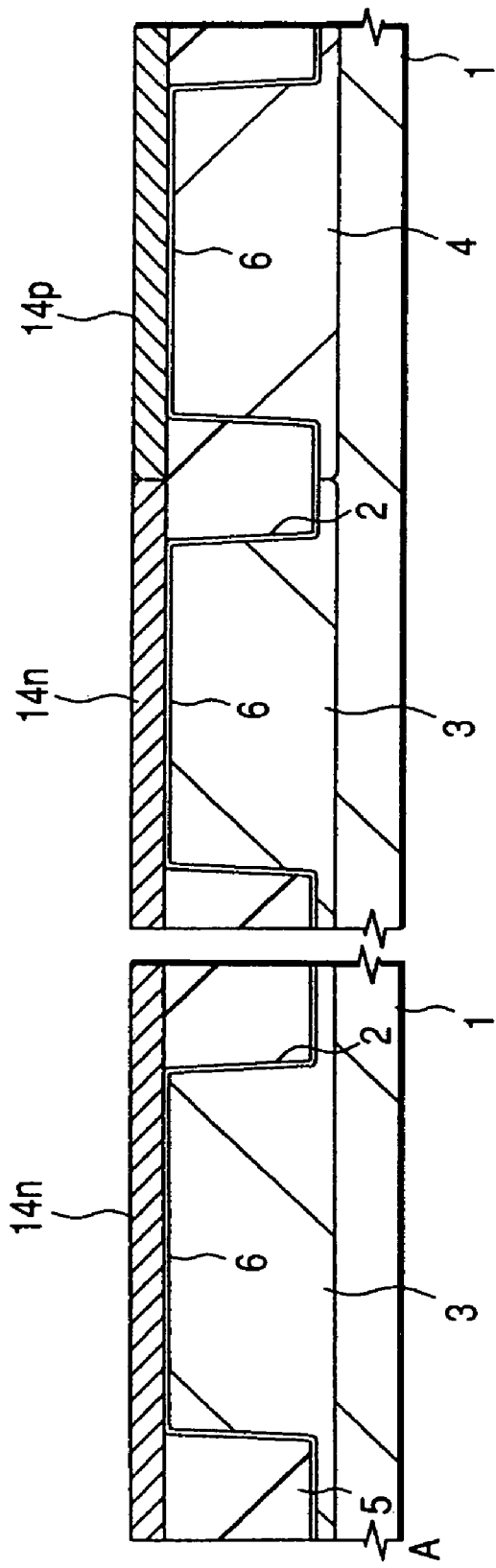
FIG. 42 is a cross sectional view of the essential parts of the semiconductor substrate showing the manufacturing method of the semiconductor integrated circuit device which is the other embodiment of the present invention.

Then, the photoresist film 61 is removed by ashing, and the surface of the polysilicon film 14n is washed using hydrofluoric acid. Then, the amorphous silicon film 14a is crystallized by lamp annealing for about 1 minute in an about 950° C. nitrogen atmosphere, and the impurities (B and P) are electrically activated. As a result, as shown in FIG. 42, the amorphous silicon film 14a in the n-channel type MISFET formation region becomes an n-type polysilicon film 14n, and the amorphous silicon film 14a in the p-channel type MISFET formation region becomes a p-type polysilicon film 14p.

Incidentally, if a heat treatment for crystallizing the amorphous silicon film 14a is performed after depositing a $WN_x$ film and a W film on the amorphous silicon film 14a, the $WN_x$ film and the W film may be peeled off due to the stress change with the crystallization of silicon. There is also another possibility as follows. The impurities (B, P) in the amorphous silicon film 14a are incorporated into the $WN_x$ film and the W film before they diffuse to the interface with the gate insulating film 6, and hence depletion occurs in the vicinity of the interface with the gate insulating film 6. As a result, it becomes impossible to obtain desirable device characteristics. Therefore, the foregoing heat treatment is desirably carried out before depositing the $WN_x$ film and the W film on the amorphous silicon film 14a.

Figure 43:
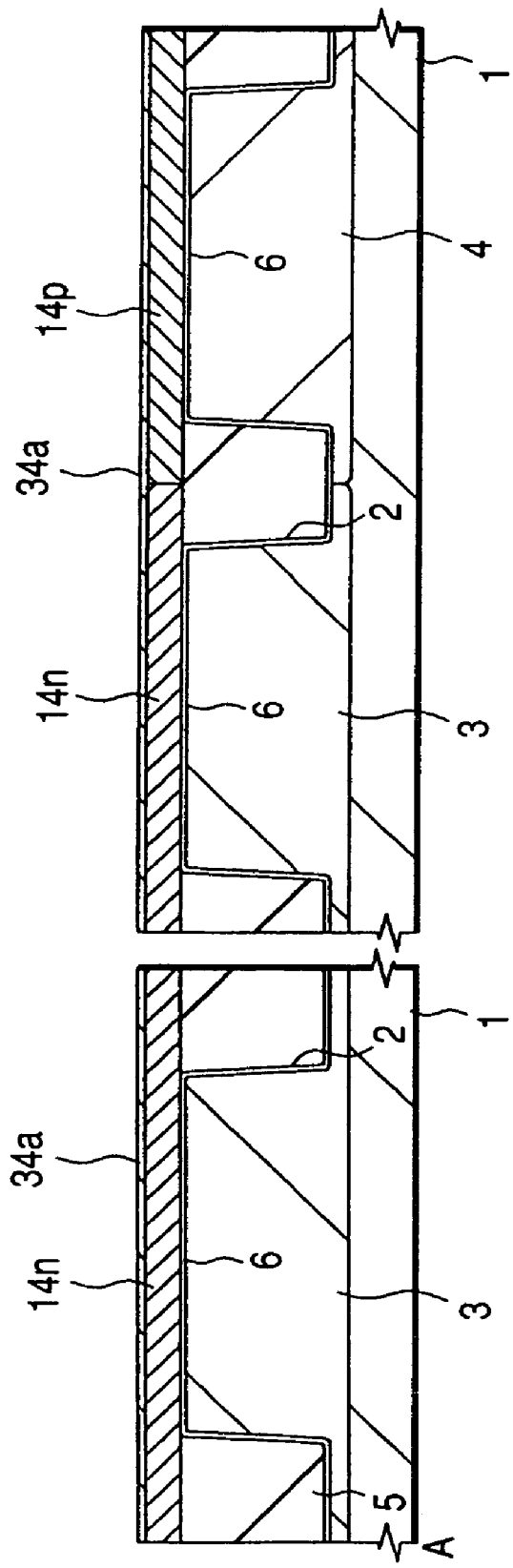
FIG. 43 is a cross sectional view of the essential parts of the semiconductor substrate showing the manufacturing method of the semiconductor integrated circuit device which is the other embodiment of the present invention.

Then, the surfaces of the polysilicon films 14n and 14p are washed using hydrofluoric acid. Then, as shown in FIG. 43, an amorphous silicon film 34a is deposited on the polysilicon films 14n and 14p. The amorphous silicon film 34a is deposited (film formation temperature=about 530° C.) by, for example, a CVD process using monosilane ($SiH_4$) as a source gas, and the film thickness is set at about 10 nm. Further, the amorphous silicon film 34a is composed of very low impurity concentration amorphous silicon of which the impurity concentration in the early stage upon formation is less than $1.0 \times 10^{17}$ cm$^3$, or a substantially non-doped amorphous silicon of less than $1.0 \times 10^{14}$ cm$^3$. The amorphous silicon film 34a is formed for cutting off the contact between a very thin natural oxide film occurring on the surfaces of the polysilicon films 14n and 14p, and a $WN_x$ film 24 to be deposited thereon in the subsequent step. It is acceptable that the amorphous silicon film 34a is not in a completely amorphous state. It may also be, for example, an aggregate of microcrystal silicon particles.

Figure 44:
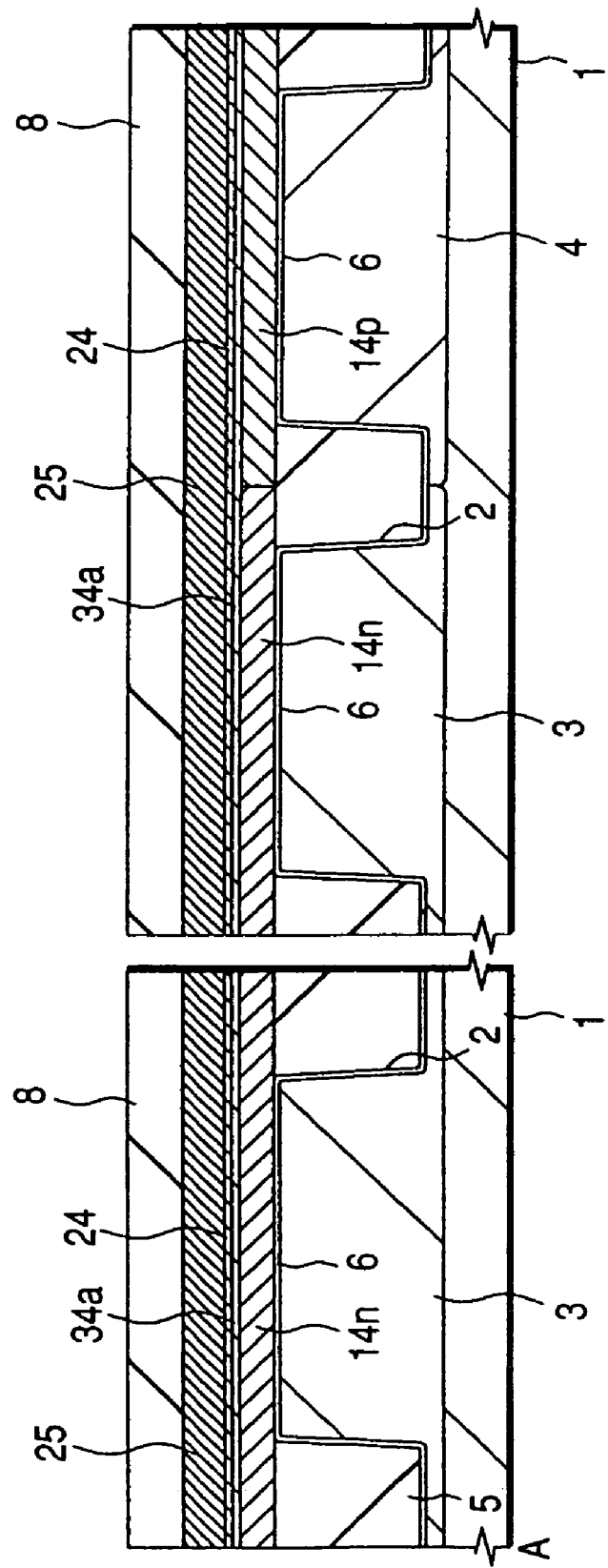
FIG. 44 is a cross sectional view of the essential parts of the semiconductor substrate showing the manufacturing method of the semiconductor integrated circuit device which is the other embodiment of the present invention.

Then, the surface of the amorphous silicon film 34a is washed using hydrofluoric acid. Then, as shown in FIG. 44, the $WN_x$ film 24 and a W film 25 are continuously deposited on the amorphous silicon film 34a by a sputtering process. Subsequently, a silicon nitride film 8 is deposited on the W film 25 by a CVD process. The thickness of the $WN_x$ film 24 is set at about 5 nm to 10 nm. Whereas, the thickness of the W film 25 to be deposited on the $WN_x$ film 24 is set at about 70 nm to 80 nm. The thickness of the silicon nitride film 8 is set at about 160 nm. A Mo film may also be deposited on the $WN_x$ film 24 in place of the W film 25.

In this embodiment, for the formation of the $WN_x$ film 24 by a sputtering process, the $WN_x$ film 24 is formed under conditions such that the nitrogen element content upon device completion is at least 7% to 10% or more, preferably 13% or more, and more preferably 18% or more. In order to form such a $WN_x$ film 24, it is desirable that film formation is performed in an atmosphere such that the resulting $WN_x$ film 24 contains nitrogen. Namely, sputtering is desirably performed by setting the atmosphere in a chamber to be a gas atmosphere such that the flow rate ratio of a nitrogen gas to an argon gas is 1.0 or more. Specifically, the film formation is carried out, for example, under the conditions of, nitrogen gas flow rate=50 sccm to 80 sccm, argon gas flow rate=20 sccm to 30 sccm, degree of vacuum in chamber=0.5 Pa, and temperature=200° C. to 500° C.

Whereas, the thickness of the $WN_x$ film 24 upon film formation is desirably set within a range of from 5 nm to 10 nm. By setting the thickness of the $WN_x$ film 24 upon film formation 5 nm or more, the residual film thickness upon device completion is at least 1 nm or more even if a part of the $WN_x$ film 24 and the underlying silicon layer react with each other during a heat treatment step after film formation. Therefore, the function as a barrier layer is ensured. On the other hand, if the thickness of the $WN_x$ film 24 upon film formation exceeds 10 nm, the wiring resistance of the gate electrode increases, which is disadvantageous to the high-speed operation of a circuit.

Whereas, even when the film formation is carried out in an atmosphere such that the resulting $WN_x$ film 24 contains high-concentration nitrogen, excess nitrogen diffuses and leaves during the heat treatment step after film formation. Therefore, the $WN_x$ film 24 upon device completion is composed exclusively of $W_2N$ which is stoichiometrically most stable. However, a part of the $WN_x$ film 24 reacts with the underlying silicon layer in the process of the heat treatment. Therefore, the $WN_x$ film 24 upon device completion becomes a mixed crystal containing $W_2N$ and other $WN_x$, and further occasionally WSiN.

Figure 45:
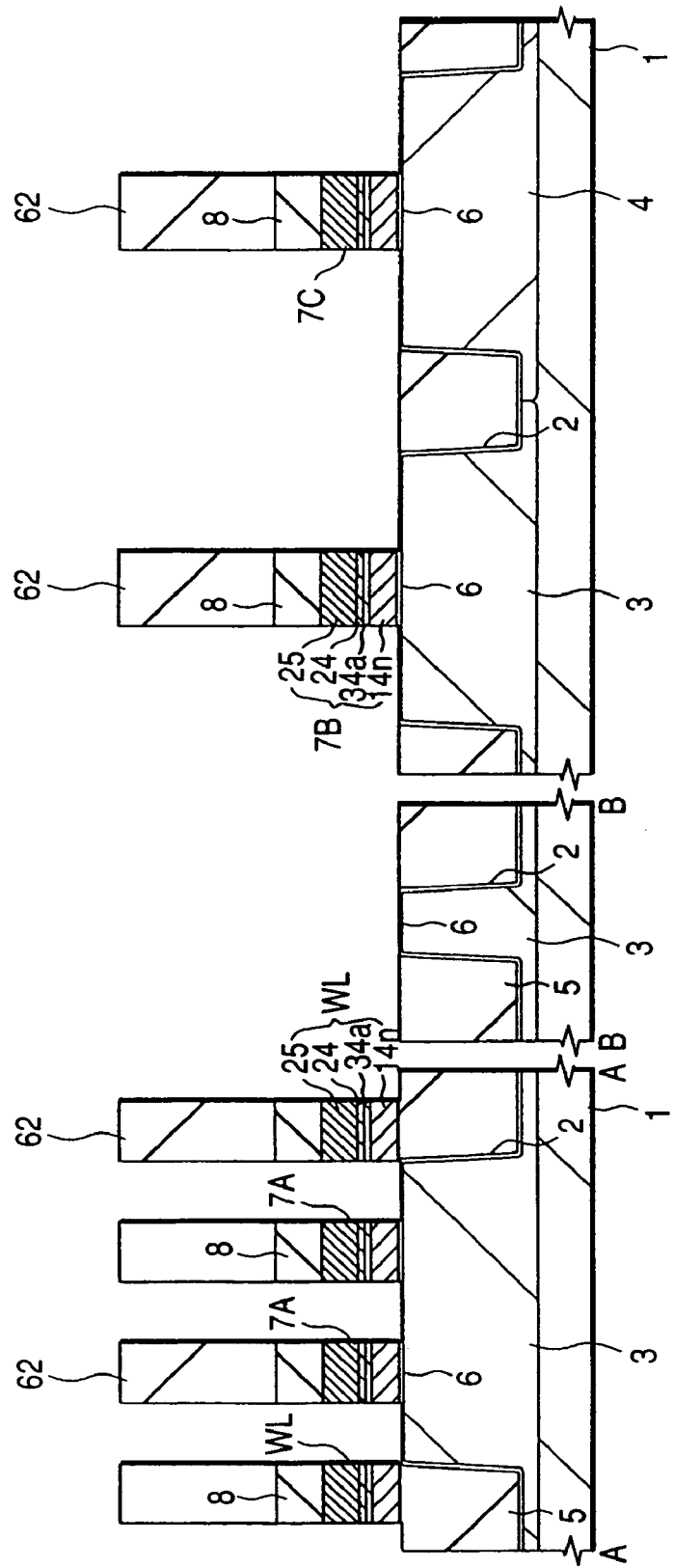
FIG. 45 is a cross sectional view of the essential parts of the semiconductor substrate showing the manufacturing method of the semiconductor integrated circuit device which is the other embodiment of the present invention.

Then, as shown in FIG. 45, by using a photoresist film 62 formed on the silicon nitride film 8 as a mask, the silicon nitride film 8, the W film 24, the $WN_x$ film 25, the amorphous silicon film 34a, and the polysilicon films 14n and 14p are successively dry etched. As a result, gate electrodes 7A (word lines WL) are formed on the gate insulating film 6 in the memory array, and gate electrodes 7D and 7E are formed on the gate insulating film 6 in the logic portion.

Thereafter, with the method described in Embodiment 1, memory cell selecting MISFETs Qt are formed in the memory array, and n-channel type MISFETs and p-channel type MISFETs are formed in the logic portion. Also in this case, by performing the reoxidation treatment of the gate insulating film 6, the washing treatment thereof, the deposition of the silicon nitride film, and the like in the same manner as in Embodiment 1, it is possible to keep the contamination of the substrate 1 due to the oxide of W at a very low level.

Figure 46:
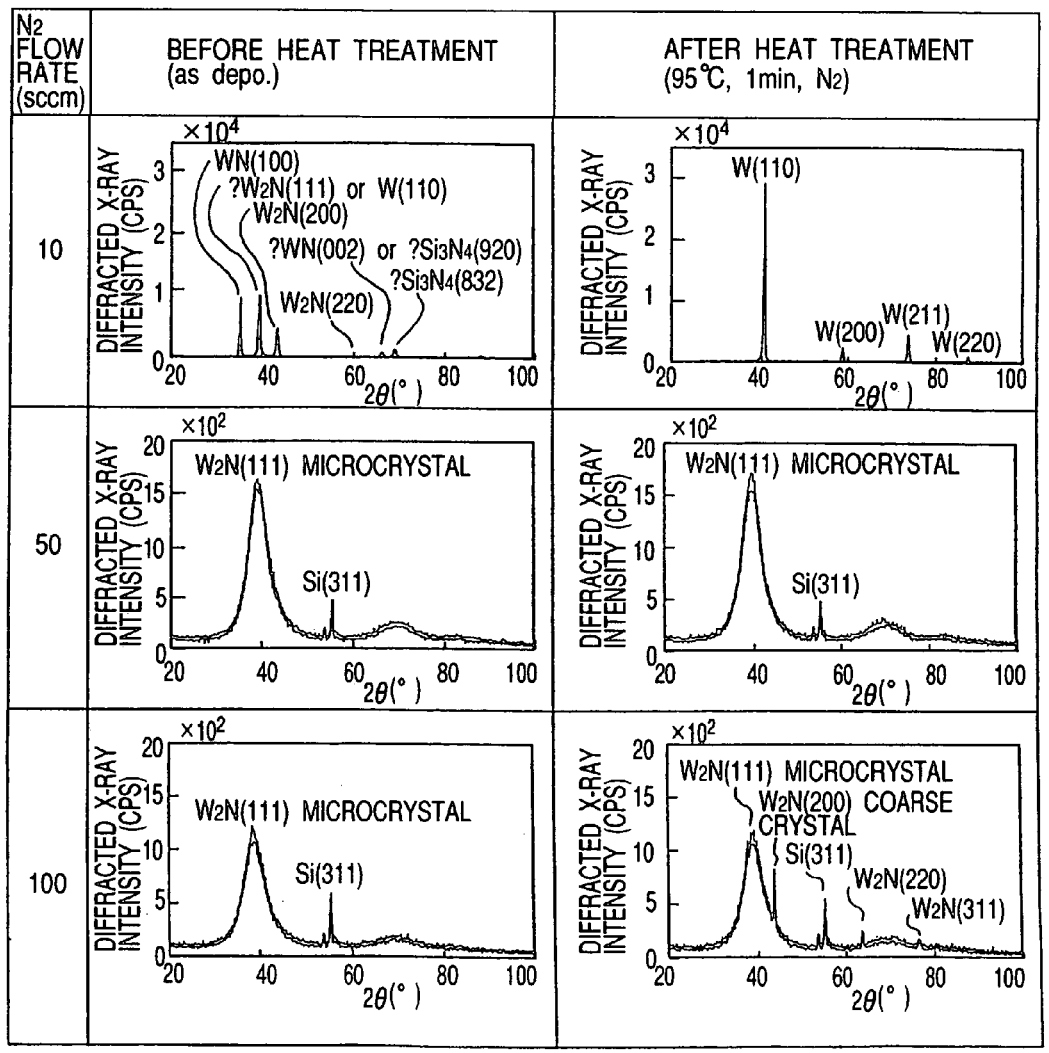
FIG. 46 shows graphs each showing the results of examination on the relationship between the nitrogen flow rate during formation of a $WN_x$ film constituting a part of the gate electrode and the crystal structure of the $WN_x$ film by means of X-ray diffraction measurement.

FIG. 46 shows graphs each showing the results obtained when the relationship between the nitrogen flow rate during formation of the $WN_x$ film 24 constituting a part of the gate electrodes 7A, 7D, and 7E and the crystal structure of the $WN_x$ film 24 was examined by means of X-ray diffraction measurement immediately after film formation of the $WN_x$ film 24 and after a one-minute heat treatment in a 950° C. nitrogen gas. As shown, when the nitrogen flow rate during the formation of the $WN_x$ film 24 is set at 10 sccm, the nitrogen in the $WN_x$ film 24 is released in the process of the high-temperature heat treatment, resulting in a W film. Accordingly, the function as a barrier layer of the $WN_x$ film 24 is lost.

FIGS. 47(a) and (b) are graphs each showing the results of the measurement of the film stress obtained when the $WN_x$ film deposited by keeping the flow rate of an argon gas constant (40 sccm), and changing the nitrogen gas flow rate was heat treated at various temperatures, wherein FIG. 47(a) shows the case where the film formation has been performed at a substrate temperature of 400° C., and FIG. 47(b) shows the case where the film formation has been performed at a substrate temperature of 200° C. As shown, when the nitrogen flow rate during the formation of the $WN_x$ film is low, nitrogen is released due to the subsequent heat treatment, so that the film compresses, resulting in an increase in film stress.

Figure 48:
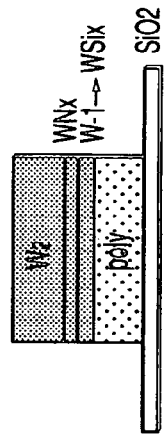
FIG. 48 is a graph showing the results of examination on the relationship between the withstand voltage of a gate electrode including a $WN_x$ film formed by changing the flow rate ratio between a nitrogen gas and an argon gas, and the contact resistance of the $WN_x$ film/polysilicon film interface.

FIG. 48 shows the results of examination on the relationship between the withstand voltage of the gate electrode including the $WN_x$ film deposited by changing the flow rate ratio between a nitrogen gas and an argon gas, and the contact resistance of the $WN_x$ film/polysilicon film interface. As shown, for the $WN_x$ film deposited under the condition of low nitrogen gas flow rate, the withstand voltage of the gate electrode decreases, and the contact resistance of the $WN_x$ film/polysilicon film interface increases.

Thus, in accordance with this embodiment in which the film formation is carried out in an atmosphere such that the resulting $WN_x$ film 24 contains a high-concentration nitrogen, N remains in the $WN_x$ film also after the heat treatment step. Therefore, the function as a barrier layer of the $WN_x$ film 24 will not be lost. Further, by interposing the amorphous silicon film 34a between the $WN_x$ film 24 and the polysilicon films 14n and 14p, it is possible to suppress the formation of a high-resistance layer due to the contact between a very thin natural oxide film occurred on the surfaces of the polysilicon films 14n and 14p and the $WN_x$ film 24. Incidentally, the amorphous silicon film 34a undergone the heat treatment step becomes a polycrystal film with a smaller mean crystal particle diameter than that of the underlying polysilicon films 14n and 14p.

In accordance with the process up to this point, it was possible to reduce the contact resistance of the interface between the $WN_x$ film 24 constituting the gate electrodes 7A, 7D, and 7E, and the polysilicon films 14n and 14p from 5 kΩ/μm² to 10 kΩ/m² prior to countermeasure implementation, down to 1 kΩ/m².

Further, by performing the reoxidation treatment of the gate insulating film 6, the washing treatment thereof, the deposition of the silicon nitride film, and the like in the same manner as in Embodiment 1, it was possible to keep the contamination of the substrate 1 due to the oxide of W at a very low level. As a result, it was possible to remarkably improve the refresh time of the DRAM.

(Embodiment 3)

In Embodiment 2, by interposing the amorphous silicon film 34a between the $WN_x$ film 24 and the polysilicon films 14n and 14p, the contact resistance between the $WN_x$ film 24 and the polysilicon films 14n and 14p was reduced. However, in this embodiment, by interposing a W film 62 with a small thickness between the $WN_x$ film 24 and the polysilicon films 14n and 14p, the contact resistance between the $WN_x$ film 24 and the polysilicon films 14n and 14p is reduced.

Figure 49:
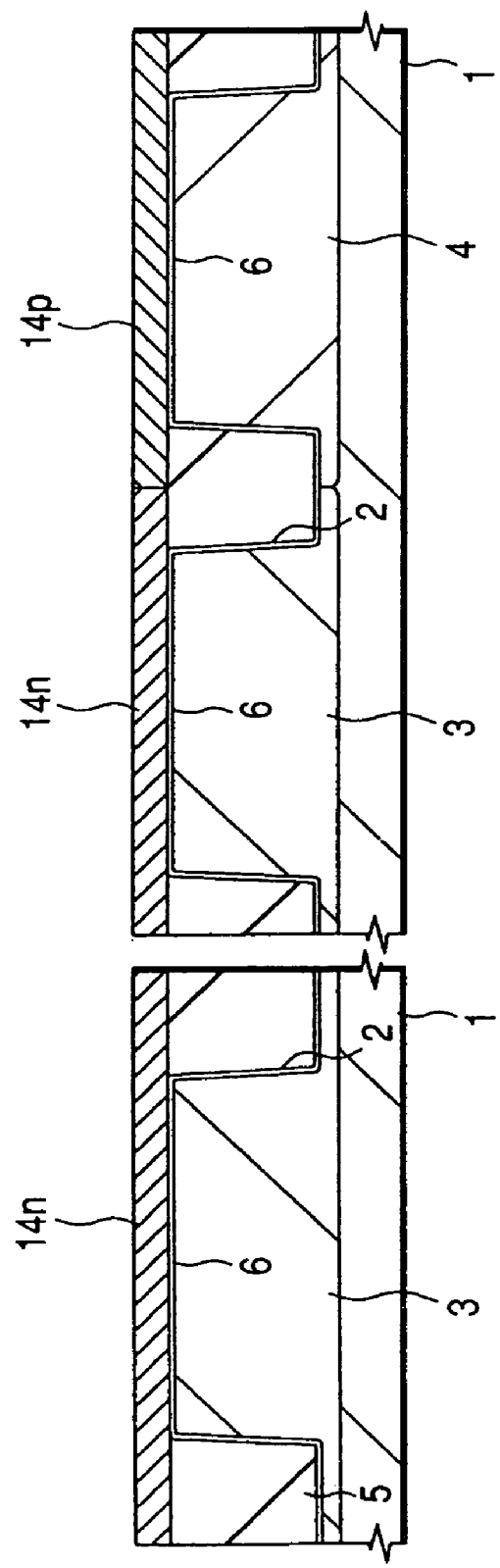
FIG. 49 is a cross sectional view of the essential parts of the semiconductor substrate showing the manufacturing method of the semiconductor integrated circuit device which is the other embodiment of the present invention.

This process will be described. First, as shown in FIG. 49, an n-type polysilicon film 14n is formed on the gate insulating film 6 in an n-channel type MISFET formation region, and a p-type polysilicon film 14p is formed on the gate insulating film 6 in a p-channel type MISFET formation region. The steps up to this point are the same as the steps shown in FIGS. 38 to 42 of Embodiment 2.

Figure 50:
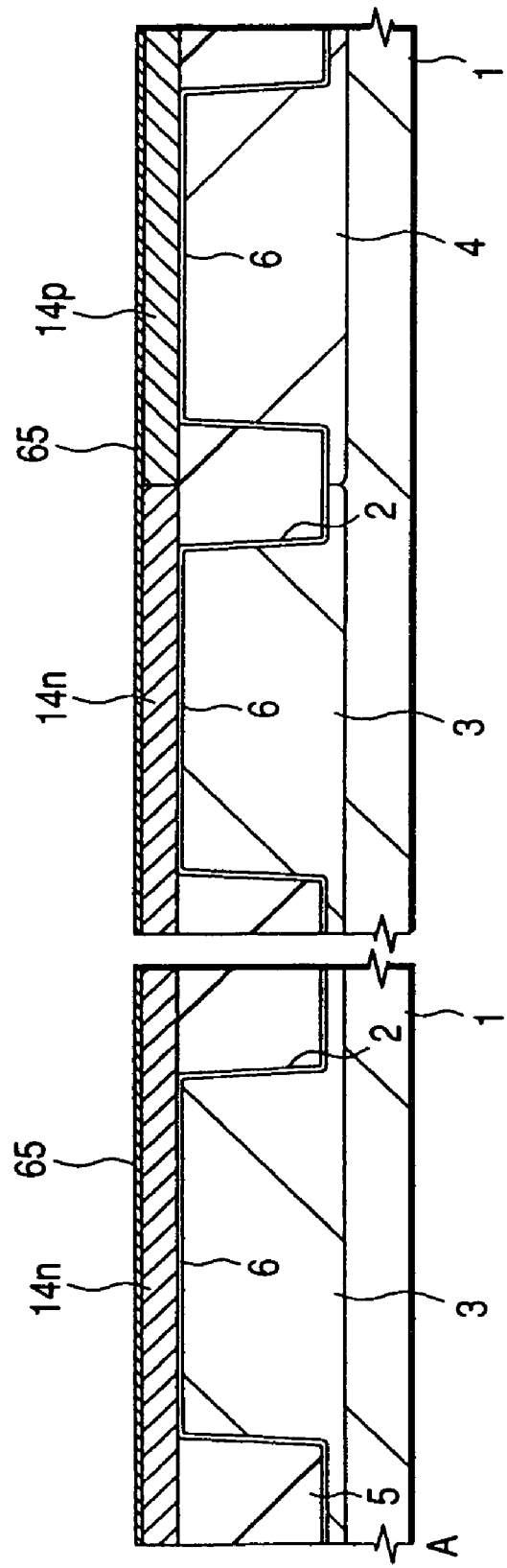
FIG. 50 is a cross sectional view of the essential parts of the semiconductor substrate showing the manufacturing method of the semiconductor integrated circuit device which is the other embodiment of the present invention.

Then, the surfaces of the polysilicon films 14n and 14p are washed using hydrofluoric acid. Then, as shown in FIG. 50, a W film 65 is deposited on the polysilicon films 14n and 14p. The W film 65 is deposited by, for example, a sputtering process, and the film thickness is set at about 5 nm.

Figure 51:
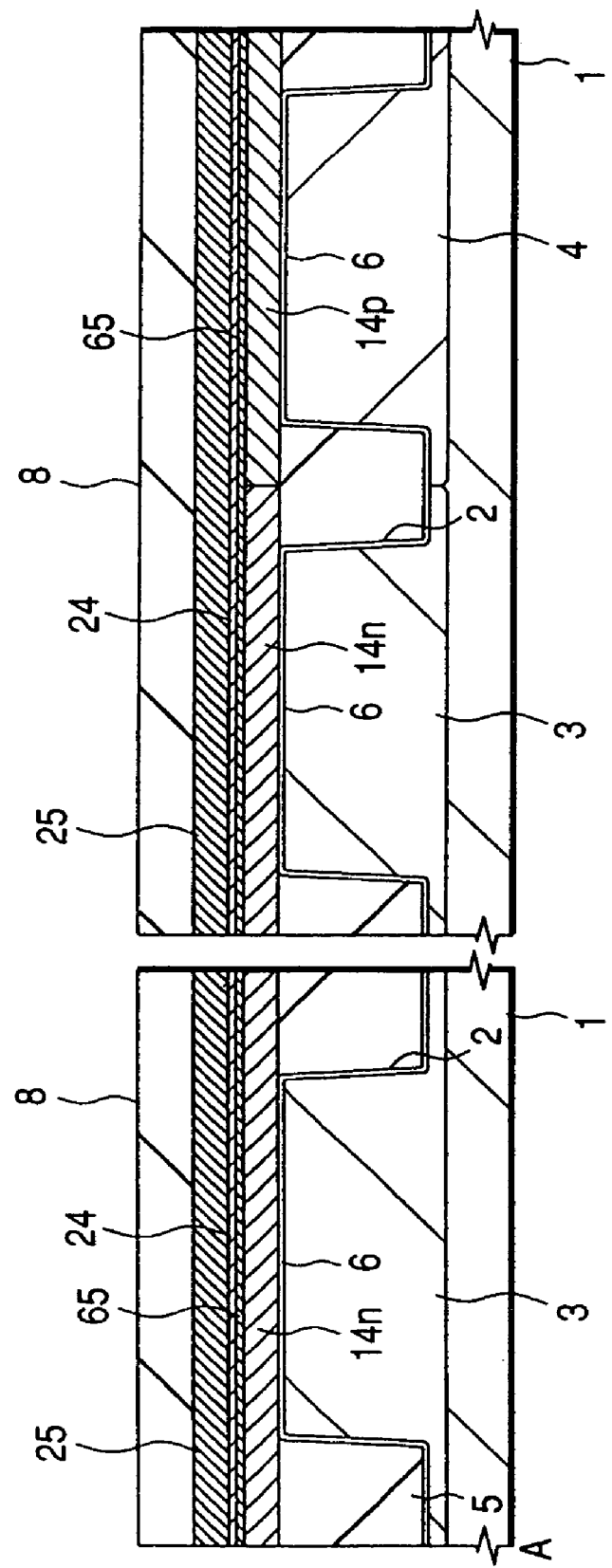
FIG. 51 is a cross sectional view of the essential parts of the semiconductor substrate showing the manufacturing method of the semiconductor integrated circuit device which is the other embodiment of the present invention.

Then, as shown in FIG. 51, on the W film 65, the $WN_x$ film 24, the W film 25, and the silicon nitride film 8 are successively deposited in the same manner as in Embodiment 2. The thickness of the $WN_x$ film 24 is set at about 5 nm to 10 nm; the thickness of the W film 25, about 70 nm to 80 nm; and the thickness of the silicon nitride film 8, about 160 nm. A Mo film may also be deposited in place of the W film 25 on the $WN_x$ film 24. Further, the $WN_x$ film 24 is deposited in such an atmosphere as to contain high-concentration nitrogen as with Embodiment 2. Thus, the film formation is achieved such that the nitrogen element content upon device completion is at least 7% to 10% or more, preferably 13% or more, and more preferably 18% or more. The subsequent steps are the same as those of Embodiment 2.

Thus, by interposing the W film 62 between the $WN_x$ film 24 and the polysilicon films 14n and 14p, the W film 62 and the polysilicon films 14n and 14p react with each other in the process of the subsequent heat treatment. As a result, a conductive layer composed exclusively of W silicide ($WSi_x$) is formed. This can suppress the formation of a high-resistance layer due to the contact between a natural oxide film occurred on the surfaces of the polysilicon films 14n and 14p and the $WN_x$ film 24. Therefore, it is possible to obtain almost the same effects as with Embodiment 2.

In accordance with the foregoing process, it was possible to reduce the contact resistance of the interface between the $WN_x$ film 24 constituting the gate electrodes 7A, 7D, and 7E, and the polysilicon films 14n and 14p from 5 k$\Omega$/$\mu m^2$ to 10 k$\Omega$/$\mu m^2$ prior to countermeasure implementation, down to 1 k$\Omega$/$\mu m^2$.

Further, by performing the reoxidation treatment of the gate insulating film 6, the washing treatment thereof, the deposition of the silicon nitride film, and the like in the same manner as in Embodiment 1, it was possible to keep the contamination of the substrate 1 due to the oxide of W at a very low level. As a result, it was possible to remarkably improve the refresh time of the DRAM.

Incidentally, in this embodiment, the W film 62 was interposed between the $WN_x$ film 24 and the polysilicon films 14n and 14p. Thus, the W film 62 and the polysilicon films 14 n and 14p were allowed to react with each other in the process of the subsequent heat treatment to form a conductive layer composed exclusively of W silicide. However, the following procedure is also acceptable. A thin W silicide film is formed on the polysilicon films 14n and 14p, and the $WN_x$ film 24 and the W film 25 are deposited thereon. This can prevent the deficiency that the nitrogen in the $WN_x$ film 24 diffuses to the interface with the polysilicon films 14n and 14p to form a high-resistance silicon nitride layer. Whereas, when the W film 62 and the polysilicon films 14n and 14p are allowed to react with each other in the process of heat treatment to form a W silicide layer, reactions may locally occur, resulting in a reduction in gate withstand voltage. However, when the W silicide film is deposited from the beginning, such local reactions are less likely to occur it suffices that the thickness of the W silicide film is about 5 nm to 20 nm. Whereas, X of $WSi_x$ is desirably about 2.0 to 2.7.

(Embodiment 4)

This embodiment relates to a CMOS logic LSI wherein n-channel type MISFETs and p-channel type MISFETs constitute circuits, to which the present invention has been applied. One example of the manufacturing method thereof will be described step by step by reference to FIGS. 52 to 56.

Figure 52:
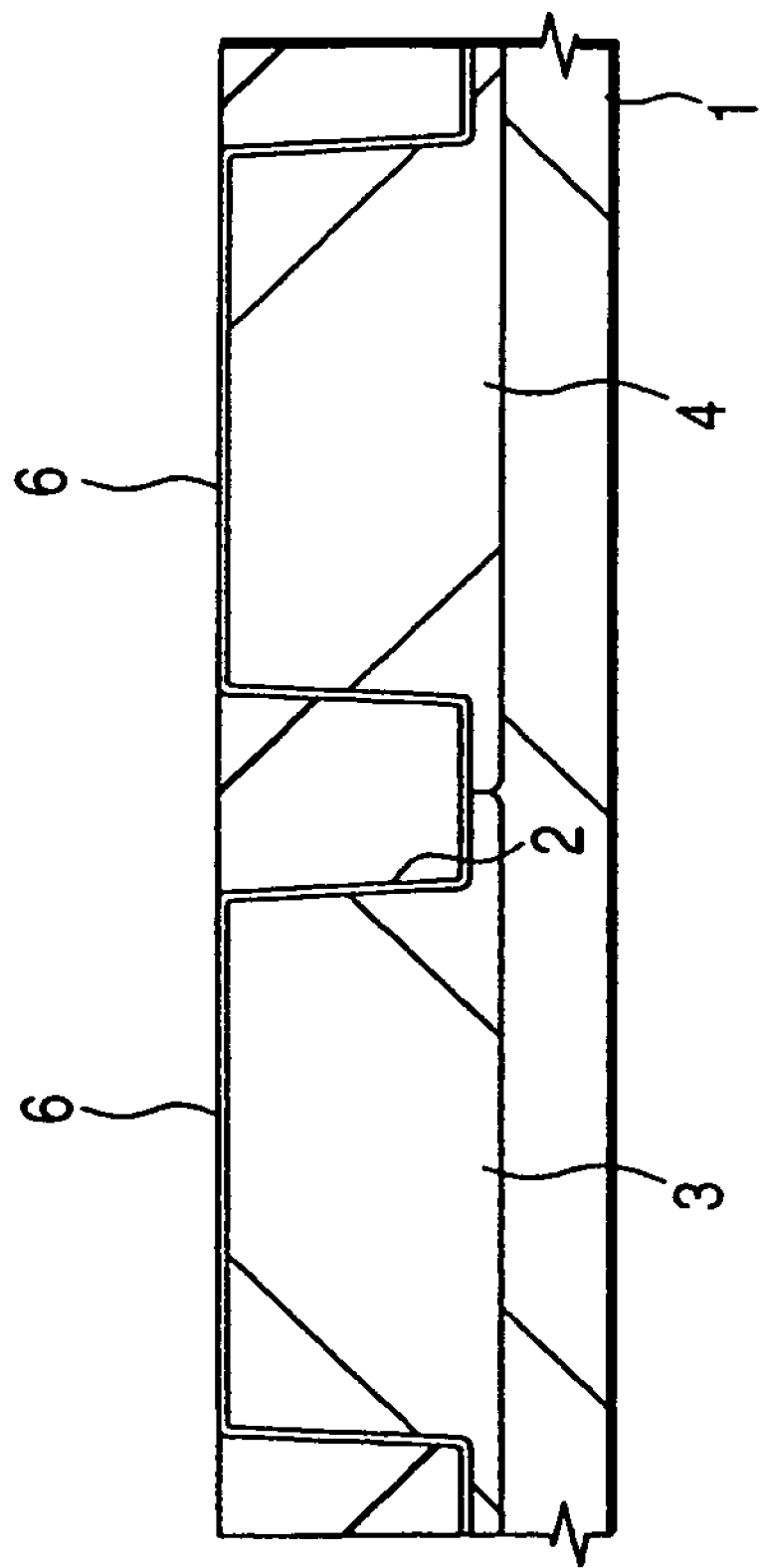
FIG. 52 is a cross sectional view of the essential part of the semiconductor substrate showing the manufacturing method of the semiconductor integrated circuit device which is the other embodiment of the present invention.

First, as shown in FIG. 52, for example, a substrate 1 composed of a p-type single crystal silicon is prepared. Each element isolation trench 2, each p-type well 3, each n-type well 4, and a gate insulating film 6 are successively formed on the principal surface of the substrate 1 in the same manner as with Embodiment 1.

Figure 53:
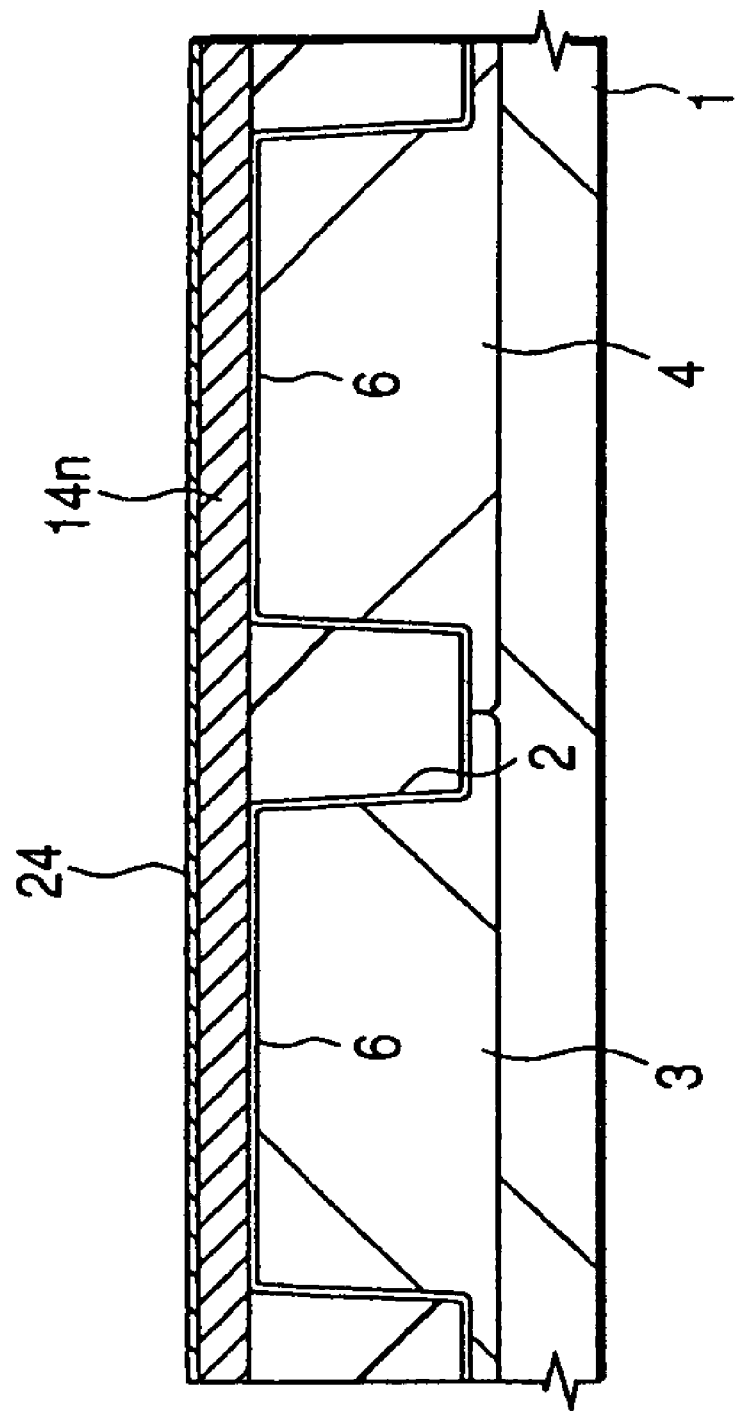
FIG. 53 is a cross sectional view of the essential part of the semiconductor substrate showing the manufacturing method of the semiconductor integrated circuit device which is the other embodiment of the present invention.

Then, as shown in FIG. 53, a low-resistance n-type polysilicon film 14n doped with P (phosphorus) with a concentration of $1.0 \times 10^{19}$ cm$^3$ or more is deposited on the gate insulating film 6. Then, the surface of the polysilicon film 14n is washed using hydrofluoric acid, and then a $WN_x$ film 24 with a thickness of about 5 nm to 10 nm is deposited on the polysilicon film 14n by a sputtering process.

As with Embodiment 2, the $WN_x$ film 24 is formed in such an atmosphere as to contain high-concentration nitrogen, so that the nitrogen element content upon device completion is at least 7% to 10% or more, preferably 13% or more, and more preferably 18% or more. Further, the $WN_x$ film 24 is deposited with a thickness such that the residual film thickness upon device completion is at least 1 nm or more.

Whereas, as with Embodiment 3, a W film 62 may also be formed between the $WN_x$ film 24 and the polysilicon film 14n for the purpose of suppressing the formation of a high-resistance layer due to the contact between a natural oxide film occurred on the surface of the polysilicon film 14n and the $WN_x$ film 24.

Then, as shown in FIG. 54, P (phosphorus) is ion implanted into the principal surface of the substrate 1. This ion implantation is carried out with an energy such that P penetrates the $WN_x$ film 24, and reaches the region at a depth of 10 nm or less from the surface of the polysilicon film 14n. For example, when the thickness of the $WN_x$ film 24 is about 3 nm to 15 nm, the implantation energy of P is set at 2 keV to 10 keV.

Whereas, the ion implantation is carried out with a dose amount such that the P concentration of the surface region of the polysilicon film 14n is $5 \times 10^{19}$ atoms/cm$^3$ or more. Further, after performing the ion implantation, about one-minute lamp annealing may also be performed in an about 950° C. nitrogen atmosphere to electrically activate the impurities (P) in the polysilicon film 14n. Incidentally, the impurities (P) in the polysilicon film 14n will be electrically activated in the subsequent heat treatment step, and hence the heat treatment at this step may also be omitted.

The foregoing ion implantation may also be carried out after depositing the polysilicon film 14n and before depositing the $WN_x$ film 24. When the W film 62 is formed between the $WN_x$ film 24 and the polysilicon film 14n, this ion implantation may also be carried out after the formation of the W film, followed by deposition of the $WN_x$ film 24 on the W film.

Figure 55:
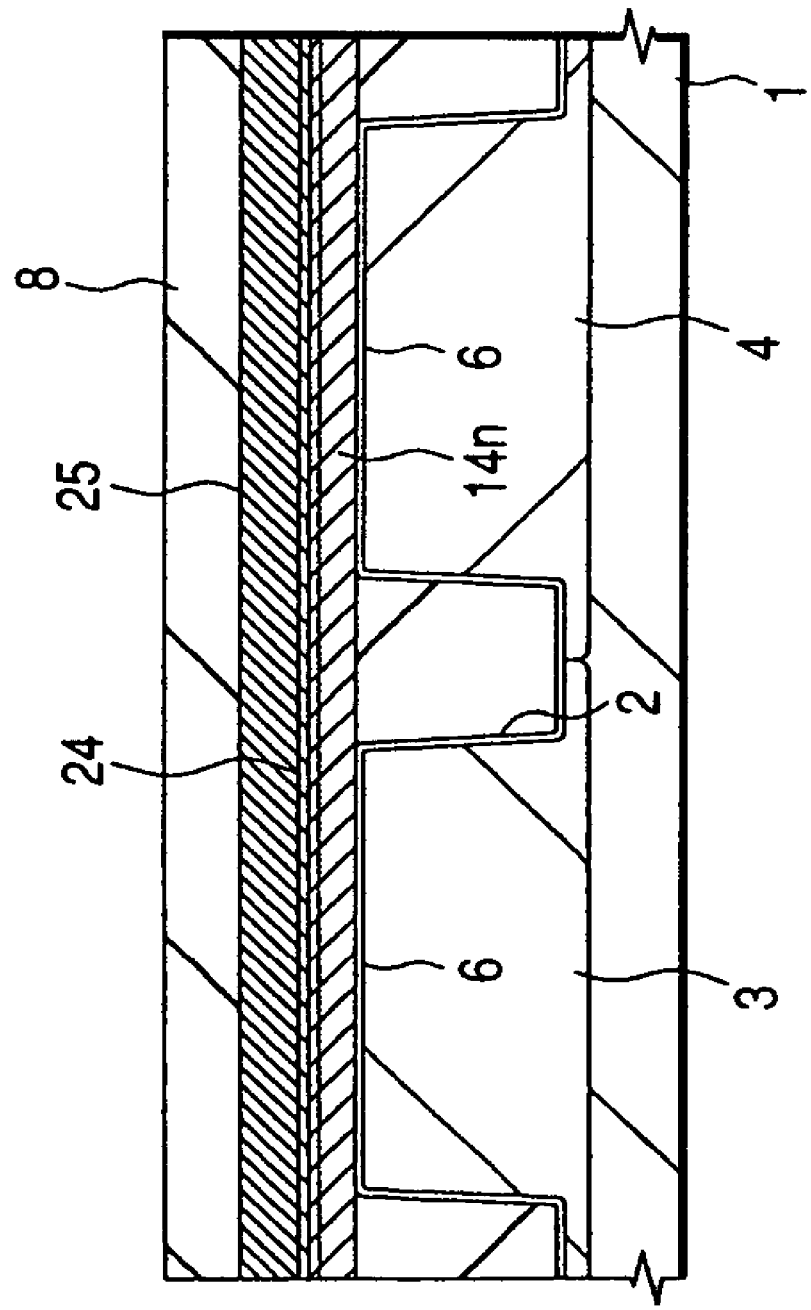
FIG. 55 is a cross sectional view of the essential part of the semiconductor substrate showing the manufacturing method of the semiconductor integrated circuit device which is the other embodiment of the present invention.

Then, as shown in FIG. 55, a W film 25 with a thickness of about 70 nm is deposited on the $WN_x$ film 24 by a sputtering process. Then, a silicon nitride film 8 with a thickness of about 160 nm is deposited on the W film 25 by a CVD process. Incidentally, a Mo film may also be deposited in place of the W film 25 on the $WN_x$ film 24.

Alternatively, after deposition of the W film 25, another ion implantation is carried out on the principal surface of the substrate 1, so that the polysilicon film 14n is doped with P through the W film 25 and the $WN_x$ film 24. As a result, the surface region of the polysilicon film 14n may also be further reduced in resistance.

Figure 56:
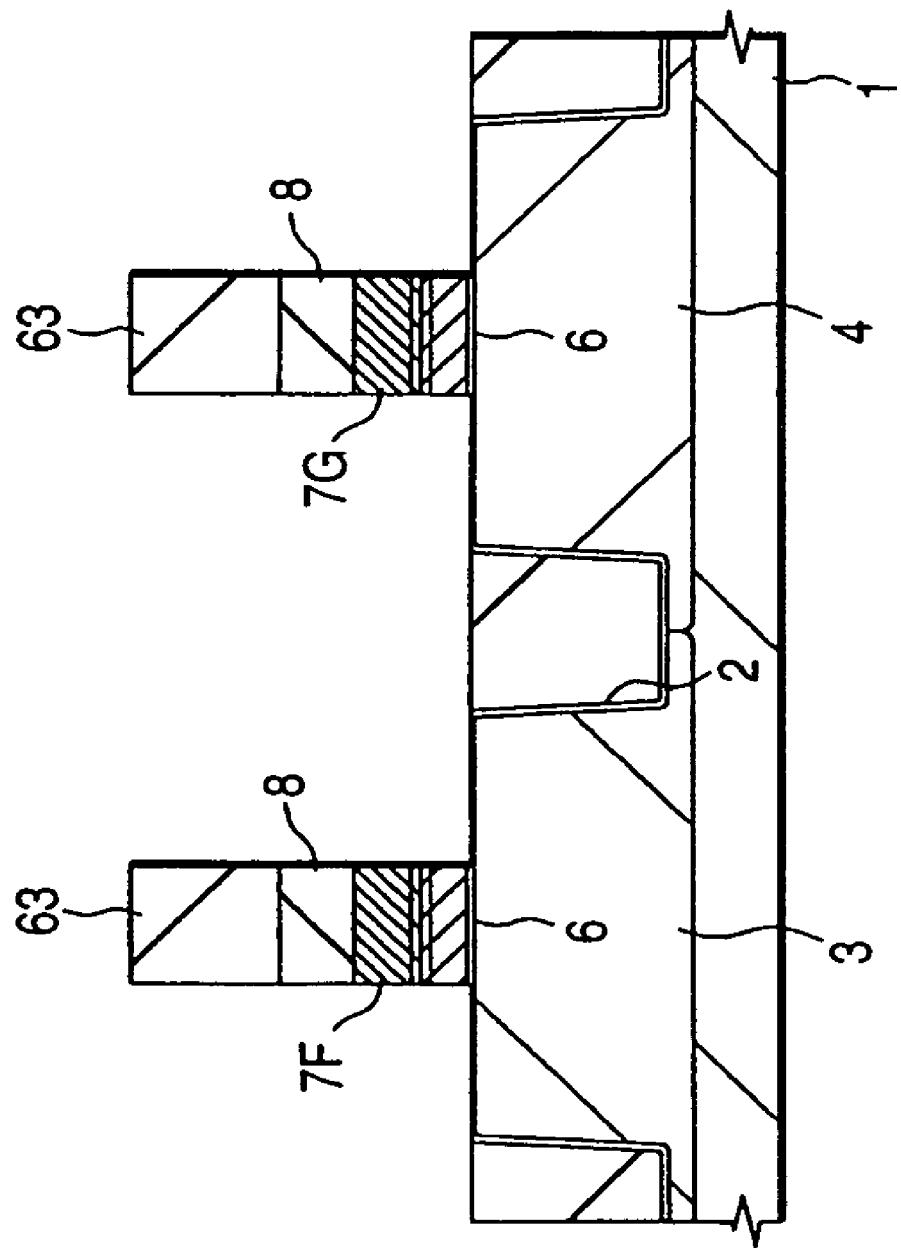
FIG. 56 is a cross sectional view of the essential part of the semiconductor substrate showing the manufacturing method of the semiconductor integrated circuit device which is the other embodiment of the present invention.

Then, as shown in FIG. 56, by using a photoresist film 63 formed on the silicon nitride film 8 as a mask, the silicon nitride film 8, the W film 24, the $WN_x$ film 25, and the polysilicon film 14 n are successively dry etched. As a result, a gate electrode 7F of the n-channel type MISFET is formed on the p-type well 3, and a gate electrode 7G of the p-channel type MISFET is formed on the n-type well 4.

Thereafter, in order to keep the contamination of the substrate 1 due to the oxide of W at a very low level, the reoxidation treatment and the subsequent washing treatment of the gate insulating film 6 cut by the foregoing dry etching, the deposition of a silicon nitride film, and the like are carried out in the same manner as with Embodiment 1.

In this embodiment, the polysilicon film which is a part of the gate electrodes 7F and 7G was formed to be n type. However, in order for both the n-channel type MISFET and the p-channel type MISFET to be of surface-channel type, the following configuration is also acceptable. The polysilicon film which is a part of the gate electrode 7F of the n-channel type MISFET is formed to be n type, and the polysilicon film which is a part of the gate electrode 7G of the p-channel type MISFET is formed to be p type. In this case, as with Embodiment 2, a non-doped polysilicon film is deposited on the gate insulating film 6, and subsequently, by ion implantation using a photoresist film as a mask, P is introduced into the amorphous silicon film of the n-channel type MISFET formation region, and B is introduced into the amorphous silicon film of the p-channel type MISFET formation region. As a result, it is possible to prevent the penetration of B due to the channeling phenomenon.

(Embodiment 5)

In Embodiment 4, the surface region of the polysilicon film 14n was reduced in resistance by the ion implantation process of impurities. However, it is also possible to reduce the resistance of the surface region of the polysilicon film 14n in the following manner.

Figure 57:
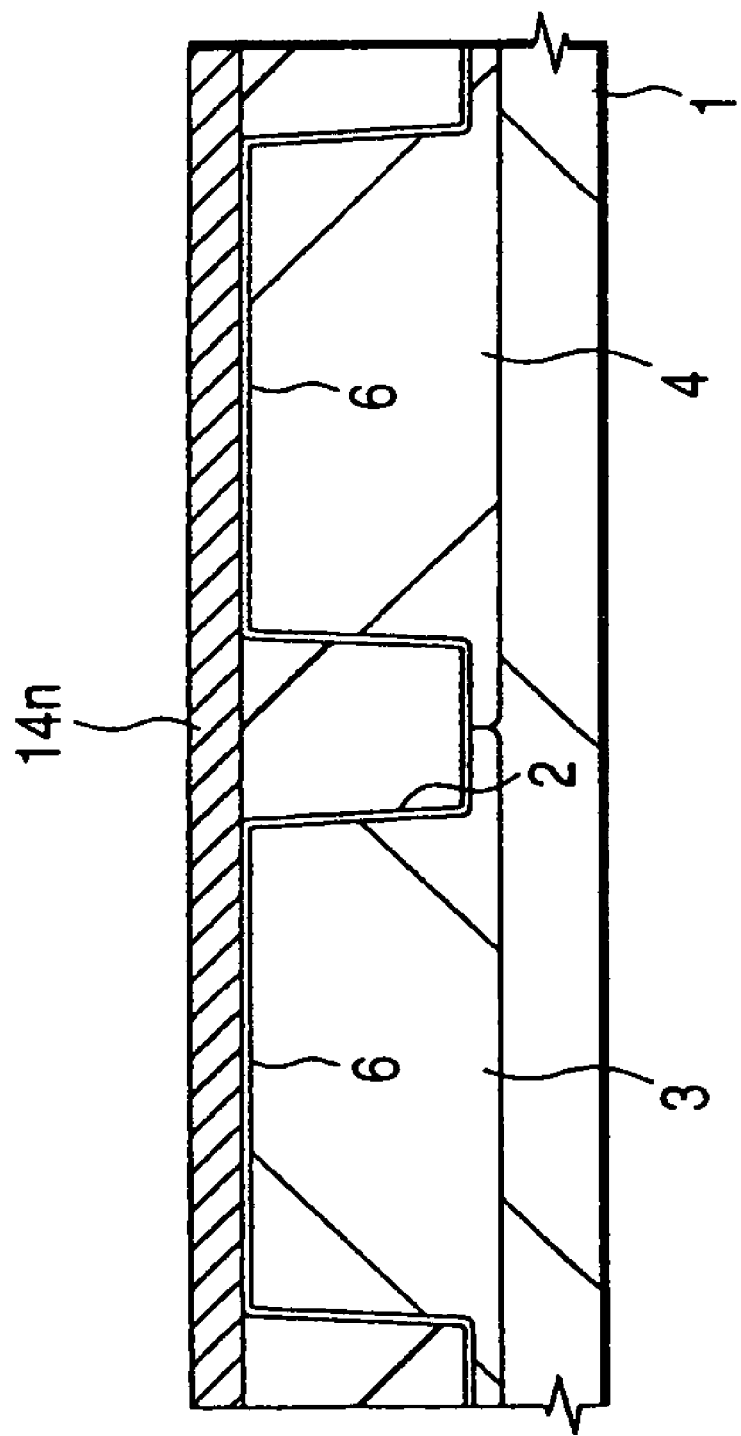
FIG. 57 is a cross sectional view of the essential part of the semiconductor substrate showing the manufacturing method of the semiconductor integrated circuit device which is the other embodiment of the present invention.

First, as shown in FIG. 57, for example, on the principal surface of the substrate 1 made of a p-type single crystal silicon, each element isolation trench 2, each p-type well 3, each n-type well 4, and a gate insulating film 6 are successively formed. Subsequently, a low-resistance n-type polysilicon film 14n doped with P (phosphorus) having a concentration of $1.0 \times 10^{19}$ cm$^3$ or more is deposited on the gate insulating film 6. The steps up to this point are the same as in Embodiment 4.

Figure 58:
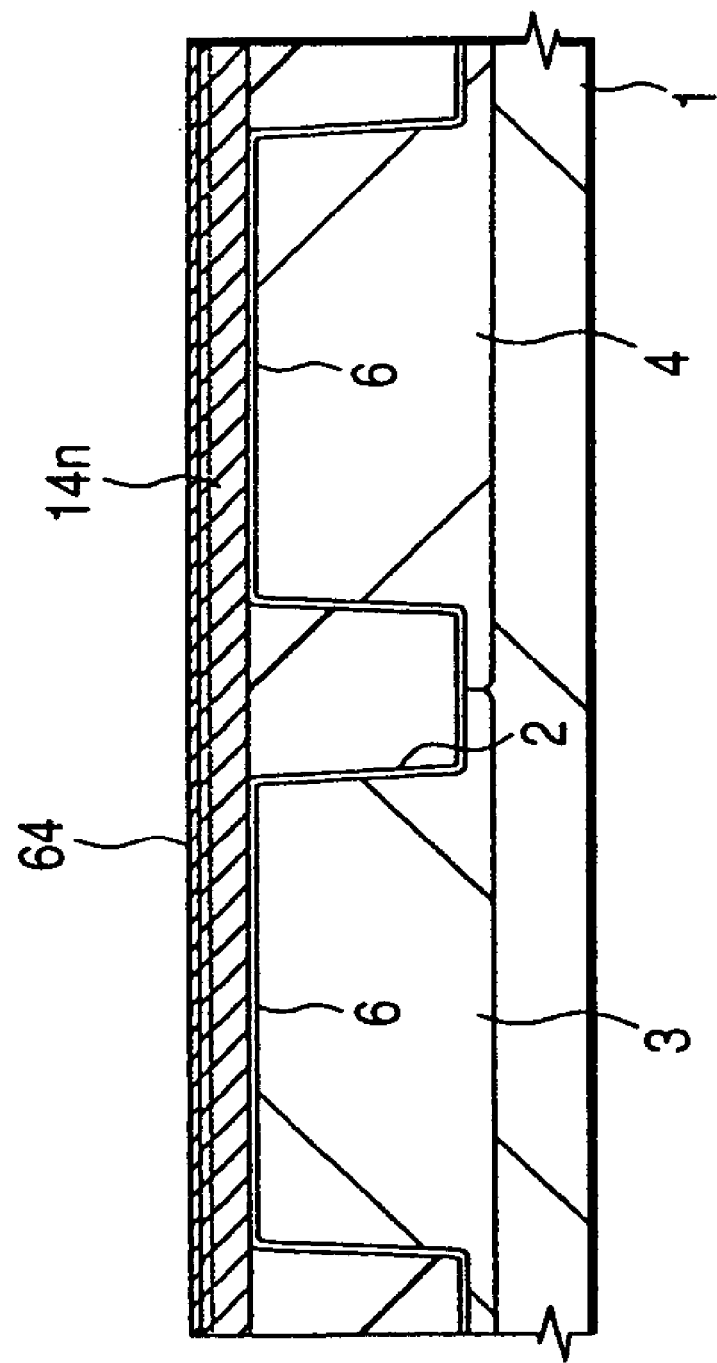
FIG. 58 is a cross sectional view of the essential part of the semiconductor substrate showing the manufacturing method of the semiconductor integrated circuit device which is the other embodiment of the present invention.

Then, as shown in FIG. 58, a low-resistance n-type polysilicon film 64 doped with P having a concentration of $5 \times 10^{19}$ cm$^3$ or more is deposited on the polysilicon film 14n by a CVD process. Then, the substrate 1 is heat treated, so that the P in the n-type polysilicon film 64 is diffused into the surface region at a depth of 10 nm or less from the surface of the polysilicon film 14n. As a result, the P concentration of the surface region is set at $5 \times 10^{19}$ atoms/cm$^3$ or more. Incidentally, after performing the heat diffusion processing, about one-minute lamp annealing may also be performed in an about 950° C. nitrogen atmosphere to electrically activate the P in the polysilicon film 14n. However, the P in the polysilicon film 14n is to be electrically activated in the subsequent heat treatment step, and hence this heat treatment may also be omitted.

Figure 59:
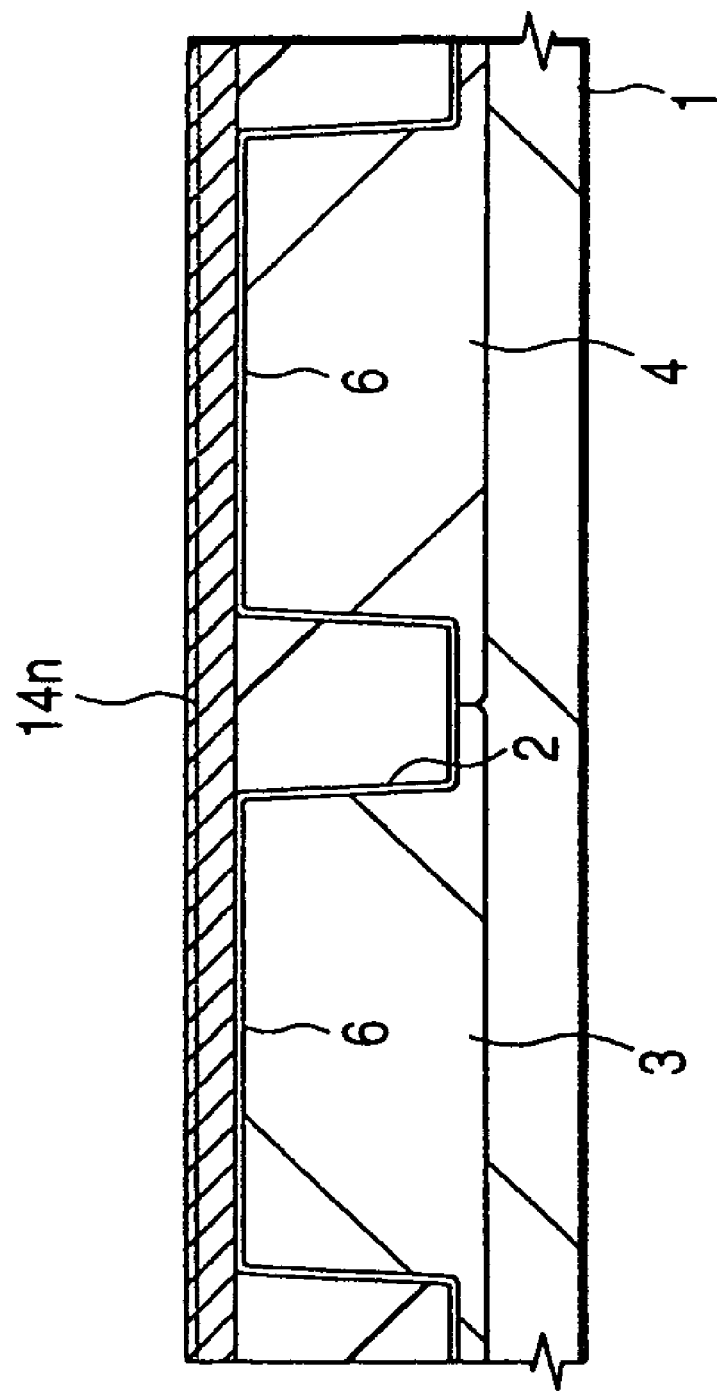
FIG. 59 is a cross sectional view of the essential part of the semiconductor substrate showing the manufacturing method of the semiconductor integrated circuit device which is the other embodiment of the present invention.

Then, as shown in FIG. 59, the n-type polysilicon film 64 is removed by dry etching. Then, the surface of the polysilicon film 14n exposed at the surface of the substrate 1 is washed with hydrofluoric acid.

Figure 60:
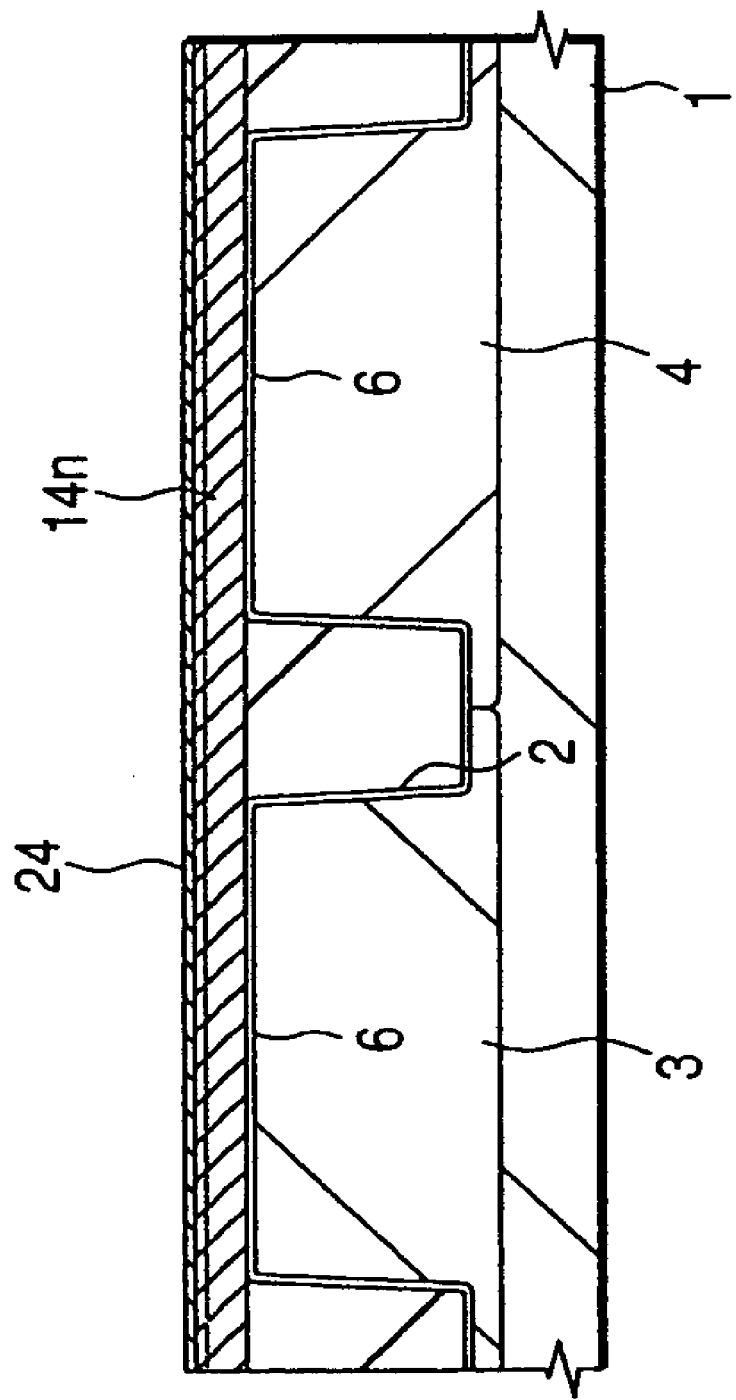
FIG. 60 is a cross sectional view of the essential part of the semiconductor substrate showing the manufacturing method of the semiconductor integrated circuit device which is the other embodiment of the present invention.

Then, as shown in FIG. 60, a $WN_x$ film 24 with a thickness of about 5 nm to 10 nm is deposited on the polysilicon film 14n by a sputtering process. As with Embodiment 4, the $WN_x$ film 24 is deposited in such an atmosphere as to contain high-concentration nitrogen. Thus, the film formation is achieved such that the nitrogen element content upon device completion is at least 7% to 10% or more, preferably 13% or more, and more preferably 18% or more. Further, the $WN_x$ film 24 is deposited with a thickness such that the residual film thickness upon device completion is at least 1 nm or more.

Alternatively, as with Embodiment 3, a W film may also be formed between the $WN_x$ film 24 and the polysilicon film 14n for the purpose of suppressing the formation of a high-resistance layer due to the contact between a natural oxide film occurred on the surface of the polysilicon film 14n and the $WN_x$ film 24.

Figure 61:
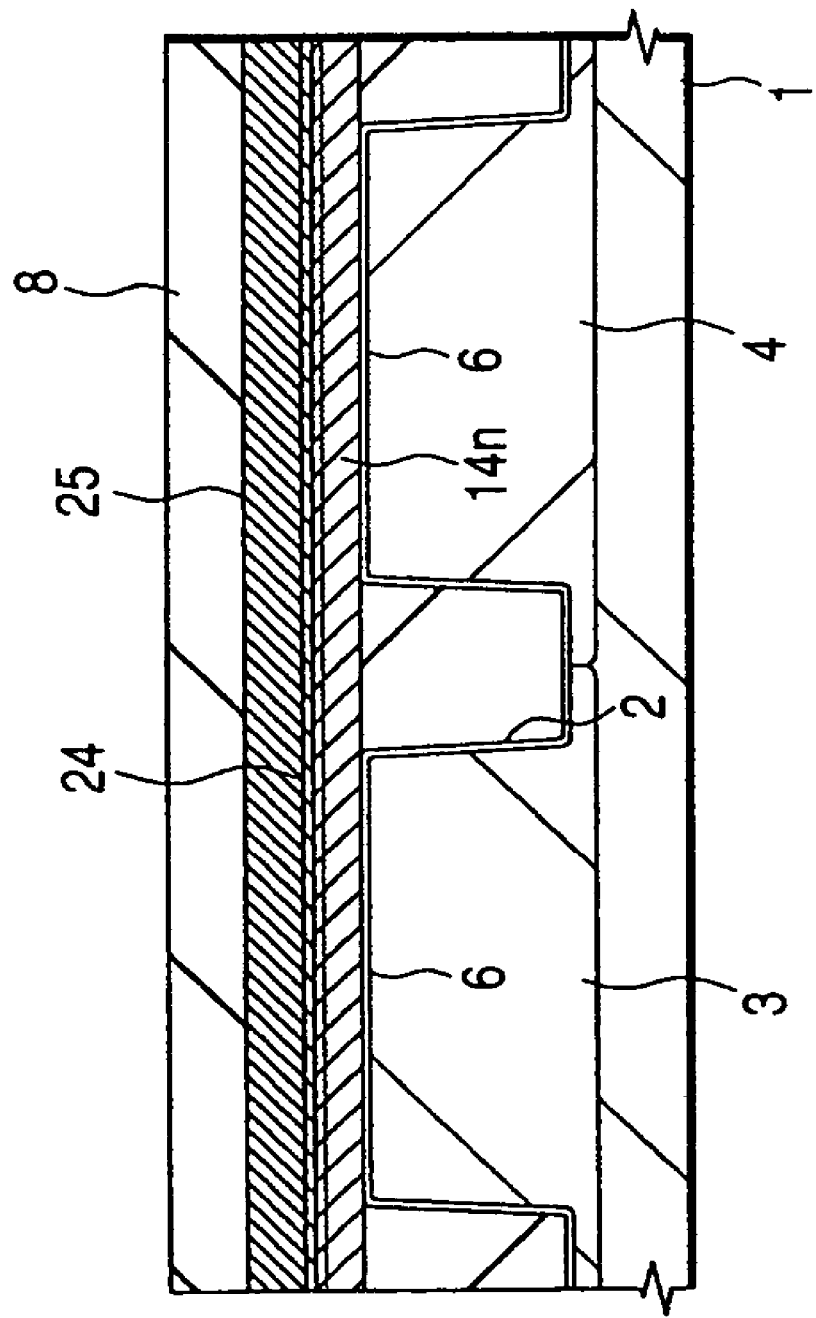
FIG. 61 is a cross sectional view of the essential part of the semiconductor substrate showing the manufacturing method of the semiconductor integrated circuit device which is the other embodiment of the present invention.

Subsequently, as shown in FIG. 61, a W film 25 with a thickness of about 70 nm is deposited on the $WN_x$ film 24. Then, a silicon nitride film 8 with a thickness of about 160 nm is deposited on the W film 25.

Figure 62:
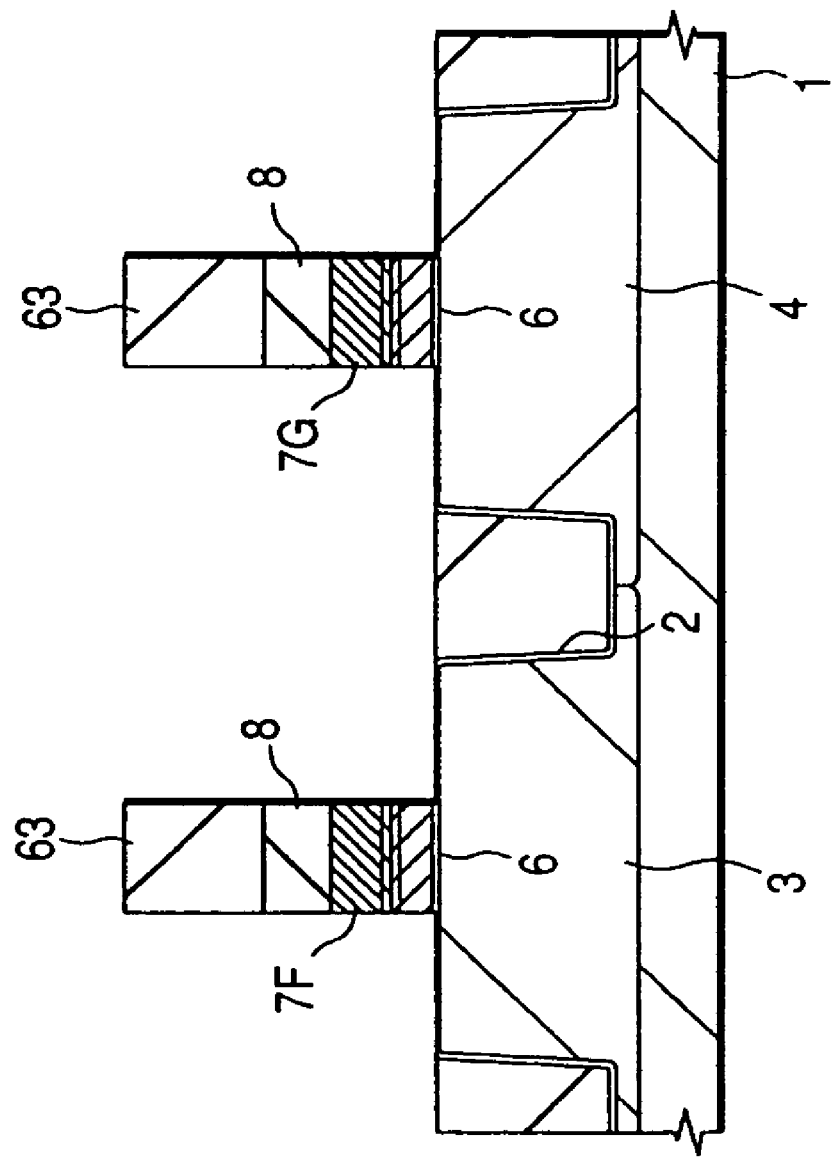
FIG. 62 is a cross sectional view of the essential part of the semiconductor substrate showing the manufacturing method of the semiconductor integrated circuit device which is the other embodiment of the present invention.

Then, as shown in FIG. 62, by using a photoresist film 63 formed on the silicon nitride film 8 as a mask, the silicon nitride film 8, the W film 24, the $WN_x$ film 25, and the polysilicon film 14n are successively dry etched. As a result, a gate electrode 7F of the n-channel type MISFET is formed on the p-type well 3, and a gate electrode 7G of the p-channel type MISFET is formed on the n-type well 4.

Thereafter, in order to keep the contamination of the substrate 1 due to the oxide of W at a very low level, the reoxidation treatment and the subsequent washing treatment of the gate insulating film 6 cut by the foregoing dry etching, the deposition of a silicon nitride film, and the like are carried out in the same manner as with Embodiment 1.

In this embodiment, the P in the polysilicon film 64 deposited on the polysilicon film 14n was heat diffused, so that the surface region of the polysilicon film 14n was reduced in resistance. However, the surface region of the polysilicon film 14n may also be reduced in resistance in the following manner. For example, P is introduced into the surface region of the polysilicon film 14n by an ion implantation process. Then, an insulating film such as a silicon oxide film is formed on the polysilicon film 14n, and subjected to a heat treatment. As a result, the P introduced in the surface region of the polysilicon film 14n is segregated to the vicinity of the interface with the insulating film. Then, the insulating film is removed. The insulating film is composed of, for example, a silicon oxide film formed by thermally oxidizing the surface of the polysilicon film 14n, a silicon oxide film deposited on the polysilicon film 14n by a CVD process, or the like, but not limited thereto.

(Embodiment 6)

This embodiment relates to a flash memory to which the present invention has been applied, and one examples of the manufacturing method thereof will be described step by step by reference to FIGS. 63 to 76.

Figure 63:
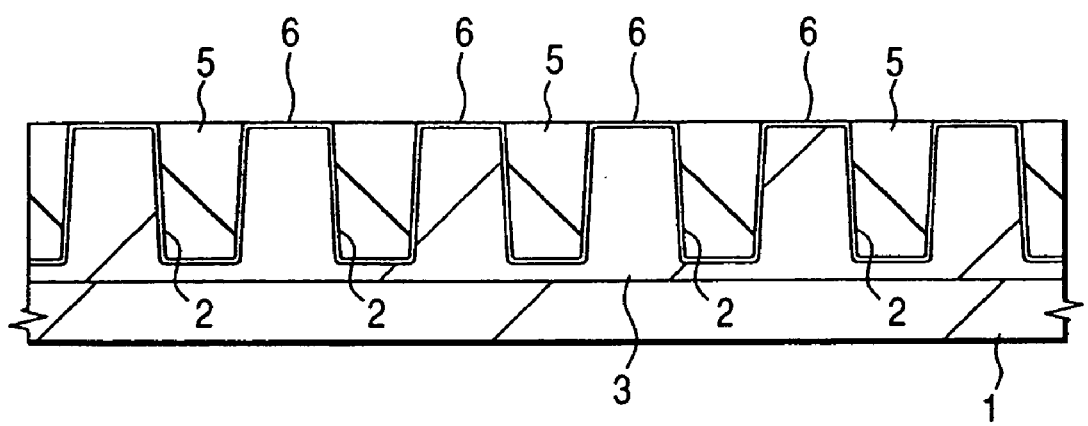
FIG. 63 is a cross sectional view of the essential part of the semiconductor substrate showing the manufacturing method of the semiconductor integrated circuit device which is the other embodiment of the present invention.
Figure 64:
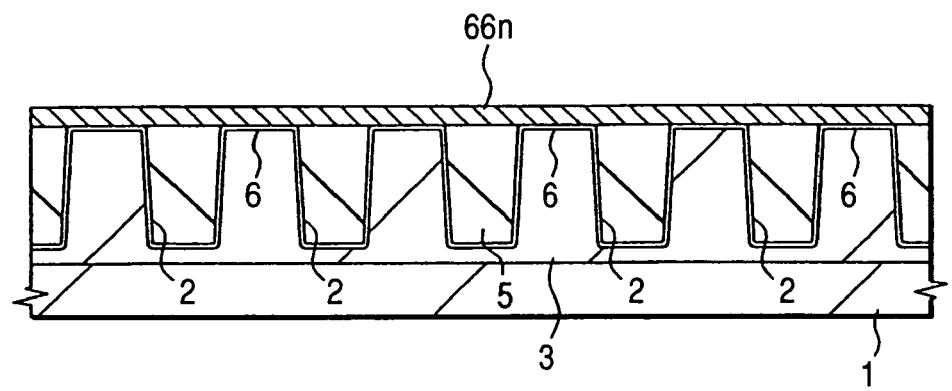
FIG. 64 is a cross sectional view of the essential part of the semiconductor substrate showing the manufacturing method of the semiconductor integrated circuit device which is the other embodiment of the present invention.
Figure 65:
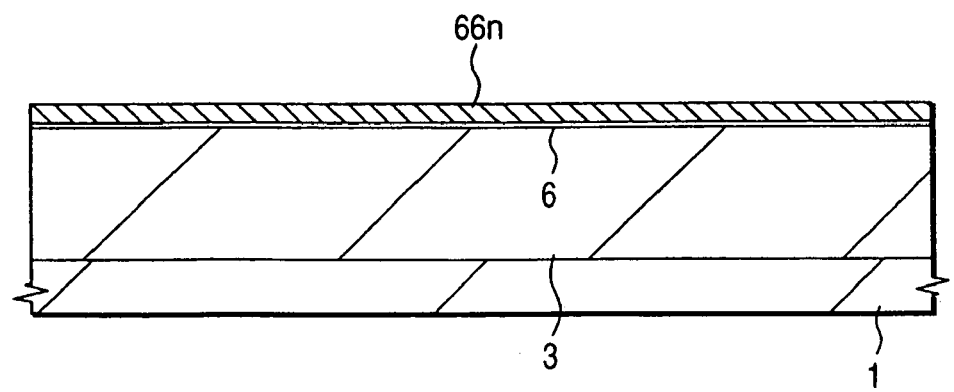
FIG. 65 is a cross sectional view of the essential part of the semiconductor substrate showing the manufacturing method of the semiconductor integrated circuit device which is the other embodiment of the present invention.

First, as shown in FIG. 63, each element isolation trench 2, each p-type well 3, and each gate insulating film 6 are formed on the principal surface of the substrate 1 in the same manner as in Embodiment 1. Then, as shown in FIGS. 64 and 65, on the substrate 1, an n-type polysilicon film 66n with a thickness of about 70 nm to 100 nm is deposited by a CVD process. The polysilicon film 66n is doped with n-type impurities, for example, phosphorus (P) during the deposition step. Alternatively, n-type impurities may also be doped by an ion implantation process after the deposition of a non-doped polysilicon film. The polysilicon film 66n is used as each floating gate of MISFETs constituting memory cells.

Figure 66:
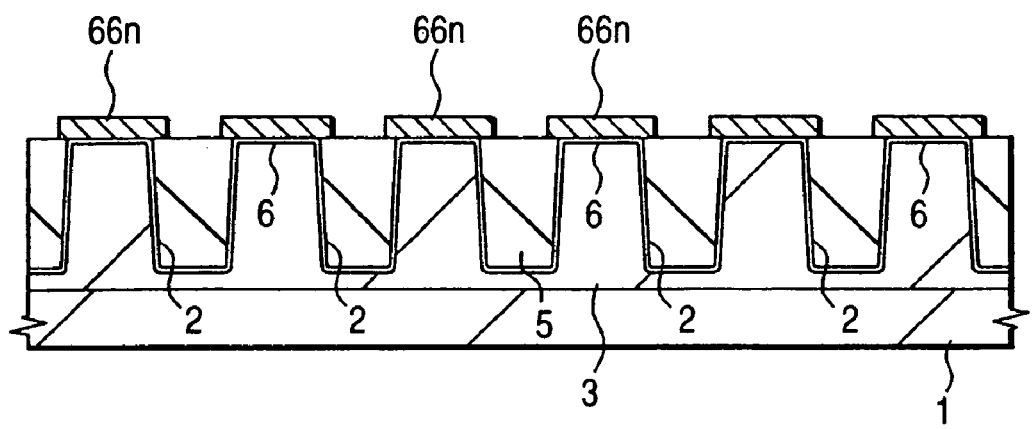
FIG. 66 is a cross sectional view of the essential part of the semiconductor substrate showing the manufacturing method of the semiconductor integrated circuit device which is the other embodiment of the present invention.
Figure 67:
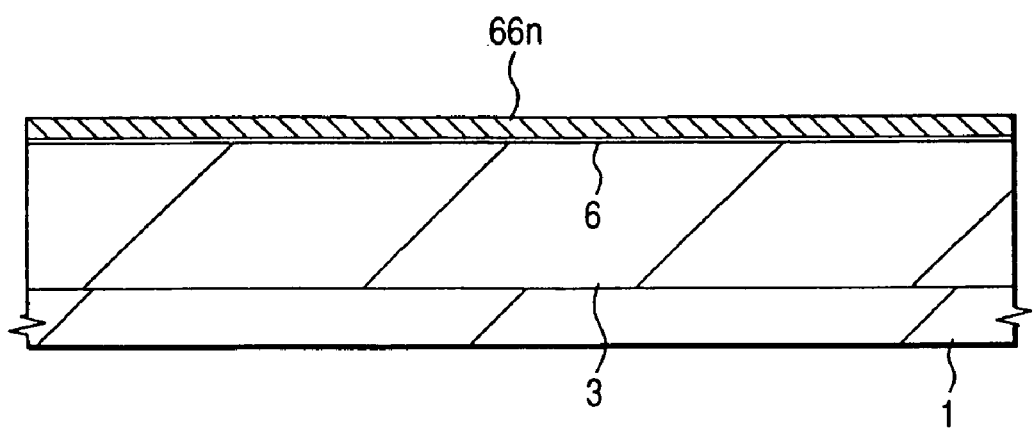
FIG. 67 is a cross sectional view of the essential part of the semiconductor substrate showing the manufacturing method of the semiconductor integrated circuit device which is the other embodiment of the present invention.

Then, as shown in FIGS. 66 and 67, the polysilicon film 66n is dry etched using a photoresist film as a mask. As a result, on active regions L, the polysilicon film 66n having long strip-like plane patterns extending in the direction of their extension is formed.

Figure 68:
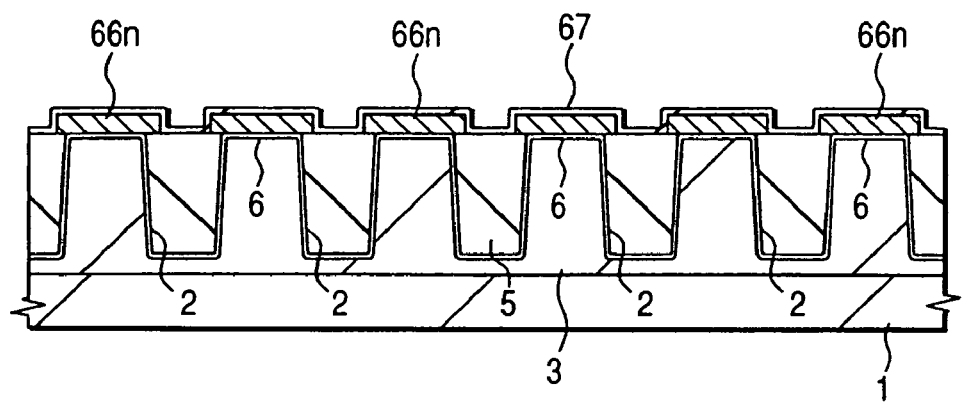
FIG. 68 is a cross sectional view of the essential part of the semiconductor substrate showing the manufacturing method of the semiconductor integrated circuit device which is the other embodiment of the present invention.
Figure 69:
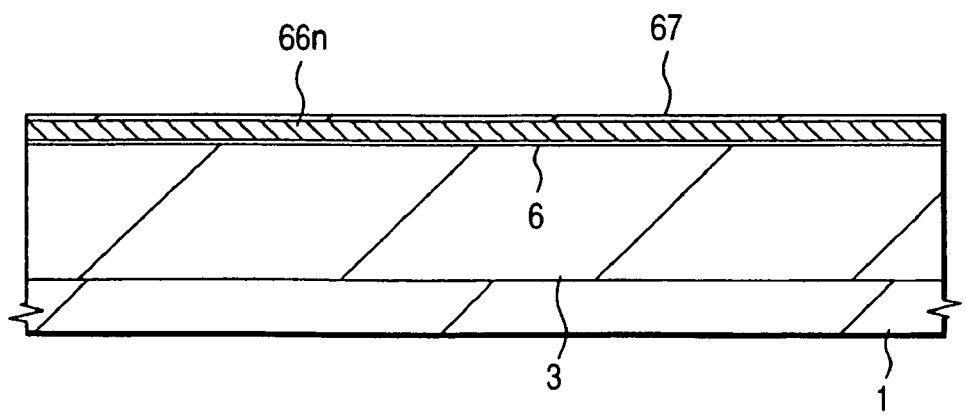
FIG. 69 is a cross sectional view of the essential part of the semiconductor substrate showing the manufacturing method of the semiconductor integrated circuit device which is the other embodiment of the present invention.

Then, as shown in FIGS. 68 and 69, on the substrate 1 on which the polysilicon film 66n is formed, an ONO film 67 composed of a silicon oxide film, a silicon nitride film, and a silicon oxide film is formed. The ONO film 67 is used as a second gate insulating film of MISFETs constituting the memory cells. It is formed by, for example, successively depositing a 5 nm-thick silicon oxide film, a 7 nm-thick silicon nitride film, and a 4 nm-thick silicon oxide film on the substrate 1 by a CVD process.

Figure 70:
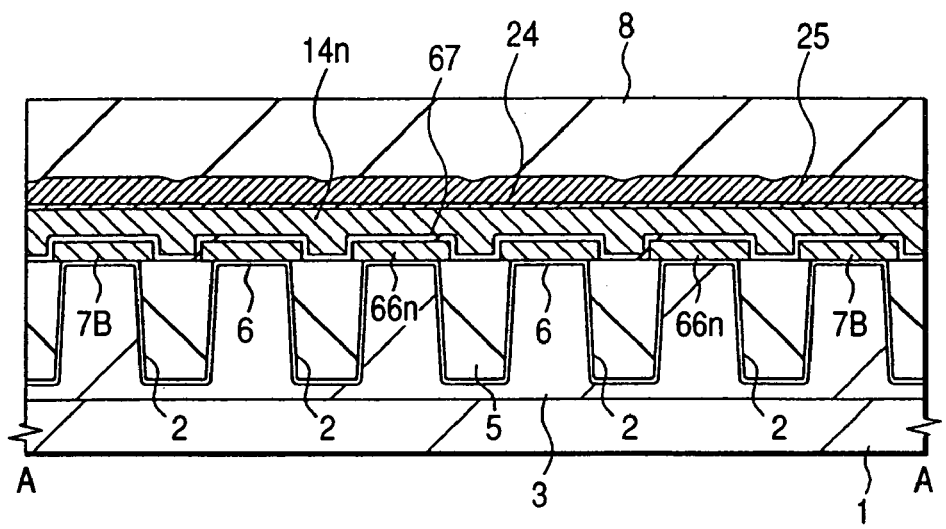
FIG. 70 is a cross sectional view of the essential part of the semiconductor substrate showing the manufacturing method of the semiconductor integrated circuit device which is the other embodiment of the present invention.
Figure 71:
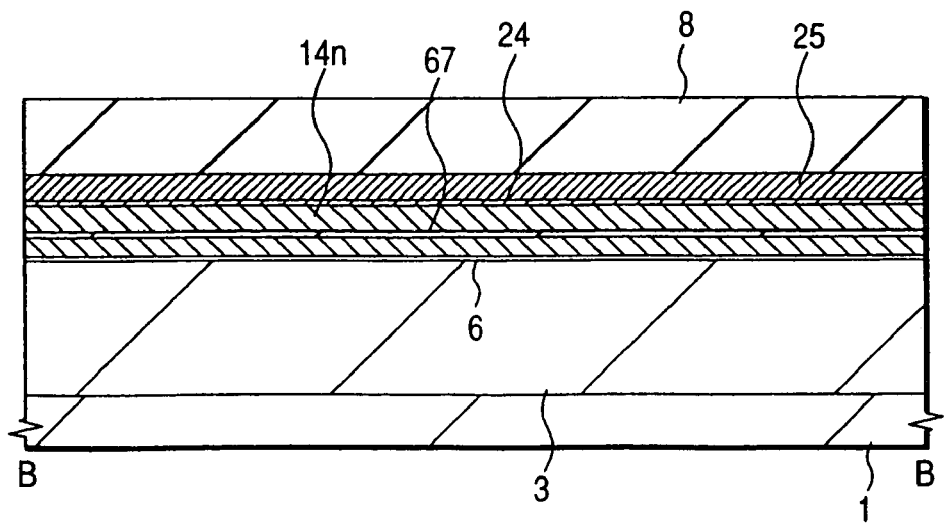
FIG. 71 is a cross sectional view of the essential part of the semiconductor substrate showing the manufacturing method of the semiconductor integrated circuit device which is the other embodiment of the present invention.

Then, as shown in FIGS. 70 and 71, on the ONO film 67, a P (phosphorus)-doped n-type polysilicon film 14n, a $WN_x$ film 24, a W film 25, and a silicon nitride film 8 are successively deposited. The polysilicon film 14n, the W film 25, and the silicon nitride film 8 are deposited in the same manner as in Embodiment 1. Whereas, the $WN_x$ film 24 is deposited in the same manner as in Embodiment 2 in order to reduce the contact resistance with the polysilicon film 14n. Namely, the $WN_x$ film 24 is formed under conditions such that the nitrogen element content upon device completion is at least 7% to 10% or more, preferably 13% or more, and more preferably 18% or more. Further, in order for the residual film thickness upon device completion to be at least 1 nm or more, the thickness of the $WN_x$ film 24 upon film formation is desirably set within a range of from 5 nm to 10 nm. Whereas, in order to reduce the contact resistance between the $WN_x$ film 24 and the polysilicon film 14n, the process explained in Embodiment 3, 4, or 5 may also be adopted.

The polysilicon film 14n is used as the control gate electrodes and the word lines WL of MISFETs constituting the memory cells. Whereas, the silicon nitride film 8 is used as an insulating film for protecting the top of the control gate electrodes. The polysilicon film 14n may also be composed of a silicon film containing Ge (germanium) in an amount of around 50% at the maximum.

Figure 72:
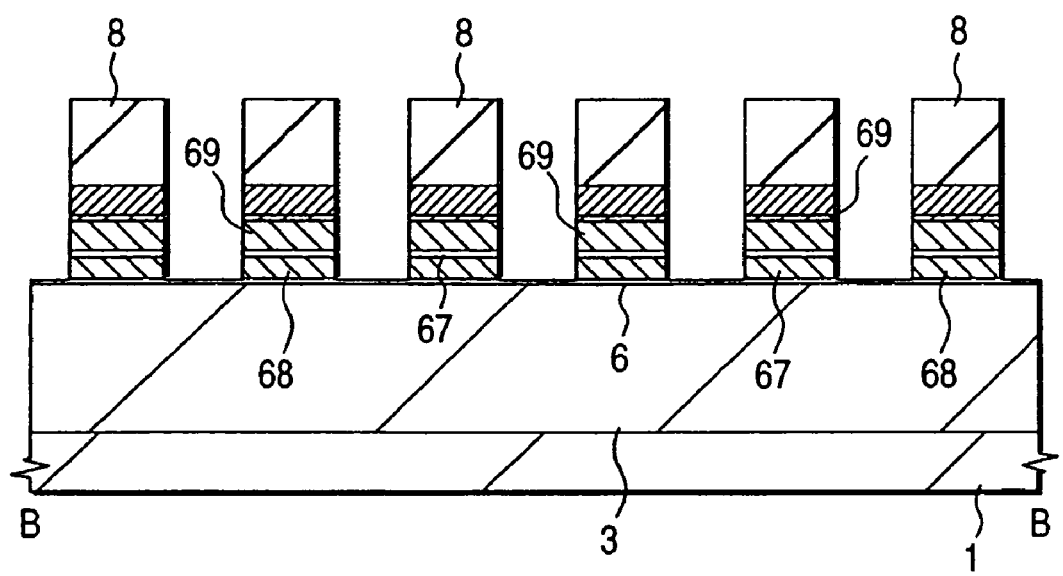
FIG. 72 is a cross sectional view of the essential part of the semiconductor substrate showing the manufacturing method of the semiconductor integrated circuit device which is the other embodiment of the present invention.

Then, as shown in FIG. 72, using a photoresist film (not shown) formed on the silicon nitride film 8 as a mask, the silicon nitride film 8, the W film 24, the $WN_x$ film 25, the polysilicon film 14n, the ONO film 67, and the polysilicon film 66n are successively dry etched. As a result, floating gate electrodes 68 made of polysilicon 66n and a polymetal-structured control gate electrodes 69 (word lines WL) composed of the W film 24, the $WN_x$ film 25, and the polysilicon film 14n are formed.

Figure 73:
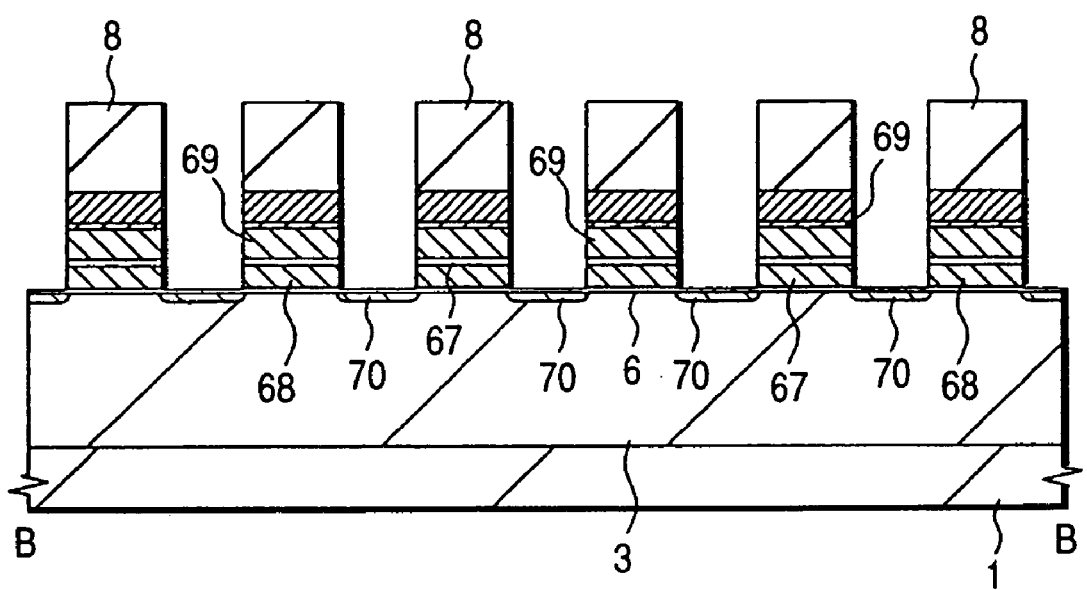
FIG. 73 is a cross sectional view of the essential part of the semiconductor substrate showing the manufacturing method of the semiconductor integrated circuit device which is the other embodiment of the present invention.

Then, as shown in FIG. 73, n-type semiconductor regions 70 constituting the source and the drain of each MISFET are formed. The n-type semiconductor regions 70 are formed in the following manner. N-type impurities (e.g., arsenic (As)) are ion implanted into the p-type wells 3. Then, the substrate 1 is heat treated at about 900° C., so that the n-type impurities are diffused into the respective p-type wells 3.

In accordance with the steps up to this point, a damage caused in the processing step of the gate electrodes and the impurity ion implantation step occurs in the gate insulating film 6 in the space region of the gate electrodes (the floating gate electrodes 68 and the control gate electrodes 69). This damage results in the path for the electrons injected into the floating gate electrode 68 to leak from the edge of the floating gate electrodes 68 to the substrate 1, or causes other deficiencies, and thus deteriorates the quality of the gate insulating film 6. Therefore, the damage is, required to be sufficiently removed.

Figure 74:
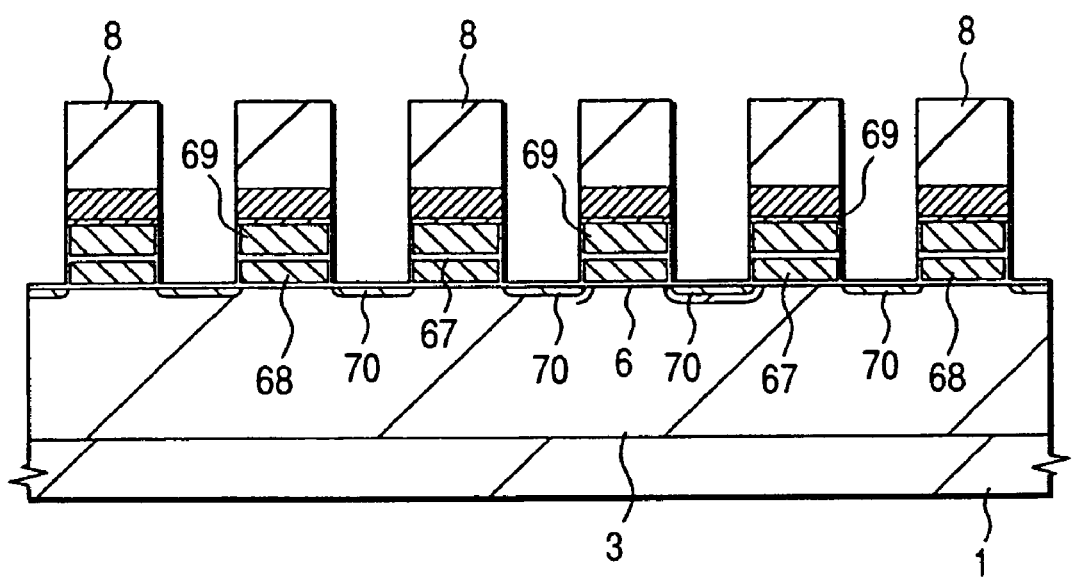
FIG. 74 is a cross sectional view of the essential part of the semiconductor substrate showing the manufacturing method of the semiconductor integrated circuit device which is the other embodiment of the present invention.

Under such circumstances, the gate insulating film 6 is etched using hydrofluoric acid. Then, a reoxidation treatment for compensating and regenerating the thinned gate insulating film 6 is performed. By performing this reoxidation treatment in the same manner as with Embodiment 1, it is possible to prevent the oxidation of the W film 25 and the $WN_x$ film 24, and to keep the oxide contamination of the substrate 1 surface at a very low level. By this reoxidation treatment, as shown in FIG. 74, the gate insulating film 6 is formed again on the surface of the space region of the gate electrodes (the floating gate electrode 68 and the control gate electrode 69), i.e., the n-type semiconductor regions (source and drain) 70, and the sidewall lower end portion of each floating gate electrode 68.

Figure 75:
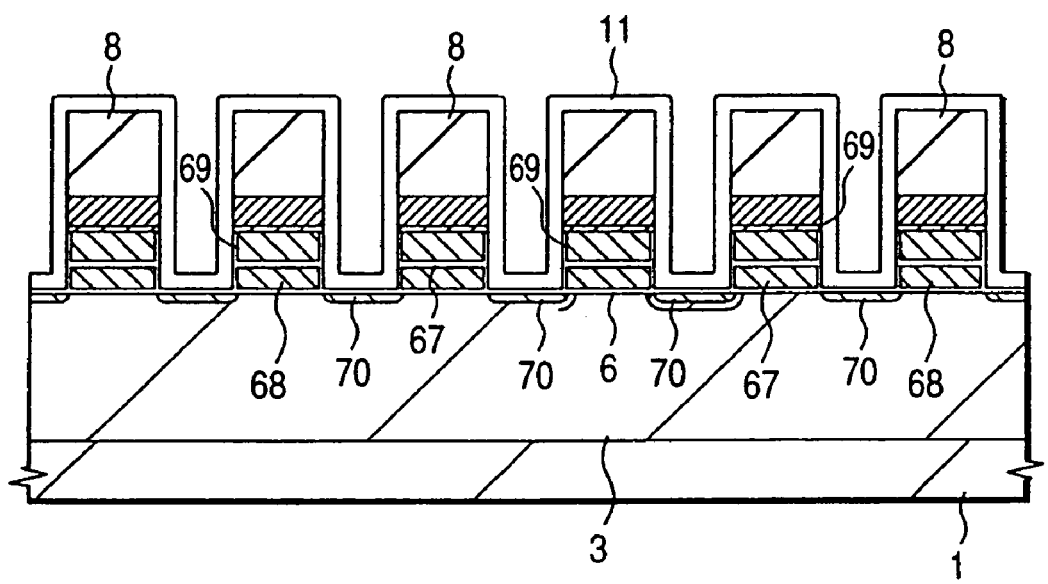
FIG. 75 is a cross sectional view of the essential part of the semiconductor substrate showing the manufacturing method of the semiconductor integrated circuit device which is the other embodiment of the present invention

Then, after washing the surface of the substrate 1, as shown in FIG. 75, a silicon nitride film 11 is deposited on the substrate 1 by a low-pressure CVD process. By performing the washing treatment and the deposition of the silicon nitride film 11 in the same manner as with Embodiment 1, it is possible to keep the contamination of the substrate 1 due to the oxide of W at a very low level.

Up to this point, the present invention completed by the present inventors were described specifically based on the embodiments. However, the present invention is by no way limited to the embodiments. It is needless to say that various changes may be made without departing from the scope of the invention.

In the foregoing embodiments, a description was given to the cases where the present invention has been applied to a DRAM, a DRAM-merged logic LSI, a CMOS logic LSI, and a flash memory. However, the present invention is not limited to these LSIs, but widely applicable to LSIs having MISFETs in each of which a gate electrode is formed of a conductive film of a polymetal structure.

Whereas, it is needless to say that the invention described in this application is also applicable to a non-polysilicon metal gate electrode not having a polysilicon layer, except for the case where a polysilicon layer is essential because the essence is deeply related to the polysilicon layer.

INDUSTRIAL APPLICABILITY

The present invention can be utilized for, for example, the manufacturing of an integrated circuit device having a polymetal gate.

The invention claimed is:

1. The method for manufacturing a semiconductor integrated circuit device, comprising the steps of:
    (a) forming a tungsten film over a first principal surface of a wafer;
    (b) subjecting a portion on the first principal surface of the wafer containing silicon as a main component to an oxidation treatment at a first temperature of 600 degrees centigrade or more in a mixed gas atmosphere containing hydrogen and moisture without oxidizing the tungsten film; and
    (c) washing the first principal surface of the wafer with a solution which is a neutral or weakly alkaline water or chemical solution substantially not containing hydrogen peroxide after the step (b), wherein said solution has properties in the vicinity of the boundary between tungsten region and tungsten tetraoxide negative ion region in the oxidation-reduction potential and pH phase diagram for tungsten-water system, wherein the pH of the water or chemical solution is 7 or more and less than 10.5, and wherein the water or chemical solution is used for the washing in a flowing state.

2. The method for manufacturing a semiconductor integrated circuit device according to claim 1, wherein the temperature of the water or chemical solution is less than 50 degrees centigrade, or 70 degrees centigrade or more.

3. The method for manufacturing a semiconductor integrated circuit device according to claim 2, wherein the temperature of the water or chemical solution is less than 45 degrees centigrade, or 75 degrees centigrade or more.

4. The method for manufacturing a semiconductor integrated circuit device according to claim 1, wherein the temperature of the water or chemical solution is roughly room temperature.

5. The method for manufacturing a semiconductor integrated circuit device, comprising the steps of:

(a) forming a tungsten film over a first principal surface of a wafer;

(b) subjecting a portion on the first principal surface of the wafer containing silicon as a main component to an oxidation treatment at a first temperature of 600 degrees centigrade or more in a mixed gas atmosphere containing hydrogen and moisture without oxidizing the tungsten film; and (c) washing the first principal surface of the wafer with a solution which is a neutral or weakly alkaline water or chemical solution substantially not containing hydrogen peroxide after the step (b), wherein said solution has properties in the vicinity of the boundary between tungsten region and tungsten tetraoxide negative ion region in the oxidation-reduction potential and pH phase diagram for tungsten-water system, wherein the washing is performed while applying an ultrasonic vibration to the water or chemical solution.

* * * * *